US00RE34615E

United States Patent [19]

Freeman

[11] E Patent Number: Re. 34,615

[45] Reissued Date of Patent: May 24, 1994

[54] VIDEO PROBE ALIGNING OF OBJECT TO BE ACTED UPON

[75] Inventor: Gary T. Freeman, Beverly, Mass.

[73] Assignee: MPM Corporation, Franklin, Mass.

[21] Appl. No.: 829,727

[22] Filed: Jan. 31, 1992

Related U.S. Patent Documents

Reissue of:

[64] Patent No.: 4,924,304
Issued: May 8, 1990
Appl. No.: 116,490
Filed: Nov. 2, 1987

[51] Int. Cl.[5] ..... H04N 7/18

[52] U.S. Cl. ..... 348/95; 348/87; 348/129

[58] Field of Search ..... 358/101, 106, 107, 93; H04N 7/18

[56] References Cited

U.S. PATENT DOCUMENTS

| | | | |
|---|---|---|---|
| 4,608,494 | 8/1986 | Kobayashi | 250/461.1 |
| 4,672,437 | 6/1987 | Casper | 358/106 |
| 4,686,565 | 8/1987 | Ando | 358/101 |
| 4,737,845 | 4/1988 | Suzuki | 358/101 |

*Primary Examiner*—Howard W. Britton
*Attorney, Agent, or Firm*—Fish & Richardson

[57] ABSTRACT

An aligning system includes an object to be acted upon at predetermined locations, such as a circuit board to receive solder paste. There is a device, such as a stencil, characterized by the pattern for acting upon the object. A video probe is arranged to look at both the device and the object for providing image signals representative of both. A comparator compares the image signals to provide an error signal representative of misalignment between the device and object. A positioner responsive to the error signal relatively positions the device and object to reduce the error. An operator causes the device to operate upon the object at the predetermined locations.

14 Claims, 3 Drawing Sheets

Microfiche Appendix Included
(2 Microfiche, 155 Pages)

VIDEO PROBE ALIGNING OF OBJECT TO BE ACTED UPON

Matter enclosed in heavy brackets [ ] appears in the original patent but forms no part of this reissue specification; matter printed in italics indicates the additions made by reissue.

*A computer program listing is set forth in a microfiche appendix.*

The present invention relates in general to aligning and more particularly concerns novel apparatus and techniques for aligning an object to be acted upon at particular locations with a device that performs the specific operations on the specified points. A specific embodiment of the invention facilitates aligning circuit boards for receiving surface mounted components with a stencil for applying solder paste to a pattern on the circuit board while facilitating rapid reorientation for applying solder paste to a different pattern.

A typical screen printer is the commercially available ASP-24 automated screen printer available from MPM Corp., 71 West Street, Medfield, Mass. 02052 incorporated herein by reference. This screen printer includes a replaceable screen for printing solder paste on a footprint of pads on a surface mount circuit board. This system may also deposit other materials, such as epoxy, polymer, cermet and most other screen printable materials. This system includes a programmable controller for positioning each circuit board beneath the screen or stencil above that deposits the screen printable materials.

Prior art screen printers with vision require printing solder paste on the circuit board, driving a table out beneath the cameras and the cameras look at the solder paste. The solder paste in then wiped off, the board enters beneath the stencil, and the board is printed a second time, and reciprocates back out for examination by the camera.

A prior art screen printer includes a camera that looks between the board and the screen, but it does not look at an image on the screen, only at the board. The camera on that device does not reciprocate. It uses a fixed mounted camera that just looks down at the board, and it requires that the board be outside of the stencil which comes down upon it by a certain amount such that the camera does not get in the way.

It is an important object of this invention to provide improved apparatus and techniques for optically aligning an object to be acted upon at one or more points with a device for repeatedly acting upon like objects at like points.

According to the invention, at least one, and preferably two, movable video probes are located between the acting device, such as the screen or stencil, typically above, and the object to be acted upon, such as a circuit board, typically below. The one or two probes, first look at and locate a pattern, such as on the object device, such as a circuit board, store information on features in this pattern, such as x, y and $\theta$ information on key features in the pattern. Associated data processing apparatus processes and stores this information. The one or both video probes then rotate downward while still in the region between the object to be acted upon and the device to act, examine the other pattern such as on the acting device, such as the screen or stencil, for a matching pattern and relatively position the object and device so that the two patterns are in alignment. The one or both video probes then retract, and the device, such as the stencil or screen engages the object, such as the circuit board, to deposit solder paste or other screen printable material on selected points in registration with corresponding points on the device, such as the screen or stencil. Once a specific pattern is learned, the invention may repeatedly relatively position by looking at only the object to be acted upon.

According to a specific aspect of the invention, a positionable base supports a video probe[,]. This base is formed with at least one and preferably two slots having a generally horizontal leaning portion with a depending angled trailing portion for guiding elements that carry the video probe as it moves between the extended position at the leading end of the slots, with the video probe between object and device, and the retracted position at the trailing end of the slot, with the video probe retracted from the region between object and device.

Numerous other features, objects and advantages of the invention will become apparent from the following specification when read in connection with the accompanying drawings in which.

Figure 1:
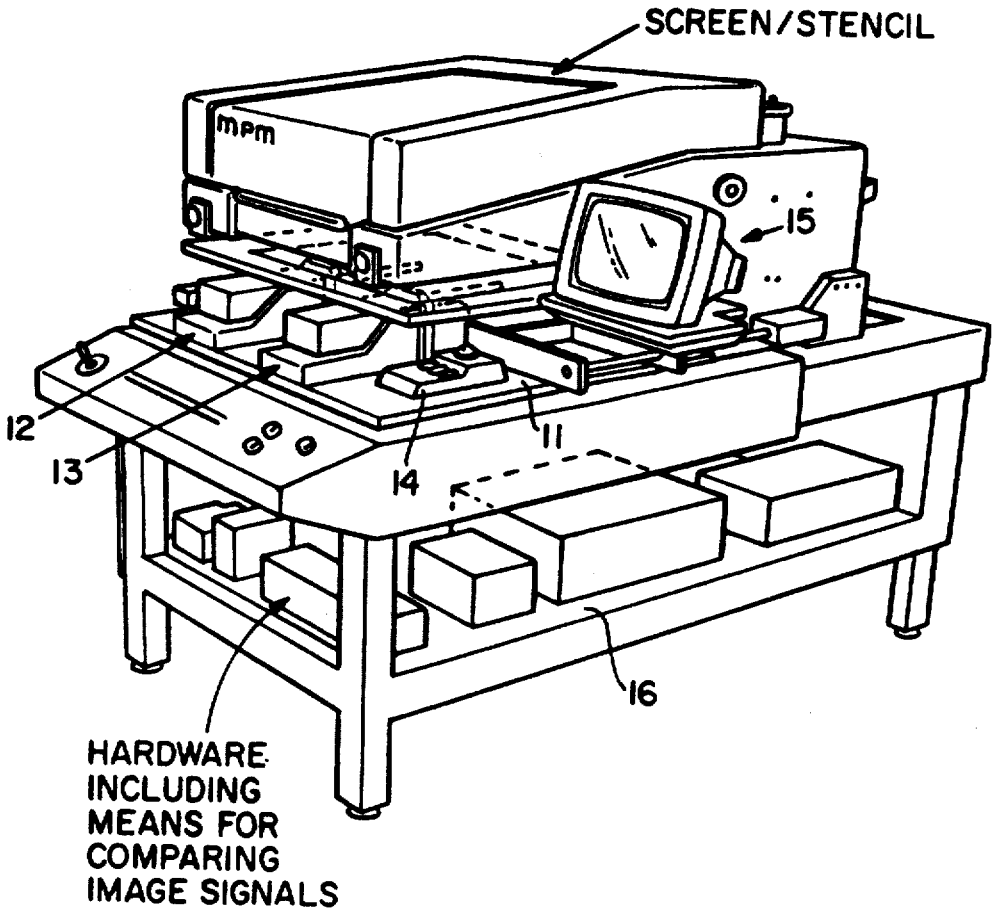
FIG. 1 is a perspective view of a fully automated screen printer with vision system according to the invention.

With reference now to the drawing and more particularly FIG. 1 thereof, there is shown a perspective view of an exemplary embodiment of the invention comprising the commercially available ASP-24 fully automated screen printer available from MPM Corp. with movable video probes according to the invention. The apparatus includes a base 11 for supporting a circuit board to be printed upon, left and right video probe assemblies 12 and 13, a controller 14 and video monitor assembly 15. The system also includes a positionable screen/stencil support assembly that may be moved to align the screen or stencil with the circuit board to be printed upon. A lower platform 16 supports various packages for containing hardware used in the system.

The base components added to the ASP-24 automated screen printer include the two video probe assemblies 12 and 13, a fiberoptic light source for illuminating the screen and board during pattern recognition, the trackball teaching module 14, and a vision processor unit comprising a commercially available Cognex Type 2000 with suitable software, an example of which is set forth in Appendix A.

The invention utilizes a user-friendly operator interface. Menu-driven software, such as set forth in Appendix A, produces a display on video monitor 15 that prompts the operator through each phase of the four-step setup process. Help screens are accessible at each step, outlining in detail the instructions for performing that step. At the completion of each step, the system automatically displays the next prompt on monitor 15. Setup errors may be quickly corrected through the push-button editing feature with trackball teaching module 14.

The operator uses the independent trackball teaching module 14 to select a pattern on the PC board within each probe's field of view of left and right probe assemblies 12 and 13. Teaching module 14 capture these two select patterns and then recognizes and locates the matching patterns on the screen or stencil. Without further operator involvement, the system implements the program by calculating the pixel representation in x and y coordinates of significant features and angular orientation in azimuth, conveniently referred to a $\theta$ geometry. The apparatus then determines an accurate "home" position for the screen/stencil in relation to the circuit board then positioned on base *11*. The offset data corresponding to the difference in x, y and $\theta$ positions of the observed circuit board features and corresponding screen/stencil features is automatically downloaded into the screen printer stepper motor programmable indexes. These indexes activate the screen printer stepper motor assembly to reposition the screen/stencil relative to each stationary board for subsequent print cycles with screen/stencil in horizontal alignment with each circuit board below. This automatic positioning adjustment accommodates variations in board tolerances. Between print cycles, the left and right video probes 12 and 13 automatically move in, look at the next board in place, move out again, screen/stencil is positioned if necessary, and printing occurs without operator intervention.

As an alternative feature the use may verify alignment with a post-print inspection feature. As part of the setup menu, the operator may choose how often to do post inspection. Then a choice may be made from three tolerance threshold menu selections for alignment error detection.

Printed circuit boards having patterns outside these parameters produce an error message on video monitor 15. This error signal may be used to activate a diverter to reroute that board for reworking. The error signal may also be used to pause automatic operation so that the operator can correct the problem before any more material is wasted. To begin the setup process, the operator presses a "video attention" button on teaching module 14. Actuating this button produces the setup menu on video monitor 15. Then the operator completes four steps, pressing a single button 14 on teaching module 14 to signal completion of each step. First, the operator clamps left and right video probe assemblies 12 and 13 in place so that each probe when in the extended position may observe two different patterns of significant features of the circuit board and corresponding screen/stencil. The operator then teaches these board patterns. Using trackball teaching module 14, the operator moves joy stick 14A to define the windows within the [probes,] *probes'* fields of view embracing significant features, typically a pattern of pads for receiving solder paste, and then pushes a single button on teaching module 14 to teach the pattern to the apparatus which then captures the patterns. The operator positions the probes of left and right probe assemblies 12 and 13 to view upward to learn the screen or stencil pattern above. The associated data processing system automatically locates the matching pattern on the screen or stencil, determines the pixel representation of it in x, y and $\theta$ geometry; automatically downloads offset data for x, y and $\theta$ for alignment purposes. The operator then rotates the video probes downward toward the circuit board, and the apparatus is now ready to print automatically. As each board is positioned on base 16, the video probes on left and right assemblies 12 and 13 extend above the positioned circuit board, determine x, y and $\theta$ differences between the positioned circuit board and the screen or stencil above and operate stepper motors to reposition, if necessary, the stencil or screen for alignment with the circuit board below.

Figure 2:
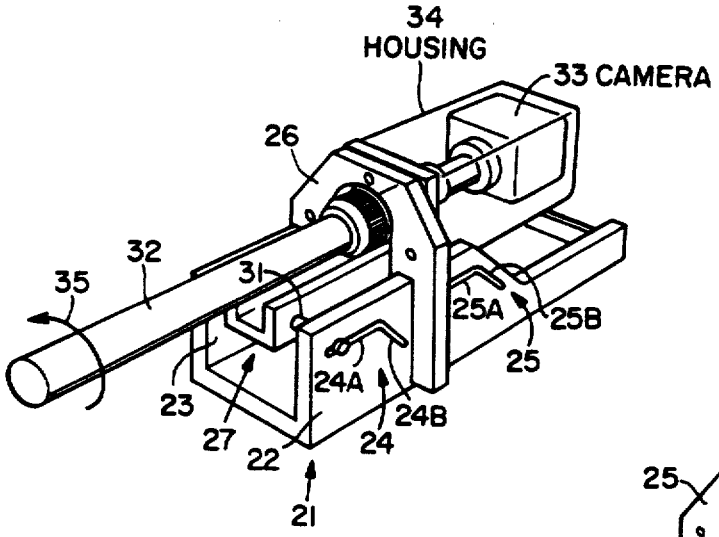
FIGS. 2 and 3 are perspective views of the video probe assembly in retracted and extended positions, respectively.
Figure 3:
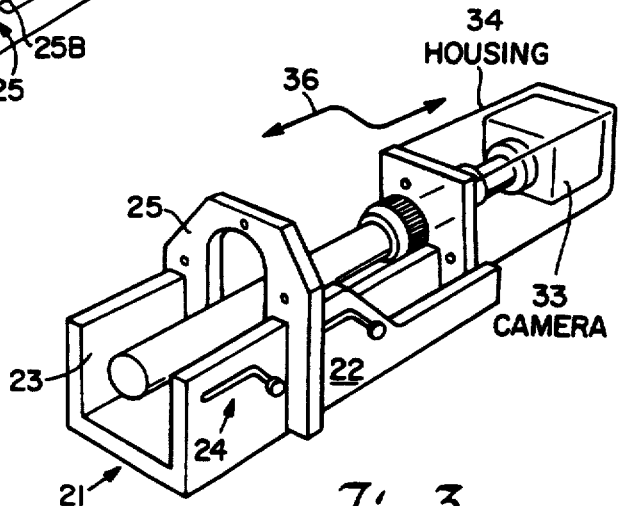

Referring to FIGS. 2 and 3, there are shown perspective views of the video probe assemblies in extended and retracted positions, respectively. Each assembly includes a base 21 with vertical walls 22 and 23, each formed with front and rear slots 24 and 25, respectively, having horizontal leading portions 24A and 25A, respectively, and depending angled trailing portions 24B and 25B, respectively. A vertical bracket 26 rests upon side walls 22 and 23. The movable probe support 27 is formed with elements, such as 31 for riding in slots 24 and 25. The movable base 27 supports 90° mirror tube 32 that provides an image to camera 33 in housing 34 and furnishes illuminating light to illuminate the screen or stencil and the circuit board. FIG. 2 shows the video probe in the extended position between circuit board and screen or stencil. Arrow 35 illustrates the 180° rotational range of mirror tube 32 for looking above and below. FIG. 3 shows the video probe in the retracted position outside the region between circuit board and screen or stencil. Arrows 36 indicate the path traveled by the probe up and forward to the extended position and rearward and down to the retracted position.

Figure 4:
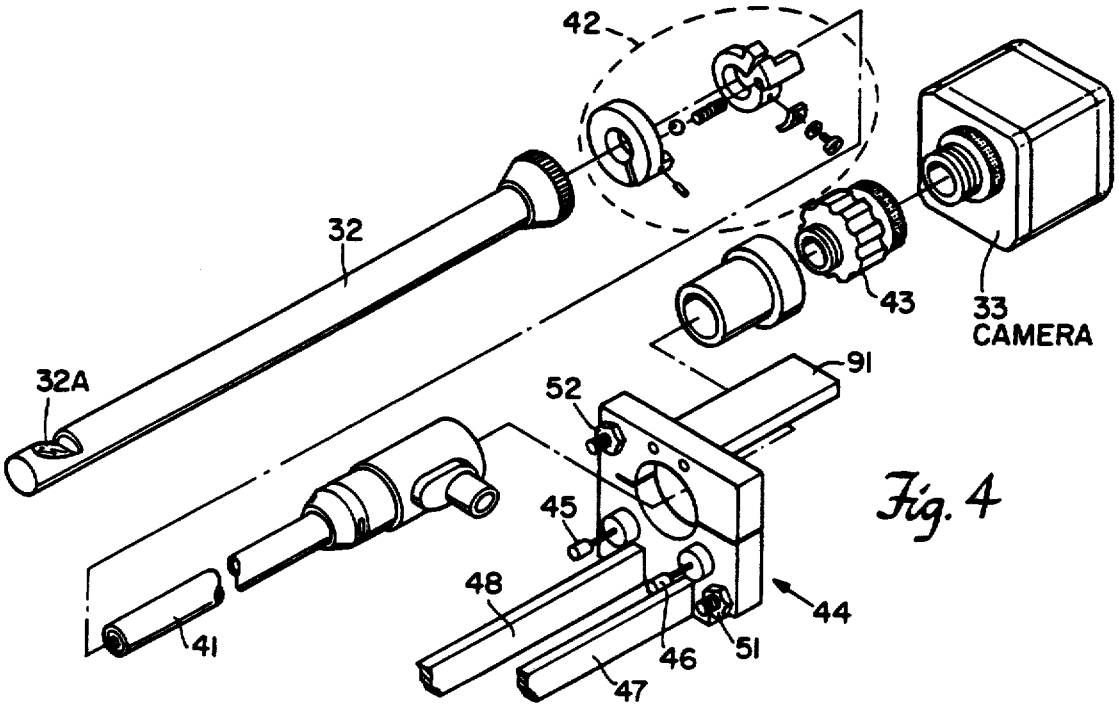
FIG. 4 is an exploded view of the video probe and portions of the supporting assembly.

Referring to FIG. 4, there is shown an exploded view of a number of elements forming the video probe with some portions cut away. The Volpie 90° mirror tube 32 includes a mirror 32A mounted at 45° angle relative to the axis of mirror tube 32 with a Volpie intrascope approximately 12 inches long mounted inside mirror tube 32. A rotate clamp mechanism is shown inside broken line 42 with the parts exploded and functions to position mirror tube 32 in one of two positions 180° apart, looking up as shown for viewing the bottom of the screen or stencil, or looking down for viewing the top of the printed circuit board. Focus knob 43 allows for focusing the image of camera 33 by observing the image on video monitor 15.

The main probe clamp 44 carries two shock absorbers 45 and 46 above the left and right arms 47 and 48, respectively. Main clamp 44 also carries three ball-and-cone pieces, two of which 51 and 52 are visible in FIG. 4.

Figure 5:
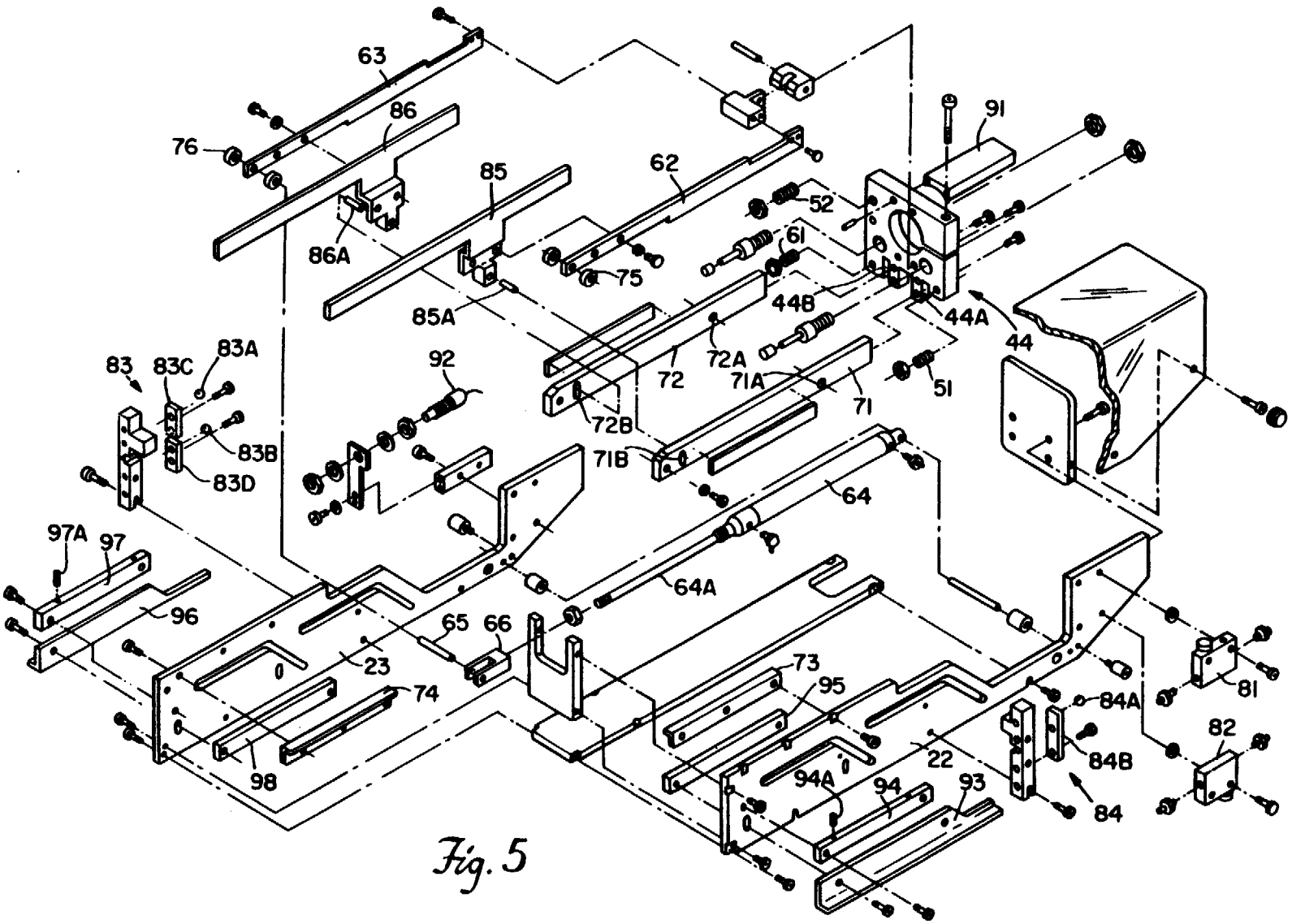
FIG. 5 is an exploded view of the video probe support assembly.

Referring to FIG. 5, there is shown an exploded view of a video probe support assembly with the housing cut away and the video probes omitted to better illustrate certain structural features. Main clamp 44 supports the vision probe at the center of the camera 30 and Volpie intrascope unit 44. By supporting this assembly at the center of gravity, when the ball-and-cone pieces 51, 52 and 61 engage reference balls, there is very low energy movement to achieve precise reference position very quickly.

A linkage allows the center of effort to be aligned along the axis of mirror tube 32 and Volpie intrascope unit 41. This linkage includes a left link 62 and right link 63. Air cylinder 64 drives the leading ends of these links with pin 65 seated in clevis 66 secured to the leading edge of air cylinder rod 64A. Main clamp 44 is formed with vertical recesses 44A and 44B that engage the left and right arms 71 and 72, respectively. These arms accommodate four rollers, a trailing pair in openings 71A and 72A, and a leading pair in vertical slots 71B and 72B. Left and right side plates 22 are cammed as shown. Left and right angle brackets 73 and 74 are attached to the top leading portions of left and right side plates 22 and 23, respectively, that rollers on the link system engage. These angled brackets provided horizontal surfaces for insuring that air cylinder 64 pulls the probe itself horizontally without a vertical component of force. Rollers 75 and 76 ride on left and right angled brackets 74 and 75, respectively. A pair of flow controls 81 and 82 mount on the trailing portion of left side plate 22 and have a needle valve which allows re-exhaust in each direction for aiding in providing smooth motion upon operating air cylinder 64 for extension and retraction free of binding or violet motion. Shock absorbers 45 and 46 also help allow smooth action when the vision probe approaches a final location against the ball and cone. Shock absorbers 45 and 46 provide damping that prevents the CCD cameras 33 from being subjected to violet movements.

Main clamp 44 clamps the vision probe firmly to the tooling bed 11 of the machine, while allowing some relative adjustment on the probe to position the mirror tube 32 between the stencil and circuit board that may vary depending on the thickness of the circuit board. Clamping screws may be loosened and two jacking set screws 94A may be adjusted to control this position.

There is a right ball mount support 83 for supporting balls 83A and 83B and a left ball mount support 84 for supporting ball 84A. Balls 84A, 83A and 83B engage ball-and-cone pieces 51, 52, and 61, respectively. Ball mounts 83C, 83D and 84B are independently adjustable. When air cylinder 64 urges the probes to the extended position, ball mounts 83C, 83D and 84B are tightened so that balls 83A, 83B and 84B are exactly seated in ball-and-cone pieces 52, 61 and 51, respectively. This position is then readily repeatable.

Left and right fiberoptic supports 85 and 86 are connected to left and right links 62 and 63, respectively, and carry fibers optics (not shown) in parallel to the Volpie intrascope. This arrangement with fiber optics along and parallel to the Volpie intrascope provides back lighting. That is to say, this structure provides a very shallow light illuminating the object being viewed. The shallow angle light reduces glare, and the image of the object being viewed appears more clearly with back lighting.

Pins 85A and 86A pivotally support left and right fiber optic supports 85 and 86 to slots 71B and 72B in left and right arms 71 and 72, respectively. This structural arrangement allows free vertical rotation of these supports so that when air cylinder 64 extends and retracts the assembled slide unit, it prevents significant free floating. Stated in other words, because the left and right links are referenced on left and right angle brackets 73 and 74, respectively, at the extended end of the stroke for precise horizontal actuation, the structural arrangement contains when not actually contacting the angle brackets. Pins 85A and 86A in slots 71B and 72B provide this containment. Pin 65 pulls left and right links 62 and 63 up and outward toward the extended end until rollers 75 and 76 engage the underside of left and right brackets 73 and 74. On retraction pin 65 moves down and toward the retracted position.

A focus hold bar 91 is secured to the top of main clamp 44 and carries a piece of felt on the bottom for engagement by focus knob 43. This holding function helps prevent focus knob 43 from rotating in the presence of repeated changes in position of the probe assembly.

A proximity switch 92 is fastened to side plate 23 for providing a signal indicating that the probe is in a safe retracted position to allow the apparatus to print on the circuit board then below the aligned screen or stencil.

There is a left clamp piece 93, left set screw adjust bar 94 and left clamp nut plate 95 secured to the extended end of left side plate 22. Similarly, there is a right clamp piece 96, right set screw adjust bar 97 and right clamp nut plate 98 secured to the extended end of right side plate 23. Set screws such as 94A and 97A, allow adjustment of set screw adjust bars 94 and 97.

Other components of the vision system include the vision processor, a commercially available type.

Cognex unit and monitor having Cognex commercially available software for image searching for matching a stored image with an observed image to permit alignment of the screen or stencil with a circuit board below together with software for controlling the menu-driven functions relative to the specific screen printer application of the vision processor.

An operator communicates with the processor for aligning a particular board through a trackball teaching module 14. This teaching module has three buttons 14A, 14B and 14C and a ball 14D. Rotating or pushing the ball with fingers allows the operator to move the window within the field of view on monitor 15, and actuating the buttons allows the operator to select a menu item or move the cursor down through the menu. Operating button 14C selects a help menu.

It may be advantageous to include a monitor mounted on an arm on the side of the screen printer for observing what each vision probe in assemblies 12 and 13 observes. Two vision probes are used to detect rotational movement $\theta$ in addition to rectilinear movement in x and y directions.

The light source is preferably a high intensity light coupled to the fiber optics. These fiber optics carry light where needed on each side of each vision probe, a total of four light sources. There is also a source of illumination above the stencil for backlighting the stencil to permit observation of features, such as holes, in the stencil for identifying the image for capturing.

We turn now to a description of the process from the beginning when an operator sets up the vision system to operate upon a specific run of circuit boards to operation in an automatic cycle.

First, the operator adjusts the mechanisms on the screen printer to handle the particular board size in conventional manner. That involves adjusting the tracks and board stop, and inserting the stencil needed to print on that board inside the screen printer. These mechanical steps are the same as with the ASP-24 fully automated screen printer without the vision features according to the invention.

The operator then applies power to the apparatus to provide the main menu on display. This main menu allows the operator to select setup, edit setup, autoprint or address a help menu. First the operator selects setup. After selecting setup, a menu prompt on the screen instructs the operator to locate each vision probe over the particular object on the circuit board which the operator feels is unique and will be trained upon, such as a configuration of surface mount circuit board footprint pads. The apparatus will then look for this same unique pattern on subsequent boards in an automated production run.

The operator manually positions a first vision probe, such as the one in left assembly 12, over the board centered over the particular unique object. The operator then clamps this vision probe assembly in place. The operator then pushes button 14A on the teaching track ball module to select the next prompt on the menu. That prompt directs alignment of the second vision probe, such as the one on right assembly 13. The operator aligns this second vision probe in substantially the same manner as the first and again presses button 14A to produce the next prompt. The board patterns are taught and then the apparatus [loos] *looks* at the stencil. This next prompt instructs the operator to rotate the vision probes [throu] *through* 180° to look at the stencil. The operator then rotates mirror tubes 32 through the 180° established by the rotate clamps 42. The operator then drives the screen into position above the board with joy stick and $\theta$ push button controls on the ASP-24 machine. The operator positions the overhead structure in x, y and $\theta$ into a position such that the vision probes observe the pattern on the screen or stencil that matches the pattern on the circuit board previously aligned centered within the field of view of the probes. In response to each actuation of button 14A the menu prompts the operator to teach the pattern that is desirable after manually locating the stencil. The operator may be required to make fine adjustments in the window by moving trackball 14D and changing the window size until the object is clearly defined and boxed in a square on monitor 15. The operator then depresses push-button 14B and thereby teaches the system the pattern it is looking for with the first probe. The operator follows the same procedure for the second probe. Then the operator pushes button 14C to indicate teaching is complete.

The screen printer then makes a number of automatic moves to learn the geometry associated with this particular setup and this particular type board.

The x stepper motor first moves the screen printer a predetermined number of steps in the x direction. This movement defines the world coordinate system for the cameras 33. Because of this feature the cameras may be placed at any angle anywhere along the front of the circuit board. The y stepper motors then move the screen printer a predetermined number of steps in the orthogonal y direction to confirm the world coordinate system. The system also recognizes the number of steps per pixel during these x-y moves. These moves enable recognition of how much the image moves for every step of the stepper drive system. Then the stepper motors move the screen printer through pure rotation a predetermined number of steps to determine how the object translates in x and y coordinates during a pure rotation. The printer repeats these translational and rotational movements.

The system has thus recognized how the object moves in x and y and how it translates in x and y during a rotational move. This information on these moves allows the system to learn trigonometric solutions of several triangles.

Figure 6:
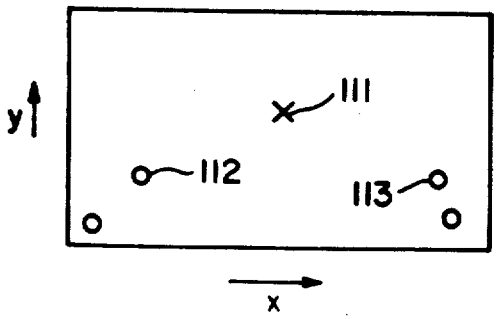
FIG. 6 is a diagram illustrating the relationship among target points and the center of rotation helpful in understanding principles of the invention.

Referring to FIG. 6, there is shown a diagrammatic representation of moves in x, y and $\theta$ helpful in understanding the principles of the invention involved in learning the geometry of the circuit boards and stencils. The pattern is characterized by a center of rotation 111. The apparatus may learn from looking at the stencil or screen driven by the stepping motors with reference to two points, such as 112 and 113, that are some vector distance away from the center of rotation 111. First performing a move in the x direction facilitates learning the world coordinate system and steps per pixel confirmed by a movement in the y direction. The following rotational moves involves taking a picture of the objects, such as 112 and 113, after an incremental move in one direction, typically counterclockwise, followed by a move from the initial position in the opposite direction by the same increment from the initial position, typically clockwise. The moves in the x and y direction basically define right triangles having a hypotenuse of magnitude corresponding to the square root of the sum of the squares of the incremental displacements in the x and y directions. The angular displacements effectively create two isosceles triangles from the shifts about points 112 and 113 with the center of rotation 111 being the common vertex for both isosceles triangles. The invention facilitates learning the geometry of the board by looking at only two points and making moves in x, y and $\theta$ directions for each of these points.

An operator may select any target point that appears unique on the board such that it may be distinguished from other target points around it, choose a second target point similarly distinguishable from other surrounding targets, and teach the apparatus the geometry of the board such that when any circuit board enters the apparatus out of line with the stencil, the video probes looking at the board automatically download the proper x, y and $\theta$ moves for the stencil to bring stencil and board into alignment.

The operator then rotates both probes to look down at the board. Looking now at the board, the system learns the pattern on the board which correlates with a pattern on the screen. The operator has then completed the automatic setup.

It may be desirable to modify this procedure slightly. For example, it may be desirable to rotate the probes to look up again after the system has learned the circuit board pattern to better correlate circuit board and screen or stencil images.

With the probes then looking at the board, the operator may then select auto print on the main menu, and the apparatus is then ready for a production run. During a production run, both probe assemblies index into position after the board has been brought in, recognize the patterns that is learned on each of the probes and automatically moves the screen relative to the board to align the stencil very accurately with the board. The probes then moves into the retracted position, printing occurs and the board just properly printed exits the machine. A new board enters, set down against the vacuum stop, the probes move to the extended position, the apparatus recognizes the patterns, downloads to the stepper motors the proper movements to align the stencil with the circuit board, print, exits, and the process repeats.

As an alternative, the operator may edit a setup. If an operator notices that the screen printer is printing consistently off the pad in one direction or other, the operator may select edit setup from the menu and modify where the screen printer is printing by selecting a predetermined direction and distance of correction. Thereafter, the apparatus will automatically print consistently in the new location and continue to print in that location until modified again.

A feature of the invention is the lighting arrangement for back lighting the stencil. Stencils and screens are usually shiny or have objects on the bottom which may be confused with object features to be taught. By laying the translucent material on the stencil and providing a light behind it, back lighting occurs which prevents this problem. This arrangement disperses the light in a manner that clearly defines each hole in the stencil relative to any type of reflective background that might occur.

The invention has a number of features. The vision probes enter between circuit board and stencil and perform the alignment as distinguished from looking at the board outside the screen printer.

There has been described novel apparatus and techniques for aligning. It is evident that those skilled in the art may now make numerous other uses and modifications of and departures from the apparatus and techniques herein disclosed without departing from the inventive concepts. Consequently, the invention is to be construed as embracing each and every novel feature and novel combination of features present in or possessed by the apparatus and techniques herein disclosed and limited solely by the spirit and scope of the appended claims.

```
/*****************************************************************
* axis.def                                                  01 Dec. 88
*
* MPM GLOBAL variables, definitions & structures organized by PROBE &
* the geometric axes ( X, Y, Z & theta ).
*
*****************************************************************/

/*
------------------
 PROBE DEFINITIONS
------------------
*/
typedef   struct
          {
          double    x, y;              /* X & Y */
          }
           d_xy;

typedef   struct
          {
          double    x, y, t;  /* X, Y, & theta */
          }
           d_xyt;

          /* GENERAL PURPOSE POSITION STRUCTURE */
typedef   struct
          {
          d_xyt     pix;      /* in pixels */
          d_xyt     mil;      /* mils or inches */
          d_xyt     step;     /* table steps */
          }
           mdl_position;

          /* MOTOR POSITION STRUCTURE */
typedef   struct
          {
          d_xyt     step;     /* table steps */
          }
           mtr_position;

          /* SCREEN POSITION STRUCTURE */
typedef   struct
          {
          d_xyt     pix;      /* in pixels */
          }
           scr_position;

          /* TRIG STRUCTURES */
typedef   struct
          {
          t_angle             *p_rt0;
          t_angle             *p_rt1;
```

```
t_angle          *p_rt2;
t_angle          *p_rt3;
t_angle          *p_rt4;
t_angle          *p_rt5;

et_angle *p_et0;
et_angle *p_et1;
```

APPENDIX A

```
}
trig_parms;

mdl_position      edit_offset;       /* User entered permanent offset. */

mdl_position      edit_backlash;     /* User entered backlash correction. */

        /* ***************************** */
        /* ***** PROBE STRUCTURE ***** */
        /* ***************************** */
typedef  struct
         {
                                 /* MODEL POINTERS */
         cse_model *mdl;      /* -> normal */
         cse_model *mmdl;     /* -> mirror image */
         cse_model *smdl;     /* screen model */

                                 /* SEARCH PARAMETER POINTER */
         cse_params           *sea_parms;

                                 /* TRIG STRUCTURE POINTERS */
         trig_parms           trig;

                                 /* ABSOLUTE POSITION STRUCTURES */
         mdl_position         s_cart;   /* cartesian home position of screen */
         mdl_position         b_cart;   /* cartesian home position of board */

                                 /* ABSOLUTE POSITION STRUCTURES */
         mdl_position         s_home;   /* home position of screen */
         mdl_position         b_home;   /* home position of board */

                                 /* RELATIVE POSITION STRUCTURES */
         mdl_position         cur1;     /* 1st current position */
         mdl_position         cur2;     /* 2nd current position */
         mdl_position         diff;     /* difference between current & original *

         d_xy                 s_cent;   /* Stencil window center */
         d_xy                 b_cent;   /* Board   window center */

                                 /* UNIT MEASURE VALUES */
         d_xyt                mpp;      /* (stencil) Mil Per Pixel ( MPP ) values *
/
         double               ampp;     /* angular MPP ( root sum square of [illegible]
*/
         d_xyt                bmpp;     /* BOARD MPP values */
         d_xyt                dmpp;     /* DEFAULT BOARD MPP values */

                                 /* MISC */

         double    probe_angle;        /* probe angle relative to y axis-ALSO USED
```

```
 */
/                                        /* AS TEMP STORE FOR INTERMEDIATE RESULTS */

        int       good_search;           /* Search flag - FALSE => model not found */
/
        int       camera;                /* Camera number. */
        u_char    gain;                  /* Camera gain & offset values */
        u_ch      offset;
        u_ch      s_gain;                /* STENCIL camera gain & offset values */
        u_char    s_offset;
        u_char    def_gain;
        u_char    def_offset;

        double    shape;                 /* Most recent search shape score. */
        double    contrast; /* Most recent search contrast score. */
        }
         probe_parms;

probe_parms        probe_1, probe_2;
probe_parms        *p_prob_1, *p_prob_2;


/*
-----------------
 AXIS DEFINITIONS
-----------------
*/

        /* ************************** */
        /* ***** AXIS STRUCTURE ***** */
        /* ************************** */
typedef struct
        {
                /* STENCIL UNIT MEASURE VALUES */
        double  mps;                /* STATIC mils per step */
        double  pps;                /*        pixels per step */
        double  mpp;                /*          mils per pixel */

                /* BOARD UNIT MEASURE VALUES */
        double  bpps;               /*        pixels per step */
        double  bmpp;               /*          mils per pixel */


        int     def_cal_steps;      /* STATIC # of steps to move in calibration
*/
        int     cal_steps;          /* # of steps to move in calibration */
        int     huge_step;          /* STATIC # of steps to move in limit find
*/

                                /* LENGTH OF MOVE */
        double  mil_delta;          /* in mils */
        double  pel_delta;          /* in pixels */
        int     step_delta;         /* in motor steps ( or half steps ) */

        double  load_error;         /* board load error */
        double  p_load_error;       /* probe load error */
        double  backlash_error;     /* backlash error */

        int     center_offset;      /* offset from center of rotation. */

   /* ---------------------------------- */
```

```
/* MOTOR INDEXER COMMAND STRING VALUES */
/* ---------------------------------- */
        char      motor              [10];     /* motor number */

        char      mode               [10];     /* INDEXER default mode */
        char      distance  [10];    /* default distance */
        char      start_stop         [10];     /* min. speed for no ramp */

        char      velocity  [10];    /* velocity in steps per second */

        char      ramp               [10];     /* ramp time in ms/10 */
        char      cycles             [10];     /* # of cycles for cycle mode */
        char      direction [10];    /* + or - direction */
        char      output             [10];     /* programmable output J20-10 H or
L */
/* ---------------------------------- */
        char      mess               [80];     /* INDEXER OUTPUT STRING. */
/* ---------------------------------- */

        enum mode_motion move_mode;  /* mode = x, y, theta or static */
        enum mode_motion move_default;        /* default move mode */

        int       limit;                      /* State of limit switch */
        int       index;                      /* State of index switch */
        int       home;                       /* home position */
        int       delay;                      /* delay after move (soft loop) */
        }
         axis_parms;

/*
------------------
 axis declarations
------------------
*/

axis_parms x_axis =
        {
        0.49213, /* mps */
        0.5,      /* pps */
        0.5,      /* mpp */

        0.5,      /* bpps */
        0.5,      /* bmpp */

        100,     /* # default steps for cal */
        100,     /* # steps for cal */
        1000,    /* # steps for limit find */

                              /* LENGTH OF MOVE */
        0.0,     /* in mils */
        0.0,     /* in pixels */
        0,       /* in steps ( or half steps ) */

        0.0,     /* board err */
        0.0,     /* probe err */
        0.0,     /* backlash err */

        0,       /* offset from center. */

/* ---------------------------------- */
/* MOTOR INDEXER COMMAND STRING VALUES */
/* ---------------------------------- */
```

```
        "/0",       /* motor # */

        "S",        /* mode */
        "1",        /* distance */
        "100"       /* no ramp val */

        "2000",     /* velocity */

        "0.75",     /* ramp time */
        "1",        /* cycles */
        "-",        /* direction */
        "-",        /* dummy to direction - was output H/L */
    /* ---------------------------------- */
        "",         /* OUT STRING */
    /* ---------------------------------- */

        MODE_X,     /* mode */
        MODE_X,     /* default mode */

        OFF,        /* limit */
        OFF,        /* index */
        1000,       /* home  */
        1,          /* delay */
        };

axis_parms y_axis =
        {
        0.49213,    /* mps */
        0.5,        /* pps */
        0.5,        /* mpp */

        0.5,        /* bpps */
        0.5,        /* bmpp */

        100,        /* # default steps for cal */
        100,        /* # steps for cal */
        1000,       /* # steps for limit find */

                                /* LENGTH OF MOVE */
        0.0,        /* in mils */
        0.0,        /* in pixels */
        0,          /* in steps ( or half steps ) */

        0.0,        /* board err */
        0.0,        /* probe err */
        0.0,        /* backlash err */

        0,          /* offset from center. */

    /* ---------------------------------- */
    /* MOTOR INDEXER COMMAND STRING VALUES */
    /* ------------------   ---------- */
        "/1",       /* motor # */

        "S",        /* mode */
        "1",        /* distance */
        "100",      /* no ramp val */

        "2000",     /* velocity */

        "0.75",     /* ramp time */
        "1",        /* cycles */
        "-",        /* direction */
```

```
        "-",        /* dummy to direction - was output H/L */
    /* -------   ------------------------- */
        "",         /* OUT STRING */
    /* ---------------------------------- */

        MODE_Y,     /* mode */
        MODE_Y,     /* default mode */

        OFF,        /* limit */
        OFF,        /* index */
        1,          /* home  */
        1,          /* delay */
        };

axis_parms t_axis =
        {
/*
        0.0004335,
        0.000288,
*/  /* mps ACTUALLY DEGREES PER STEP */

        0.0002981, /* mps ACTUALLY DEGREES PER STEP */
        0.5,        /* pps */
        0.5,        /* mpp */

        0.5,        /* bpps */
        0.5,        /* bmpp */

        1000,       /* # default steps for cal */
        1000,       /* # steps for cal */
        20000,      /* # steps for limit find */

                                /* LENGTH OF MOVE */
        0.0,        /* in mils */
        0.0,        /* in pixels */
        0,          /* in steps ( or half steps ) */

        0.0,        /* board err */
        0.0,        /* probe err */
        0.0,        /* backlash err */

        0,          /* offset from center. */

    /* ---------------------------------- */
    /* MOTOR INDEXER COMMAND STRING VALUES */
    /* ---------------------------------- */
        "/2",       /* motor # */

        "S",        /* mode */
        "1",        /* distance */
        "100",      /* no ramp val */

        "3000",     /* velocity */

        "0.25",     /* ramp time */
        "1",        /* cycles */
        "-",        /* direction */
        "-",        /* dummy to direction - was output H/L */
    /* ---------------------------------- */
        "",         /* OUT STRING */
    /* ---------------------------------- */
```

```
        MODE_...ETA,        /* mode */
        MODE_THETA,         /* default mode */

        OFF,        /* limit */
        OFF,        /* index */
        10400,      /* home  */
        1,          /* delay */
        };

axis_parms *p_x_axis, *p_y_axis, *p_t_axis;     /* -> AXIS STRUCTS */
/*****************************************************************************
* cccif.v                                                    Dec. 89
*
*        CCC InterFace Pointer Device
*
*****************************************************************************/

/* DEFAULT FRAME-GRABBER CIF_PD'S */
cif_pd *cif_fg_cursor;
cif_pd *cif_fg_gainoff;
cif_pd *cif_fg_split;
cif_pd *cif_fg_window;

/*
Init the Pointer Device parameter structures.
NOTE :    The nulls indicate that the trackball processes are being
          performed on the frame grabber ( caq_mode, caq_image ).
*/
cif_fg_cursor  = cif_make_cursor(NULL, NULL);
cif_fg_gainoff = cif_make_gainoff(NULL, NULL);
cif_fg_split   = cif_make_split(NULL, NULL);
cif_fg_window  = cif_make_window(NULL, NULL, NULL);

( ( cif_iv_window *)  cif_fg_window->function_iv ) ->color = CAQ_BLINK;

/*
-----------------------------------------------------
 COMMONLY USED ARGUMENTS TO "Pointer Device" FUNCTIONS
-----------------------------------------------------
*/

        /* The default window cif_pd's image buffer. */

#define IMAGE (((cif_iv_window *) cif_fg_window->function_iv)->imbuf)

        /* Cursor coordinates. */

#define CURSOR_X (cif_fg_cursor->x)
#define CURSOR_Y (cif_fg_cursor->y)

#define WINDOW_X (cif_fg_window->x)
#define WINDOW_Y (cif_fg_window->y)

WINDOW_X = 238;
WINDOW_Y = 174;
/*
-------------------------------------------
 MACROS FOR USING "Pointer Device" FUNCTIONS
-------------------------------------------

        :\/\/\/\/\/\/\/\/\/\/\/\/\/\/\/\/\/\/:
        :                                   :
```

```
:            .                .          :
:          .   BALL    .     :
:         .   .       .                   :
:                .                        :
:                                         :
:                                         :
:                                         :
:  .  .  .  .  .  .  .  .  .  .  .  .  :
:                                         :
:                                         :
:                                         :
:    +---+     +---+         +---+       :
:    +   +     +   +         +   +       :
:    + 1 +     + 2 +         + 3 +       :
:    +   +     +   +         +   +       :
:    +---+     +---+         +---+       :
:                                         :
:/\/\/\/\/\/\/\/\/\/\/\/\/\/\/\/\/\/\/\/\:
```

```
*/
/*
    Change size or position of the box.
          Key 2 alternates position and size modes.
          Key 1 to exit.
          Key 3 unused.
/*
#define BOX { cif_fg_window->xlo = 189; cif_fg_window->xhi = 443; cif_fg_window->t
rack(cif_fg_window); }
*/
#define BOX { cif_fg_window->track(cif_fg_window); }
#define I BOX

/*
    Position a crosshair on a realtime image.
          Any key to exit.
*/
#define CURSOR cif_fg_cursor->track(cif_fg_cursor);

/*
    Position the video split location.
          Any key to exit.
*/
#define SPLIT cif_fg_split->track(cif_fg_split);

/*
    Change the camera gain and offset.
          Moving the ball horizontally changes the offset;
          Moving the ball vertically   changes the gain.
          Any key to exit.
*/
#define GAINOFF cif_fg_gainoff->track(cif_fg_gainoff);

/*
----------------
 UTILITY MACROS
----------------
*/

/* Display the box outline superimposed on a realtime image. */
#define RT cif_realtime(1, cif_fg_window);

/* Vanilla realtime; no box outline. */
```

```
#define VRT cif_realtime(0, cif_fg_window);

/* Magnify the box in the center of the screen. */
#define M cif_magnify(8, cif_fg_window);
/*
cif_fg_window->   i = 447;
*/

/*************************
* ccc_pd_start
*
*        Custom Pointer Device start routine for windowing with legend.
*
*************************/
void ccc_pd_start ( x, y, p_pd )

        register int x, y;
        register cif_pd *p_pd;
{
        cip_buffer          *my_cursor;

if ( !p_pd ) { cct_error( CGEN_ERR_BADARG ); }
/*
cif_realtime( 1, p_pd );
*/
caq_cpu();
caq_constant( CAQ_PASS );
cgr_outline( IMAGE, CAQ_BLINK);
caq_graphics();

u_mess( NO_OP, " ** TEST MESSAGE ** CUSTOM CURSOR ** TEST MESSAGE ** " );
/*
cgr_outline( ((cif_iv_window *)cif_fg_window->function_iv)->imouf, CAQ_BLINK);
*/
/*
caq_cpu();
cgr_outline( IMAGE, CAQ_BLINK);
caq_graphics();
WINDOW_X = x;
WINDOW_Y = y;
*/
}

cif_fg_window->start = ccc_pd_start;


/*************************
* find_center
*
*        Calculate the center of a user defined window.
*
*************************/
void find_center ( p_window

        d_xy      *p_window;          /* - probe struct. */
{
        int       x, y;
        double    fx, fy, fwidth, fheight, x_cent, y_cent;

BOX
fx = cif_fg_window->x;
fy = cif_fg_window->y;
```

```
fwidth  = IMAGE->width;
fheight = IMAGE->height;
p_window->x =   fx + ( fwidth  / 2.0 ) );
p_window->y = , fy + ( fheight / 2.0 ) );

printf ( "center = %f, %f\n", p_window->x, p_window->y );

}
/*****************************************************************
* geo.v                                                    09 Jan. 88
*
* MPM geometry functions.
*
*****************************************************************/


/*************************
* test_pseudo
*
* geo.v                          13 Jan. 88
*************************/


void test_pseudo( )
{
        void      do_geom(), show_geom();
        void      psc_add(), psc_init(), psc_fwd(), psc_rev();

        double    x, y, *p_x, *p_y;

p_pseudo = &pseudo;
p_x = &x; p_y = &y;

printf ( "-----------------------------------------------------------------
--\n" );


psc_init (  p_pseudo );
mode_scale = ON;   psc_add (  6.70,  15.20,    6.4,  14.3, p_pseudo );
                   psc_add ( -14.70,   9.80, -13.5,   4.3, p_pseudo );
do_geom ( p_pseudo );
show_geom ( p_pseudo );

psc_init (  p_pseudo );
mode_scale = ON;   psc_add (   3.0,   6.0,   4.50,   6.35, p_pseudo );
                   psc_add (  -4.0,   3.0,  -1.50,   1.70, p_pseudo );
do_geom ( p_pseudo );
show_geom ( p_pseudo );

psc_init (  p_pseudo );
mode_scale = ON;   psc_add (  6.70,  15.20,   12.0,  12.0, p_pseudo );
                   psc_add ( -14.70,   9.80, -10.0,  10.0, p_pseudo );
do_geom ( p_pseudo );
show_geom ( p_pseudo );


/*
psc_init (  p_pseudo );
mode_scale = ON;   psc_add (  12.00, -12.00,  12.01, -12.02, p_pseudo );
                   psc_add ( -10.00, -10.00,  -10.01, -10.02, p_pseudo )
```

```
;
do_geom ( p_pseudo );
show_geom ( p_pseudo );

psc_init (  p_pseudo );
mode_scale = ON;   psc_add (  12.00, -11.99,  12.00, -11.98, p_pseudo );
                   psc_add ( -10.00, -9.99,  -10.00, -9.98, p_pseudo );
do_geom ( p_ps   o );
show_geom ( p_p  udo );


psc_init (  p_pseudo );
mode_scale = ON;   psc_add (  12.0, -12.0,  12.00, -12.00, p_pseudo );
                   psc_add (  10.0, -10.0,  10.00, -10.00, p_pseudo );
do_geom ( p_pseudo );
show_geom ( p_pseudo );

psc_init (  p_pseudo );
mode_scale = ON;   psc_add (  12.0, -12.0,  18.00, -18.00, p_pseudo );
                   psc_add (  10.0, -10.0,  10.00, -10.00, p_pseudo );
do_geom ( p_pseudo );
show_geom ( p_pseudo );

psc_init (  p_pseudo );
mode_scale = ON;   psc_add (  12.0, -12.0,  12.00, -12.00, p_pseudo );
                   psc_add (  12.0, -12.0,  12.00, -12.00, p_pseudo );
do_geom ( p_pseudo );
show_geom ( p_pseudo );
*/


printf ( "-----------------------------------------------------------------
--\n" );


/*
psc_init (  p_pseudo );
mode_scale = ON;   psc_add (  12.0, -12.0,  12.00, -12.00, p_pseudo );
                   psc_add (  10.0, -10.0,  10.00, -10.00, p_pseudo );
do_geom ( p_pseudo );
show_geom ( p_pseudo );

psc_init (  p_pseudo );
mode_scale = ON;   psc_add (  12.0, -12.0,  18.00, -18.00, p_pseudo );
                   psc_add (  10.0, -10.0,  10.00, -10.00, p_pseudo );
do_geom ( p_pseudo );
show_geom ( p_pseudo );

psc_init (  p_pseudo );
mode_scale = ON;   psc_add (  12.0, -12.0,  12.00, -12.00, p_pseudo );
                   psc_add (  10.0, -10.0,  15.00, -15.00, p_pseudo );
do_geom ( p_pseudo );
show_geom ( p_pseudo );
*/


printf ( "-----------------------------------------------------------------
```

```
--\n" );

}


/*
printf ( "--- THETA_YES -- X_YES -- Y_YES -- SCALE__YES -- QUADS_2  --\n" );
*/

/*
psc_init (  p_pseudo );
mode_scale = ON;   psc_add (  12.0,  12.0,   6.70,  15.20, p_pseudo );
                              psc_add ( -10.0,  10.0, -14.70,   9.80, p_pseudo );
do_geom ( p_pseudo );
show_geom ( p_pseudo );

psc_init (  p_pseudo );
mode_scale = ON;   psc_add ( -12.0,  12.0,  -6.70,  15.20, p_pseudo );
                              psc_add (  10.0,  10.0,  14.70,   9.80, p_pseudo  ;
do_geom ( p_pseudo );
show_geom ( p_pseudo );

psc_init (  p_pseudo );
mode_scale = ON;   psc_add ( -12.0, -12.0,  -6.70, -15.20, p_pseudo );
                              psc_add (  10.0, -10.0,  14.70,  -9.80, p_pseudo :;
do_geom ( p_pseudo );
show_geom ( p_pseudo );

psc_init (  p_pseudo );
mode_scale = ON;   psc_add (  12.0, -12.0,   6.70, -15.20, p_pseudo );
                              psc_add ( -10.0, -10.0, -14.70,  -9.80, p_pseudo );
do_geom ( p_pseudo );
show_geom ( p_pseudo );
*/



/*************************
* r_sum_sq
*                    Root sum square.
*************************/
double r_sum_sq ( x, y )

         double    x, y;
{
         double    hypotenuse;

hypotenuse = ( sqrt( pow( x, 2.0 ) + pow( y, 2.0 ) ) );
return ( hypotenuse );
}
/*************************
* r_dif_sq
*                    Root difference square.
*************************/
double r_dif_sq ( hypotenuse, xy )

         double    hypotenuse, xy;
{
         double    other_side;

other_side = ( sqrt( pow( hypotenuse, 2.0 ) - pow( xy, 2.0 ) ) );
```

```
return ( hypotenuse );
}
/************************
* to_cart
*
*        Polar to Cartesian coordinate transformation.
*
*                                  r  => radius
*                                  th => theta
*
*                                 . . . . . . . . . .
*                                 .                 .
*                                 .  x = r cos th   .
*                    Y            .                 .
*                        r.       .  y = r sin th   .
*                    |   .        .                 .
*                    |  .     .Y  . . . . . . . . . .
*                    | .      .
*                    |. th    .
*     X   ----------+----------
*                    |    x
*                    |
*                    |
*                    |
*
*************************/
void to_cart ( radius, theta, p_x, p_y )

        double   radius, theta, *p_x, *p_y;
{

*p_x = ( radius * cos( theta / RADIAN ));
*p_y = ( radius * sin( theta / RADIAN ));

*p_x =
        (
        (*p_y)
        /
        ( tan( theta / RADIAN ))
        );

}
/************************
* to_polar
*
*        Cartesian to Polar coordinate transformation.
*
*                                  r  => radius
*                                  th => theta
*
*                                 . . . . . . . . . . . . . . . .
*                                 .                             .
*                                 .                             .
*                                 .  r = sqrt ( x + y )         .
*                    Y            .                             .
*                        r.       .   tan th = x / y            .
*                    |   .        .                             .
*                    |  .     .Y  . . . . . . . . . . . . . . . .
*                    | .      .
*                    |.       .
```

```
*                    |. th    .
*     X   ----------+----------
*                    |    x
*                    |
*                    |
*                    |
*                    |
*
************************/
void to_polar (  x, y, p_radius, p_theta )

        double    x, y, *p_radius, *p_theta ;
{
        double    tan_2_ang(), r_sum_sq();

*p_radius = r_sum_sq( x, y);
*p_theta = tan_2_ang( x, y );

}
/************************
* psc_init
*
************************/
void psc_init( p_geom )

        psc_geom  *p_geom;
{
p_geom->p_count = 0.0;

p_geom->x1 = 0.0;
p_geom->x2 = 0.0;
p_geom->y1 = 0.0;
p_geom->y2 = 0.0;
}
/************************
* psc_add
*
************************/
void psc_add( x, y, xp, yp, p_geom )

        psc_geom  *p_geom;
   double x, y, xp, yp;
{
p_geom->p_count++;
if ( p_geom->p_count == 1 )
        {
        p_geom->x1 = x;              p_geom->xp1 = xp;
        p_geom->y1 = y;              p_geom->yp1 = yp;
        }
if ( p_geom->p_count == 2 )
        {
        p_geom->x2 = x;              p_geom->xp2 = xp;
        p_geom->y2 = y;              p_geom->yp2 = yp;
        }
}
/************   ********
* tan_2_ang
*
************************/
double tan_2_ang ( x, y )

        double    x, y;
```

```
{
        double    tan_2_deg();
        double    t, tan_t;

tan_t = ( y / x );

if ( tan_t > 1.0 )
        {
        tan_t = ( 1.0 / tan_t );
        t = tan_2_deg( tan_t );
        t = (( 90.0 + t ) );
        }

/*
if ( tan_t <= -1.0 )
        {
        tan_t = ( 1.0 / tan_t );
        t = tan_2_deg( tan_t );
        t = (( -90.0 + t ) );
        }
*/

else
        {
        t = tan_2_deg( tan_t );
        }

/* !!!!!!! TEMP - DIRECT STRUCT REFERENCES - TEMP !!!!!!! */

/*
if ( p_pseudo->quad_num == 2 ) { t +=  90.0; }
if ( p_pseudo->quad_num == 3 ) { t += 180.0; }
if ( p_pseudo->quad_num == 4 ) { t += 270.0; }
*/

return( t );
}
/************************
* calc_offsets
*
************************/


        double    theta, radius, theta_n, theta_p, slope_n, slope_p;


void calc_offsets ( p_geom )

        psc_geom  *p_geom;

{
radius  = p_geom->radius_n;
theta_n = p_ge   >theta_n;
theta_p = p_ge__ >theta_p;
theta   = p_geom->theta;
slope_n = p_geom->slope_n;
slope_p = p_geom->slope_p;

p_geom->theta_only = (theta_n - theta);

p_geom->offs_y =
        (
```

```
        (radius)
        * ( sin( ( (theta_n) - (theta) ) / RADIAN ))
        );

p_geom->offs_x =
        (
        (radius)
        * ( cos( ( (theta_n) - (theta) ) / RADIAN ))
        );

/*
p_geom->offs_x =
        (
        (p_geom->offs_y)
        /
        ( tan( ( (theta_n) - (theta) ) / RADIAN ))
        );
*/

p_geom->new_x = p_geom->offs_x;
p_geom->new_y = p_geom->offs_y;
}
/****************    ****
* quad_1
*
************************/

void quad_1 ( p_geom )

        psc_geom  *p_geom;
{
p_geom->radius_n = r_sum_sq( p_geom->x1, p_geom->y1 );
p_geom->theta_n = tan_2_ang( p_geom->x1, p_geom->y1 );
p_geom->radius_p = r_sum_sq( p_geom->xp1, p_geom->yp1 );
p_geom->theta_p = tan_2_ang( p_geom->xp1, p_geom->yp1 );

calc_offsets( p_geom );

p_geom->offs_x = ( p_geom->xp1 - p_geom->offs_x );
p_geom->offs_y = ( p_geom->yp1 - p_geom->offs_y );


/*
p_geom->radius_n = r_sum_sq( p_geom->x2, p_geom->y2 );
p_geom->theta_n = tan_2_ang( p_geom->x2, p_geom->y2 );
p_geom->radius_p = r_sum_sq( p_geom->xp2, p_geom->yp2 );
p_geom->theta_p = tan_2_ang( p_geom->xp2, p_geom->yp2 );

calc_offsets( p_geom );
p_geom->offs_x   ( p_geom->xp2 - p_geom->offs_x
p_geom->offs_y   ( p_geom->yp2 - p_geom->offs_y
*/
}
/************************
* quad_2
*
************************/
void quad_2 ( p_geom )

        psc_geom  *p_geom;
{
p_geom->radius_n = r_sum_sq( p_geom->x2, p_geom->y2 );
```

```
p_geom->theta_n = tan_2_ang( (p_geom->x2), (p_geom->y2) );
p_geom->radius_p = r_sum_sq( p_geom->xp2, p_geom->yp2 );
p_geom->theta_p = tan_2_ang( (p_geom->xp2), (p_geom->yp2));

calc_offsets( p_geom );

p_geom->offs_x = ( p_geom->xp2 - p_geom->offs_x );
p_geom->offs_y = ( p_geom->yp2 - p_geom->offs_y );

/*
p_geom->radius_n = r_sum_sq( p_geom->x1, p_geom->y1 );
p_geom->theta_n = tan_2_ang( (p_geom->x1), (p_geom->y1) );
p_geom->radius_p = r_sum_sq( p_geom->xp1, p_geom->yp1 );
p_geom->theta_p = tan_2_ang( (p_geom->xp1), (p_geom->yp1));

calc_offsets( p_geom );

p_geom->offs_x = ( p_geom->xp1 - p_geom->offs_x );
p_geom->offs_y = ( p_geom->yp1 - p_geom->offs_y );
*/
}
/************************
* quad_3
*
************************/
void quad_3 ( p_geom )

        psc_geom  *p_geom;
{
p_geom->radius_n = r_sum_sq( p_geom->x2, p_geom->y2 );
p_geom->theta_n = tan_2_ang( p_geom->x2, p_geom->y2 );
p_geom->radius_p = r_sum_sq( p_geom->xp2, p_geom->yp2 );
p_geom->theta_p = tan_2_ang( p_geom->xp2, p_geom->yp2 );

calc_offsets( p_geom );

p_geom->offs_x = ( p_geom->xp2 - p_geom->offs_x );
p_geom->offs_y = ( p_geom->yp2 - p_geom->offs_y );
}
/************************
* quad_4
*
************************/
void quad_4 ( p_geom )

        psc_geom  *p_geom;
{
p_geom->radius_n = r_sum_sq( p_geom->x1, p_geom->y1 );
/*
p_geom->theta_n = tan_2_ang( p_geom->x1, p_geom->y1 );
*/
p_geom->theta_n = tan_2_deg( p_geom->y1 / p_geom->x1 );
p_geom->radius_p = r_sum_sq( p_geom->xp1, p_geom->yp1 );
/*
p_geom->theta_p = tan_2_ang( p_geom->xp1, p_geom->yp1 );
*/
p_geom->theta_p = tan_2_deg( p_geom->yp1 / p_geom->xp1 );

calc_offsets( p_geom );

p_geom->offs_x = ( p_geom->xp1 - p_geom->offs_x );
p_geom->offs_y = ( p_geom->yp1 - p_geom->offs_y );
```

```
}
/*************************
* do_geom
*
*************************/
void do_geom( p_geom )

        psc_geom  *p_geom;
{
        double    tan_2_ang(), r_sum_sq();
        void      to_cart();
        double    natural, prime;

p_geom->dif_x  = (  p_geom->x2 -  p_geom->x1  );
p_geom->dif_xp = ( p_geom->xp2 - p_geom->xp1 );
p_geom->dif_y  = (  p_geom->y2 -  p_geom->y1  );
p_geom->dif_yp = ( p_geom->yp2 - p_geom->yp1 );


p_geom->slope_n = tan_2_deg( p_geom->dif_y / p_geom->dif_x  );
p_geom->slope_p = tan_2_deg( p_geom->dif_yp / p_geom->dif_xp );

natural   = r_sum_sq ( p_geom->dif_x,  p_geom->dif_y );
prime     = r_sum_sq ( p_geom->dif_xp, p_geom->dif_yp );

p_geom->scale = ( prime / natural );

p_geom->theta = ( p_geom->slope_n - p_geom->slope_p );

p_geom->hypot = r_sum_sq ( (p_geom->x1), (p_geom->y1) );

/*
 Convert natural and prime points to polar coordinates.
*/


/* QUAD # 1 */
if ( ( p_geom->x1 > 0.0 ) && ( p_geom->y1 > 0.0 ) )
        {
        p_geom->quad_num = 1;
        quad_1( p_geom );
        }

/* QUAD # 2 */
else
if ( ( p_geom-> x1 < 0.0 ) && ( p_geom->y1 > 0.0 )
        {
        p_geom->quad_num = 2;
        quad_2( p_geom );
        }

/* QUAD # 3 */
else
if ( ( p_geom->x1 < 0.0 ) && ( p_geom->y1 < 0.0 ) )
        {
        p_geom->quad_num = 3;
        quad_3( p_geom );
        }
/* QUAD # 4 */
else
if ( ( p_geom->x1  0.0 ) && ( p_geom->y1 < 0.0 ) )
        {
```

```
        p_geom->quad_num = 4;
        quad_4( p_geom );
        }


/*
 Solve for the X & Y components of scale for the PRIME angle.
*/
/*
p_geom->scale_x = r_dif_sq ( p_geom->dif_xp, p_geom->dif_x );
p_geom->scale_y = r_dif_sq ( p_geom->dif_yp, p_geom->dif_y );
*/

p_geom->scale_x = p_geom->scale;
p_geom->scale_y = p_geom->scale;

if ( mode_scale == ON )
        {
        p_geom->coffs_x = ( p_geom->offs_x * (  p_geom->scale_x) );
        p_geom->coffs_y = ( p_geom->offs_y * (  p_geom->scale_y) );
        }
else
        {
        p_geom->coffs_x = p_geom->offs_x;
        p_geom->coffs_y = p_geom->offs_y;
        }
}
/************************
* show_geom
*
************************/
void show_geom( p_geom )

        psc_geom  *p_geom;
{

printf ( " scale_diag_X_Y % 8.3f % 8.3f % 8.3f :\n",
         p_geom->scale, p_geom->scale_x, p_geom->scale_y );

printf ( " theta_n_p_o    % 8.3f % 8.3f % 8.3f :",
         p_geom->theta_n, p_geom->theta_p, p_geom->theta_only );

printf ( "\tQUAD = %d :\n",
         p_g   - quad_num );

printf ( " slopes_n_p     % 8.3f % 8.3f :\n",
         p_geom->slope_n, p_geom->slope_p );

printf ( " radius_N_P     % 8.3f % 8.3f :\n",
         p_geom->radius_n, p_geom->radius_p );

printf ( " Tonly          % 8.3f % 8.3f :\t\tTHETA %f\n",
          p_geom->new_x, p_geom->new_y, p_geom->theta );

printf ( " offsets_X_Y    % 8.3f % 8.3f :\n",
         p_geom->offs_x, p_geom->offs_y );

printf ( " c_offsets_X_Y  % 8.3f % 8.3f :\n",
         p_geom->coffs_x, p_geom->coffs_y );

printf ( "------------------------------------------------------------ - ;
}
```

```
/*****************************************************************
*****************************************************************/

/************************
* geom_init
*
*         Init geometry structures and pointers.
*
************************/
void      geom_init()
{


}
/************************
* rt_init
*
*         Init geometry structure.
*
************************/
t_angle   *rt_init( p_rt )

          t_angle   *p_rt;
{
if ( p_rt )
          {
          free( p_rt );
          }
p_rt = ( t_angle *) cvc_alloc ( sizeof ( t_angle ));

p_rt->SIDE_A      = 0.0;
p_rt->SIDE_B      = 0.0;
p_rt->HYPOTENUSE  = 0.0;
p_rt->A_ACUTE     = 0.0;
p_rt->A_OBTUSE    = 0.0;
p_rt->A_RIGHT     = 90.0;

return ( p_rt );
}
/************************
* et_init
*
*         Init  geometry structure.
*
************************/
et_angle  *et_init( p_et )

          et_angle  *p_et;
{
if ( p_et )
          {
          free( p_et );
          }
p_et = ( et_angle *) cvc_alloc ( sizeof ( et_angle ));

p_et->SIDE_A      = 0.0;
p_et->SIDE_B      = 0.0;
p_et->SIDE_C      = 0.0;
p_et->ANGLE_A     = 0.0;
p_et->ANGLE_B     = 0.0;
p_et->ANGLE_C     = 0.0;
```

```
return ( p_et );
}
/************************
* geom_solve
*
*        Compute x,y & theta error of the target ( prime ) coordinate
*        system with reference to the source coordinate system.
************************/
void geom_solve ( p_geom, p_probe, x0, y0, x1, y1 , x2, y2, x3, y3 )

        cpsi_geom *p_geom;
        probe_parms        *p_probe;
        double             x0, y0, x1, y1, x2, y2, x3, y3;
{
double ccpsi_angle();

int       x0_i, y0_i, x1_i, y1_i, x2_i, y2_i, x3_i, y3_i;
int       *p_xi, *p_yi;
double    angle;
double    x0_o, y0_o, x1_o, y1_o, x2_o, y2_o, x3_o, y3_o;

angle = 0.0;
x0_o = 0.0; y0_o = 0.0; x1_o = 0.0; y1_o = 0.0;
x2_o = 0.0; y2_o = 0.0; x3_o = 0.0; y3_o = 0.0;

cpsi_init  ( p_geom );

x0_i = ( x0 * 1.0 );          y0_i = ( y0 * 1.0 );
x1_i = ( x1 * 1.0 );          y1_i = ( y1 * 1.0 );
cpsi_add   ( x0_i, y0_i, x1_i, y1_i, p_geom );

x2_i = ( x2 * 1.0 );          y2_i = ( y2 * 1.0 );
x3_i = ( x3 * 1.0 );          y3_i = ( y3 * 1.0 );
cpsi_add   ( x2_i, y2_i, x3_i, y3_i, p_geom );

cpsi_solve ( p_geom );

p_xi = &x1_i;       p_yi = &y1_i;
cpsi_fwd ( x0_i, y0_i,  p_xi, p_yi, p_geom );

p_xi = &x3_i;       p_yi = &y3_i;
cpsi_fwd ( x2_i, y2_i,  p_xi, p_yi, p_geom );

x1_o = x1_i;        y1_o = y1_i;
x3_o = x3_i;        y3_o = y3_i;

angle = ccpsi_angle ( p_geom );
printf ( "\n ****************************************\n" );
printf ( " ***** RADIANS =%f\n", angle );
angle *= RADIAN;

p_probe->diff.pix.x = ( x0 - ( x1 / 1.0 ) );
p_probe->diff.pix.y = ( y0 - ( y1 / 1.0 ) );
p_probe->diff.pix.t = angle;

printf ( "\n ****************************************\n" );
printf ( " ***** X0=%f Y0=%f X1=%f Y1=%f\n", x0, y0, x1, y1 );
printf ( " ***** X2=%f Y2=%f X3=%f Y3=%f\n", x2, y2, x3, y3 );
printf ( " ***** ANGLE =%f\n", angle );
printf ( " ***** X0=%f Y0=%f X1=%f Y1=%f\n", x0_o, y0_o, x1_o, y1_o );
printf ( " ***** X2=%f Y2=%f X3=%f Y3=%f\n", x2_o, y2_o, x3_o, y3_o );
printf ( "\n ****************************************\n" );
```

```
getchar();
}
/************************
* ccpsi_angle
*
*        Compute floating point angle between two cartesian coordinate
*        systems.
************************/
/* !!!!!!!!!!! RETURNS ANGLE IN RADIANS !!!!!!!!!! */
double ccpsi_angle ( p_geom )

        cpsi_geom *p_geom;
{
        double              atan2();

return( atan2( CIA_FLOAT16( p_geom->fwd.yx.n), CIA_FLOAT16( p_geom->fwd.xx.n)));
}


/************************
* geom_test
*
*        *** TEMP FOR TEST ***
*
************************/
void geom_test ( )
{
}

/************************
* TRIGONOMETRY FUNCTIONS
*
*
*******%******************/
/************************
* sho_trig
*
*
************************/
void sho_trig( p_rt, p_et )

   t_angle *p_rt;   /* - Struct of angles & sides of a right triangle. */
   et_angle *p_et;  /* - Struct of angles & sides of an equilateral triangle. */
{
double   multiplier;

multiplier = 1.0;
if ( rep_unit == MODE_INCHES ) { multiplier = 1000.0; }

if ( !p_et )
        {
        printf ( " a = %f ", ( p_rt->SIDE_A   / multiplier ));
        printf ( " b = %f ", ( p_rt->SIDE_B   / multiplier ));
        printf ( " h = %f ", ( p_rt->HYPOTENUSE          ));
        printf ( " A = %f ", ( p_rt->A_ACUTE  ));
        printf ( " O = %f\n",( p_rt->A_OBTUSE ));
        }
else
        {
        printf ( " a = %f ", ( p_et->SIDE_A   / multiplier ));
        printf ( " b = %f ", ( p_et->SIDE_B   / multiplier ));
        printf ( " c = %f\n",( p_et->SIDE_C   / multiplier ));
```

```
        printf ( " A = %f ", ( p_et->ANGLE_A  ));
        printf ( " B = %f ", ( p_et->ANGLE_B  ));
        printf ( " C = %f\n",( p_et->ANGLE_C  ));
        }
}
/************************
* tan_2_deg.
*
*       Find ( 0 to 45 deg ) angle given tangent using gross approximation
*       followed by sucessive approximation.
*
************************/
double    tan_2_deg( tan_in )

        double    tan_in;
{
        int       i;
        double    angle;              /* Result in degrees. */
        double    angle_inc;          /* Angle increment value. */
        double    difference;
        double    tan_approximation,  tan_sign;

angle = 50.0;

/*
if ( (fabs(tan_in) > 0.0) && (fabs(tan_in) < 1.0) )
*/
tan_sign = 1.0;
if ( tan_in < 0.0 )
        {
        tan_sign = -1.0;
        tan_in = fabs ( tan_in );
        }

if ( (fabs(tan_in) < 1.0) )
        {
        angle = ( tan_in * 48.75 );  /* Gross angle approximation. */
        }
if ( (fabs(tan_in) > 1.4828) )
        {
        angle = ( 60.0 );
        }
if ( (fabs(tan_in) > 2.4142) )
        {
        angle = ( 72.5 );
        }
if ( (fabs(tan_in) > 4.7046) )
        {
        angle = ( 84.0 );
        }

for ( i = 0, angle_inc = 5.0; i < 50; i++, angle -= angle_inc )
        {
/*
        printf ( "ang = %f tan in = %f tan = %f\n", angle, tan_in, tan_approxima
tion );
*/
        tan_approximation = tan ( angle / RADIAN );
        difference = ( tan_approximation - tan_in );
        if ( ( angle_inc == 0.0 ) )
                {
                break;
```

```
                }
        if ( ( tan_approximation < tan_in ) && ( angle_inc >=0.0 ) )
                {
                angle_inc = ( -angle_inc );
                }
        if ( ( tan_approximation > tan_in ) && ( angle_inc <=0.0 ) )
                {
                angle_inc = ( -angle_inc );
                }
        if ( fabs( difference ) < 0.000001 )
                {
                break;
                }
        angle_inc /= 1.5;
        }
/*
        printf ( "ang = %f tan in = %f tan = %f\n", angle, tan_in, tan_approxima
tion );
printf ( "------------------------------ \n" );
        printf ( "   ang = %f    iter = %d\n",  angle, i );
*/
angle = ( angle * tan_sign );
return ( angle );
}
/************************
* cos_2_deg.
*
*       Find ( 0 to 45 deg ) angle given cosine using gross approximation
*       followed by sucessive approximation.
*
************************/
double  cos_2_deg( cos_in )

        double  cos_in;
{
        int     i;
        double  angle;              /* Result in degrees. */
        double  angle_inc;          /* Angle increment value. */
        double  difference;
        double  cos_approximation;

/*
printf ( "ang = %f cos in = %2.9f cos = %f\n", angle, cos_in, cos_approximation );
*/

if ( cos_in > 0.70711 )
        {
        angle = ( ( 1 - cos_in ) * 105.00 );   /* Gross angle approximation. */
        }
else
        {
        angle = ( ( 1 - cos_in ) * 190.00 );   /* Gross angle approximation. */
        }

if ( angle < 0.0 )
        {
        angle = 8.0;
        }

for ( i = 0, angle_inc = 7.0; i < 50; i++, angle -= angle_inc )
        {

        if ( angle < 0.0 )
```

```
                {
                angle = ( -angle );
                }
/*
        printf ( "ang = %f cos in = %2.9f cos = %f\n", angle, cos_in, cos_approx
imation );
*/
        cos_approximation = cos ( angle / RADIAN );
        difference = ( cos_approximation - cos_in );
        if ( ( angle_inc == 0.0 ) )
                {
                break;
                }
        if ( ( cos_approximation > cos_in ) && ( angle_inc >=0.0 ) )
                {
                angle_inc = ( -angle_inc );
                }
        if ( ( cos_approximation < cos_in ) && ( angle_inc <=0.0 ) )
                {
                angle_inc = ( -angle_inc );
                }
        if ( fabs( difference ) < 0.000001 )
                {
                break;
                }
        angle_inc /= 1.5;
        }
/*
        print  ( "ang = %f cos in = %2.9f cos = %f\n", angle, cos_in, cos_approx
imation );
printf ( "------------------------------ \n" );
        printf ( "   ang = %f    iter = %d\n",  angle, i );
*/
return ( angle );
}
/*************************
* sin_2_deg.
*
*       Find ( 0 to 45 deg ) angle given sine using gross approximation
*       followed by sucessive approximation.
*
*************************/
double  sin_2_deg( sin_in )

        double  sin_in;
{
        int     i;
        double  angle;              /* Result in degress. */
        double  angle_inc;          /* Angle increment value. */
        double  difference;
        double  sin_approximation;


/*
printf ( "ang = %f sin in = %f sin = %f\n", angle, sin_in, sin_approximation );
*/

if ( sin_in < 0.70711 )
        {
        angle = ( sin_in * 55.00 );  /* Gross angle approximation. */
        }
else
```

```
        {
        angle = ( sin_in * 80.00 );  /* Gross angle approximation. */
        }


for ( i = 0, angle_inc = 10.0; i < 50; i++, angle -= angle_inc )
        {
/*
        printf ( "ang = %f sin in = %f sin = %f\n", angle, sin_in, sin_approxima
tion );
*/
        sin_approximation = sin ( angle / RADIAN );
        difference = ( sin_approximation - sin_in );
        if ( ( angle_inc == 0.0 ) )
                {
                break;
                }
        if ( ( sin_approximation < sin_in ) && ( angle_inc >=0.0 ) )
                {
                angle_inc = ( -angle_inc );
                }
        if ( ( sin_approximation > sin_in ) && ( angle_inc <=0.0 ) )
                {
                angle_inc = ( -angle_inc );
                }
        if ( fabs( difference ) < 0.000001 )
                {
                break;
                }
        angle_inc /= 1.5;
        }
/*
        printf ( "ang = %f sin in = %f sin = %f\n", angle, sin_in, sin_approxima
tion );
printf ( "------------------------------ \n" );
        printf ( "   ang = %f    iter = %d\n",  angle, i );
*/
return ( angle );
}
*************************
* rt_solve
*       Solve a right triangle
*        given the two sides 'a' & 'b'.
*   OR
*        given side 'a' & acute angle 'A'.
*   OR
*        given side 'b' & acute angle 'A'.
*   OR
*        given side 'c' & acute angle 'A'.
*
*  RETURNS : the hypotenuse.
*
*************************/
double    rt_solve ( p_rt )

        t_angle   *p_rt;    /* -> Struct of angles & sides of a right triangle. *
/
{
        double    sin(),    cos(),    sqrt(),   pow(), tan_2_ang();

        double    sqrA, sqrB;
```

```
/*
sho_trig( p_rt, 0 );
*/

if (( p_rt->SIDE_A == 0.0 ) && ( p_rt->HYPOTENUSE != 0.0 ))
        {
                /* ***** a = c * sin A ***** */
                /* ***** b = c * cos A ***** */
        p_rt->SIDE_A = ( p_rt->HYPOTENUSE * sin( ( p_rt->A_ACUTE / RADIAN )));
        p_rt->SIDE_B = ( p_rt->HYPOTENUSE * cos( ( p_rt->A_ACUTE / RADIAN )));
        }
else if (( p_rt->SIDE_B != 0.0 ) && ( p_rt->A_ACUTE != 0.0 ))
        {
                /* ***** a = b * tan A ***** */
                /* ***** c = root-sum-square ***** */
        p_rt->SIDE_A = ( p_rt->SIDE_B * tan ( ( p_rt->A_ACUTE / RADIAN )));
        sqrA = pow( p_rt->SIDE_A, 2.0);
        sqrB = pow( p_rt->SIDE_B, 2.0);
        p_rt->HYPOTENUSE = sqrt ( ( sqrA + sqrB ) );
        }
else if (( p_rt->SIDE_A != 0.0 ) && ( p_rt->SIDE_B != 0.0 ))
        {
        sqrA = pow( p_rt->SIDE_A, 2.0);
        sqrB = pow( p_rt->SIDE_B, 2.0);
        p_rt->HYPOTENUSE = sqrt ( ( sqrA + sqrB ) );

        p_rt->A_ACUTE = ( p_rt->SIDE_A / p_rt->SIDE_B );          /* take tangen
t */
        p_rt->A_ACUTE = tan_2_ang ( p_rt->SIDE_B, p_rt->SIDE_A );          /* ta
n to degrees */
        }
else
        {
                /* ***** c = a / sin A ***** */
                /* ***** b = c * cos A ***** */
        p_rt->HYPOTENUSE = ( p_rt->SIDE_A / sin( ( p_rt->A_ACUTE / RADIAN )));
        p_rt->SIDE_B = ( p_rt->HYPOTENUSE * cos( ( p_rt->A_ACUTE / RADIAN )));
        }

p_rt->A_OBTUSE = ( 90.0 - p_rt->A_ACUTE );


/*
sho_trig( p_rt, 0 );
*/

return( p_rt->HYPOTENUSE );
}
/**********************
* at_solve
*
*       Solve an equilateral triangle given angle 'C' & side 'c' OR 3 sides.
*
*               RETURNS : side 'a'.
*
**********************/
double  at_solve ( p_at )

        at_angle *p_at;     /* -> Struct of angles & sides of a right triangle. *
/
{
        double  sin();
```

```
        double    sinA, sinB, sinC;
        double    sqrA, sqrB, sqrC;

if ( ( p_et->SIDE_A != 0 ) && ( p_et->SIDE_B != 0 ) && ( p_et->SIDE_C != 0 ) )
        {
        sqrA = pow( p_et->SIDE_A, 2.0 );

                /* ***** LAW OF COSINES. ***** */
        p_et->ANGLE_A = (
                                p_et->SIDE_B / ( 2.0 * p_et->SIDE_C ))
                                +
                              ( p_et->SIDE_C / ( 2.0 * p_et->SIDE_B ))
                                -
                              ( sqrA / ( 2.0 * p_et->SIDE_B * p_et->SIDE_C ))
                             );
        p_et->ANGLE_A = cos_2_deg ( fabs ( p_et->ANGLE_A ) );

        p_et->ANGLE_C = (
                              ( p_et->SIDE_A / ( 2.0 * p_et->SIDE_B ))
                              ( p_et->SIDE_B / ( 2.0 * p_et->SIDE_A ))
                                -
                              ( sqrC / ( 2.0 * p_et->SIDE_A * p_et->SIDE_B
                             );
        p_et->ANGLE_C = cos_2_deg ( fabs ( p_et->ANGLE_C ) );

        p_et->ANGLE_B = p_et->ANGLE_A;
/*
        p_et->ANGLE_C = ( 120.0 - ( p_et->ANGLE_A + p_et->ANGLE_B ) );
*/
        }
else
        {
        p_et->ANGLE_B = ( ( 180 - p_et->ANGLE_C ) / 2 );
        p_et->ANGLE_A = p_et->ANGLE_B;

        sinA = sin( p_et->ANGLE_A / RADIAN );
        sinB = sin( p_et->ANGLE_B / RADIAN );
        sinC = sin( p_et->ANGLE_C / RADIAN );
        p_et->SIDE_A = (( p_et->SIDE_C * sinA ) / sinC );        /* Law of sine
s. */
        p_et->SIDE_B = p_et->SIDE_A;
        }
/*
sho_trig( 0, p_et );
*/
return( p_et->SIDE_A );
}
/************************
* ot_solve '
*
*       Solve an oblique triangle given angles 'A' & 'B' ; & side 'a' or 'c'.
*       OR                              given angle  'C'       ; & side 'a' and '
b'.
*
*               RETURNS : side 'c'.
*
************************/
double    ot_solve ( p_et )

        et_angle *p_et;     /* -> Struct of angles & sides of a right triangle. *
/
```

```
{
        double    sin(),    cos(),    sqrt(),   pow();
        double    sin_2_deg(), cos_2_deg(), tan_2_ang();

        double    sinA, sinB, sinC;
        double    cosA, cosB, cosC;
        double    sqrA, sqrB, sqrC;


if (( p_et->ANGLE_C == 0.0 ) && ( p_et->ANGLE_A != 0.0 ) && ( p_et->ANGLE_B != 0.0
))
        {
        p_et->ANGLE_C = ( 180 - ( p_et->ANGLE_A + p_et->ANGLE_B ) );

        sinA = sin( p_et->ANGLE_A / RADIAN );
        sinB = sin( p_et->ANGLE_B / RADIAN );
        sinC = sin( p_et->ANGLE_C / RADIAN );
                /* ***** LAW OF SINES. *****
        if ( p_et->SIDE_B == 0 )
                {
                p_et->SIDE_C = (( p_et->SIDE_A * sinC ) / sinA );
                p_et->SIDE_B = (( p_et->SIDE_A * sinB ) / sinA );
                }
        else if ( p_et->SIDE_A == 0 )
                {
                p_et->SIDE_C = (( p_et->SIDE_B * sinC ) / sinB );
                p_et->SIDE_A = (( p_et->SIDE_B * sinA ) / sinB );
                }
        }

else
/*
if ( ( p_et->SIDE_A != 0 ) && ( p_et->SIDE_B != 0 ) && ( p_et->ANGLE_C != 0
*/
        {
        cosC = cos( p_et->ANGLE_C / RADIAN );
        sinC = sin( p_et->ANGLE_C / RADIAN );

        sqrA = pow( p_et->SIDE_A, 2.0);
        sqrB = pow( p_et->SIDE_B, 2.0);


                /* ***** LAW OF COSINES. ***** */
        p_et->SIDE_C = (
                        sqrt    (
                                sqrA + sqrB

                                ( 2.0 * p_et->SIDE_A * p_et->SIDE_B * cosC
)

                                )
                        );


                /* ***** LAW OF SINES. ***** */
        p_et->ANGLE_A =     ( ( p_et->SIDE_A * sinC ) / p_et->SIDE_C );
        p_et->ANGLE_A = sin_2_deg ( fabs ( p_et->ANGLE_A ) );

        p_et->ANGLE_B =     ( ( p_et->SIDE_B * sinC ) / p_et->SIDE_C );
        p_et->ANGLE_B = sin_2_deg ( fabs ( p_et->ANGLE_B ) );
/*
printf ( "-- COSINE METHOD ------------- \n" );
```

```
        sqrC = pow( p_et->SIDE_C, 2.0);
        p_et->ANGLE_A =     (
                            ( p_et->SIDE_B / ( 2.0 * p_et->SIDE_C ))
                                    +
                            ( p_et->SIDE_C / ( 2.0 * p_et->SIDE_B ))
                                    -
                            ( sqrA / ( 2.0 * p_et->SIDE_B * p_et->SIDE_C ))
                            );
        p_et->ANGLE_A = cos_2_deg ( fabs ( p_et->ANGLE_A ) );

        p_et->ANGLE_B = (
                            ( p_et->SIDE_A / ( 2.0 * p_et->SIDE_C ))
                                    +
                            ( p_et->SIDE_C / ( 2.0 * p_et->SIDE_A ))
                            ( sqrB / ( 2.0 * p    ->SIDE_A * p_et->SIDE_C ))
                            );
        p_et->ANGLE_B = cos_2_deg ( fabs ( p_et->ANGLE_B ) );
        }
*/
        }


/*
sho_trig( 0, p_et );
*/

return( p_et->SIDE_C );
}
/*****************************************************************
* glo.def                                                  21 Nov. 87
*
* MPM GLOBAL variables, definitions & structures.
*
*****************************************************************/



/*
------------------------
 GLOBAL FLAGS & COUNTERS
------------------------
*/
typedef struct
{
        /* MAJOR MODE FLAGS */
enum mode_of_operation              op_mode;  /* ... see gp.def ... */
enum mode_of_debug          debug_mode;       /* ... see gp.def ... */

        /* REPORTING MODE FLAGS */
enum mode_of_reporting              rep_mode; /* = QUIET, TERSE, VERBOSE */
enum mode_of_reporting              rep_unit; /* Unit of measure. */
enum mode_of_reporting              rep_default;

        /* STEPPER MOTOR MODE FLAGS */
enum mode_backlash          back_mode;        /* = NONE, SINGLE, OVERLAPPED */
enum mode_motion            motion_mode;      /* = SINGLE, OVERLAPPED */

        /* STEPPER MOTOR MODE SAVE LOCATIONS */
enum mode_backlash          back_save;
enum mode_motion            motion_save;

/* ------------------------------------------------------- */
```

```
        /* OPERATOR ATTENTION FLAG */
int     panic_button;       /* FLAG - video attention signal */

        /* OPERATOR MALFUNCTION FLAGS */
int     not_auto; /* User failed to select auto mode. */

        /* USER DEFINED OFFSETS */
int     xoff, yoff, toff;   /* Offsets in motor steps */

        /* MOTOR LIMIT FLAG */
int     motor_limit;

   /* MESSAGE BUFFERS : POINTERS */
   /* ---------------|--------- */
char    mess[80], *p_mess;  /* General Purpose. */
char    error_mess[80],     *p_emess; /* ERROR. */


}  global_parameters;

        global_parameters global_parms, *p_glo;



        /* ****************************************
           ********** MODE ESCAPE MACROS **********
           *  ********************************  *** */
#define FORCE_  IT_TEST {                                   \
                            test_attention();               \
                            if( p_glo->op_mode >= EXIT_MODE ) { break;
                            }
#define PROG_EXIT_TEST  {                                   \
                            test_attention();               \
                            if( p_glo->op_mode >= MODE_EXIT ) { break; }
                            }
#define PRINT_FAIL_TEST  {                                  \
                            test_attention();               \
                            if( p_glo->op_mode == FAIL_PRINT ) { break; }
                            }
        /* ************************************** */
        /* ************************************** */
/*****************************************************************
* gp.def                                                  27 Jan. 89
*
* MPM GLOBAL variables, definitions & structures.
*
*****************************************************************/

#define   OFF                 0
#define   ON                  1

typedef   unsigned char       u_char;
typedef   unsigned int        u_int;

#define   CAMERA_1  1
#define   CAMERA_2  2
#define   SPLIT_OFF 0
#define SPLIT_ON    200
#define   IMAGE_POSITIVE      TRUE
#define   IMAGE_NEGATIVE      FALSE

/*
----------------------
```

```
 CCC SOFTWARE REVISION
----------------------
*/
                                float     ccc_rev_num = 2.99999;
                                float     cog_rev_num = 1.1;
/*
----------------------
 HARDWARE OPTIONS.
----------------------
*/

int       option_indexer_ready = TRUE; /* Indexer Ready board & cables */


/*
----------------------
 MISC.
----------------------
*/

int       xyt_ready = FALSE; /* X, Y, Theta indexer ready flag. */
int       panic_button;      /* FLAG - video attention signal */
int       PANIC;             /* Panic flag - used for subroutine repeat mode */

int       limit_recovery;    /* Limit switch recovery flag. */
int       align_ok_state;    /* State of the pin 52 signal - 100 ms pulse */

FILE      *fp_comm3 = 0;     /* Comm channel 3 for MPM ASP-24. */

struct sgttyb      rs232_3; /* Terminal control struct for comm channel 3 */
struct sgttyb      *p_rs232_3 = 0;    /*  -> Terminal control struct for comm 3 *
/

enum      trg_polarity
                  {
                  RISING_EDGE  = 1,
                  FALLING_EDGE = 0,
                  };
cfifo_buffer *   n_1_fifo = 0;        /*  -> #1   put fifo */
cfifo_buffer *p_in_2_fifo = 0;        /*  -> #2
cfifo_buffer *p_in_3_fifo = 0;        /*  -> #3 */
cfifo_buffer *p_in_4_fifo = 0;        /*  -> #4 */
cfifo_buffer *p_in_5_fifo = 0;        /*  -> #5 */
cfifo_buffer *p_in_6_fifo = 0;        /*  -> #6 */


/* PARALLEL INPUT FIFO DUMP UTILITIES */

#define   dump1     cfifo_dump ( p_in_1_fifo );
#define   dump2     cfifo_dump ( p_in_2_fifo );
#define   dump3     cfifo_dump ( p_in_3_fifo );
#define   dump4     cfifo_dump ( p_in_4_fifo );
#define   dump5     cfifo_dump ( p_in_5_fifo );
#define   dump6     cfifo_dump ( p_in_6_fifo );

/*
-------------------
 TIMER DEFINITIONS
-------------------
*/
ctm_timer bug_timer;
ctm_timer *p_bug_timer = &bug_timer;
```

```
/*
-----------------------------------
 IMAGE, BUFFER & WINDOW DEFINITIONS
-----------------------------------
*/
ccal_video_params *vidcal_parms = &ccal_default_ago;

cip_buffer          *gp_image = 0;              /* General Purpose image buffer.
/
cip_buffer          *temp_image = 0;   /* Window within gp_image. */


typedef struct
         {
         int       x_percent;          /* X to scale by */
         int       y_percent;
         int       x_size;             /* Original size */
         int       y_size;
         double    fx_percent;         /* Float X to scale by */
         double    fy_percent;
         double    fx_size;  /* Float original size */
         double    fy_size;
         int       x_new;              /* Results */
         int       y_new;
         }
          scale_parameters;

/*
--------------------------
 GAIN & OFFSET DEFINITIONS
--------------------------
*/
u_char    def_gain = 75;      /* gainoff defaults */
u_char    def_off    = 7;
u_char    gain       = 75;    /* gainoff for camr   # 1 */
u_char    off_       = 7;

u_char    gain_2     = 75;    /* gainoff for camera # 2 */
u_char    off_2      = 7;

/* ------------------ */

         u_char    new_off = 45;
         u_char    new_gain = 75;

         u_char    off_save2;
         u_char    gain_save2;

         u_char    new_off2 = 45;
         u_char    new_gain2 = 75;


/*
-------------------------
 ERROR SIGNAL DEFINITIONS
-------------------------
         NOTE : Group # is multiplied by 10,000 then error # is added.
*/
typedef   enum
         {
         MENU_ERR_GRP = 101,/* First non-Cognex signal group. */
         UTIL_ERR_GRP,
```

```
        GEO_ERR_GRP,
        IO_ERR_GRP,
        SEAR_ERR_GRP,
        TRAN_ERR_GRP,
        }
          user_signal_groups;

typedef   enum
          {
          MENU_ERR    =       CCT_SIG ( MENU_ERR_GRP, 0 ) ,
                    MENU_ERR_DIAGNOSTIC,
                    MENU_ERR_PRTIMEOUT,

          UTIL_ERR    =       CCT_SIG ( UTIL_ERR_GRP, 0 ) ,
                    UTIL_ERR_GAINOFF,
                    UTIL_ERR_OPTION,

          GEO_ERR     =       CCT_SIG ( GEO_ERR_GRP, 0 ) ,
                    GEO_ERR_BADARG,
                    GEO_ERR_NOTFOUND,
                    GEO_ERR_BADMOTOR,   /* no motion when euxpected */
                    GEO_ERR_BADPROBE,
                    GEO_ERR_BACKLASH,
                    GEO_ERR_WRONGPROBE,

          IO_ERR        =     CCT_SIG (   IO_ERR_GRP, 0 ) ,
                    IO_ERR_MTRTIMEOUT,
                    IO_ERR_ATTENTION,   /* ** RECOVERABLE - NOT AN ERROR ** */

          SEAR_ERR =          CCT_SIG ( SEAR_ERR_GRP, 0 ) ,
                    SEAR_ERR_BADARG,
                    SEAR_ERR_BADMODEL,
                    SEAR_ERR_BADSCORE,
                    SEAR_ERR_BADCONTRAST,
                    SEAR_ERR_NOTFOUND,
                    SEAR_ERR_NOOBJECT,
          TRAN_ERR =          CCT_SIG ( TRAN_ERR_GRP, 0 ) ,
                    TRAN_ERR_BADARG,
                    TRAN_ERR_BADMODEL,
                    TRAN_ERR_INCONSISTENT,
                    TRAN_ERR_BADSCORE,
                    TRAN_ERR_BADCONTRAST,
                    TRAN_ERR_NOTFOUND,
                    TRAN_ERR_NOOBJECT,

          }
            user_signal;

/*
-----------------
 MODE DEFINITIONS
-----------------
*/

          enum      mode_of_search
                          {
                    /* Modes for model search */
                          SEA_BHOME,
                          SEA_SHOME,
                          SEA_CURR1,
                          SEA_CURR2,
                          };
```

```
        enum      mode_of_debug
                        {
                    /* Modes for debugging. */
                          DBG_NORMAL,
                          DBG_NO_PRINTER,
                          DBG_SCREEN,
                          DBG_CORRELATE,
                          };
enum  mode_of_debug  debug_mode;       /* Global debug mode flag */

        enum      mode_of_reporting
                        {
                    /* Modes for reporting diagnostic messages to the PC. *
                          MODE_QUIET,
                          MODE_TERSE,
                          MODE_VERBOSE,

                          MODE_INCHES,
                          MODE_MILS,
                          MODE_CENTIMETERS,
                          MODE_MICRONS,
                          };

enum  mode_of_reporting  rep_mode;     /* Global reporting mode flag */
enum  mode_of_reporting  rep_default;  /* DEFAULT reporting mode */
enum  mode_of_reporting  rep_unit;     /* Unit of measure for reporting. */
        enum      mode_of_operation
                          {
                          MODE_MAIN_MENU,
                          MODE_GEOM,
                                   /* Subroutine modes. */
                          MODE_TEACH,
                          MODE_EDIT,
                          MODE_PRINT,
                          MODE_MAINTAIN,
                          MODE_CLEAN,
                          MODE_HELP,
                                   /* Subroutine repeat modes. */
                          MODE_REPEAT,
                                   /* Subroutine exit modes. */
                          EXIT_MODE,
                          EXIT_TEACH,
                          EXIT_EDIT,
                          EXIT_PRINT,
                                   /* Program exit modes. */
                          MODE_EXIT,
                          MODE_SAVE,
                          };
enum  mode_of_operation  op_mode, op_mode_save; /* Global mode flag */


        /* ************************************** */
        /* ************************************** */
#define FORCE_EXIT_TEST {                                    \
                          test_attention();                  \
                          if( op_mode >= EXIT_MODE ) { break; } \
                          }
#define PROG_EXIT_TEST  {                                    \
                          test_attention();                  \
                          if( op_mode >= MODE_EXIT ) { break; } \
                          }
        /* ************************************** */
```

```
        /* The following are used in the format :    */
        /*                                           */
        /* void subr()                               */
        /* {                                         */
        /* FORCE_RESTORE                             */
        /* while ( TRUE )                            */
        /*         {                                 */
        /*           .............                   */
        /*           .............                   */
        /*           FORCE_REPEAT                    */
        /*           .............                   */
        /*           .............                   */
        /*           .............                   */
        /*           FORCE_REPEAT                    */
        /*         }                                 */
        /* }                                         */
        /* ***************************************** */
#define FORCE_RESTORE           {                                   \
                                if( op_mode == MODE_REPEAT )        \
                                        {                           \
                                        op_mode = op_mode_save;     \
                                        break;                      \
                                        }                           \
                                }
#define FORCE_   'EAT           {
                                if( op_mode == MODE_REPEAT )        \
                                        {                           \
                                        op_mode_save = op_mode;     \
                                        break;                      \
                                        }                           \
                                }
        /* ***************************************** */
        /* ***************************************** */


        enum    mode_motion
                                {
                                MODE_STATIC         = 0x1,
                                MODE_CALIBRATE      = 0x2,
                                MODE_X              = 0x4,
                                MODE_Y              = 0x8,
                                MODE_THETA          = 0x10,
                                };

enum  mode_motion motion_mode;          /* Global motor motion flag */


/*
-----------------
 MENU DEFINITIONS
-----------------
*/

typedef struct
        {
        int     x0;
        int     y0;
        char    text[80];
        }
         menu_text;
```

```
typedef struct
        {
        cgr_screen          *screen;  /*  -> cgr_screen. */
        cip_buffer          *image;             /*  -> cip_buffer. */
        cip_buffer          **p_image;          /*  -> -> cip_buffer. */
        int                 x1,       y1;       /* X & Y size */
        int                 x_offset; /* Offset of menu within screen. */
        int                 y_offset;
        int                 cursorx;  /* Default cursor location. */
        int                 cursory;
        int                 box_color;
        int                 border_color;
        int                 flags;
        char                text[32]; /* Title text */
        menu_text *line1, *line2, *line3, *line4, *line5;
        }
         menu_parameters;

typedef struct
        {
        int       x0;
        int       y0;
        int       box_color;
        int       border_color;
        int       flags;
        char      text[32];
        }
         menu_selection;

/*
------------------------
 MATHEMATICS DEFINITIONS
------------------------
*/

double RADIAN = 57.2957795131;

#define   ROUNDUP   0.5

/*
        RIGHT TRIANGLE STRUCTURE

        .
        ..
        . .
        .  .
        . a .
        .    .
        .     .
    b   .      .  c
        .         .
        .          .
        .           .
        . R       B  .
        . . . . . . .
       .
              a
*/

typedef struct
        {
        double    SIDE_A;             /* a - short side */
        double    SIDE_B;             /* b - long side  */
```

```
        double    HYPOTENUSE;          /* c - hypotenuse */

        double    A_ACUTE;  /* x - the acute angle  */
        double    A_OBTUSE; /* B - the obtuse angle */
        double    A_RIGHT;  /* R - the right angle  */
        } t_angle;

t_angle    rt_0,   rt_1,   rt_2,   rt_3;

t_angle  *p_rt = 0;
t_angle  *p_rt0 = 0, *p_rt1 = 0, *p_rt2 = 0, *p_rt3 = 0;

/*
        EQUILATERAL & OBLIQUE TRIANGLE STRUCTURE

                                                c sinA        b sinA
                                        a =  ------  =  ------
                                                sinC          sinB
                                                a sinB        c sinB
                                        b =  ------  =  ------
                                                sinA          sinC
                                                a sinC        c sinB
                                        c =  ------  =  ------
                                                sinA          sinC

        b                a

        A                C

                c
*/

typedef struct
        {
        double    SIDE_A;              /* a - odd side */
        double    SIDE_B;              /* b - equal side  */
        double    SIDE_C;              /* c - equal side */

        double    ANGLE_A;  /* A - odd angle  */
        double    ANGLE_B;  /* B - equal angle */
        double    ANGLE_C;  /* C - equal angle  */
        } et_angle;

et_angle    et_0,   et_1,   et_2;
et_angle  *p_et0 = 0, *p_et1 = 0, *p_et2 = 0;

/*
--------------------------------
 GEO.V - MATHEMATICS DEFINITIONS
--------------------------------
*/

        short     mode_scale;          /* Mode of scale correction */


typedef struct
        {
        double    x,  y;
        }
         factor;  /* X,Y FACTORS or COEFICIENTS */

typedef struct
```

```
        {
        double    n,  p;
        }
         cross_factor;      /* Natural,Prime FACTORS or COEFICIENTS */


typedef struct
        {
        double    x,  y;
        }
         coord;             /* X,Y COORDINATES ( one set ) */

typedef struct
        {
        coord     p1,  p2;
        }
         point_pair;        /* A PAIR OF X,Y COORDINATES */


typedef struct
 {
  point_pair        natural;  /* 2 points in 1st ( N ) coord syst */
  point_pair        prime;              /* 2 points in 2nd ( P ) coord syst */

  point_pair        deskew;             /* 2 pts theta & offset corrected \
                                           from one coordinate system to the other
*/

  point_pair        result;             /* 2 pts scale offset & theta corrected\
                                           from one coordinate system to the other
*/

  factor  dif_n;              /* Differences of ( N ) naturals */
  factor  dif_p;              /* Differences of ( P ) primes */

  factor  scale;              /* Scale factors ( X,Y ) */
  double  scale_d;  /* Scale factor  ( diagonal ) */

  cross_factor      theta;              /* Theta of points ( N,P ) */
  cross_factor      radius;             /* Radii of points ( N,P ) */
  cross_factor      slope;              /* Slopes of line segments ( N,P ) */
  double  theta_dif /* Angular diff between N & P */

  }
    pseudo_parms;   /* PSEUDO-INVERSE MATH PARAMETERS */


typedef struct
        {
         short     p_count;  /* # of point pairs added */
         int       quad_num; /* Quadrant # */

                             /* Coordinates of points & their primes */
         double    x1,  x2;
         double    y1,  y2;

         double    xp1, xp2;
         double    yp1, yp2;

                             /* Coords of 2 points corrected for theta */
         double    deskew_x1,  deskew_x2;
```

```
        double    deskew_y1,  deskew_y2;

                            /* Difs of coords */
        double    dif_x;              /* x  */
        double    dif_y;              /* y  */

        double    dif_xp;             /* x' */
        double    dif_yp;             /* y' */

                            /* Scale coefficients */
        double    scale;
        double    scale_x;
        double    scale_y;
                            /* Slopes of 2 lin   sgments */
        double    slope_p;  /* x'y', x'y' */
        double    slope_n;  /*  xy,   xy  */

                            /* Slopes of prime & natural points */
        double    theta_n;  /*  xy */
        double    theta_p;  /*  x'y' */
        double    theta_only;         /*  position of prime if theta error only *
/
        double    radius_n; /*  xy */
        double    radius_p; /*  x'y' */

        double    theta;    /* Angle between the 2 line segments */
        double    hypot;
                            /* Coordinates before & after fwd or rev */
        double    old_x;              /* x */
        double    old_y;              /* y */
        double    new_x;              /* x */
        double    new_y;              /* y */
                            /* X & Y offsets exclusive of angle */
        double    offs_x;
        double    offs_y;
                            /* Scale corrected offsets */
        double    coffs_x;
        double    coffs_y;

        } psc_geom;

psc_geom       pseudo;,                 /* General purpose geometry structure */
psc_geom    *p_pseudo = 0;
psc_geom       asp_geom;        /* Geometry for theta center& probes */
psc_geom    *p_asp_geom = 0;

/*
---------------------
 GRAPHICS DEFINITIONS
---------------------
*/
        enum      color
                            {
                            NO_OP = -1,                /* no change */
                            PASS  = CAG_PASS,
                            BLACK = CAG_BLACK,
                            WHITE = CAG_WHITE,
                            BLINK = CAG_BLINK,
                            };

/*
-----------------------
```

```
 TRACKBALL DECLARATIONS
------------------------
*/

short     pdx;              /*     Trackball current X value */
short     pdy;              /*     Trackball current Y value */
short     *pdp_x = 0;       /*  -  Trackball current X */
short     *pdp_y = 0;       /*  -  Trackball current Y */

short        pd_key;        /*     Trackball current key */
short     *p_pd_key = 0;    /*  -> Trackball current key */

/*
------------------
 ERROR DEFINITIONS
------------------
*/

char      error_mess[80];              /* ERROR message buffer. */
/*****************************************************************
* io.v                                                          09 Jan. 89
*
* MPM utility functions.
*
*****************************************************************/



/*************************
* comm_init
*
* Init comm channels.
*************************/

void comm_init()
{
/*
          ---------
           PD INIT - Open trackball comm port.
          ---------
*/
if ( cif_tb_file )
         {
         fclose ( cif_tb_file );
         }
cif_tb_file = cif_open_tb ( "/dev/ser2" );

/*
          -------------
           COMM 3 INIT
          -------------
*/

if ( fp_comm3 )
         {
         fclose ( fp_comm3 );
         }
fp_comm3 = fopen ( "/dev/ser3","w" );

p_rs232_3 = &rs232_3;

p_rs232_3 -> sg_flags        |= RAW ;  /* Serial I/O mode flags */
```

```
p_rs232_3 -> sg_ispeed        = B1200 ;
p_rs232_3 -> sg_ospeed        = B1200 ;
p_rs232_3 -> sg_erase         = 0177 ;  /* Delete */
p_rs232_3 -> sg_kill          = 025 ;            /* CTRL-U */

cio_stty ( fp_comm3, p_rs232_3 );                /* Set comm 3 terminal control sta
te */

setbuf ( fp_comm3, NULL );             /* Set unbuffered input */
/*
for ( i = 300000; i > 0; i-- ) { ; }
*/
}
/*************************
* init_indexer
*
*       Init stepper motor indexer.
**************************/
void init_inde    ( motor )

   axis_parms  *motor;        /*  -> Stepper motor parms. */
{
   char   motor_mess[30];
                    /* ***** 1 2 D3 F4 V5 T6 C7 / ***** */
sprintf( motor_mess,          "%s%sD%sF%sV%sT%sC%s/",

         motor->motor,        motor->mode,        /*  1,    2, */
         motor->distance,     /*  D, 3, */
         motor->start_stop,   /*  F, 4, */
         motor->velocity,     /*  V, 5, */
         motor->ramp,                 /*  T, 6, */
         motor->cycles                /*  C, 7, */
                                                        /*     /      */
       );

printf( "\n%s\n", motor_mess );
fputs( motor_mess, fp_comm3 );
}
/*************************
* motor_init
*
*        Init 1 stepper motor.
*
**************************/
void motor_init( motor )

   axis_parms *motor; /*  -> Stepper motor parms. */
{
   void   init_indexer(), rev_direction();
   void   slew_limit(), step_limit(), find_limit();

init_indexer        ( motor );          /* Initialize stepper motor indexer. */

                                  /* Find first limit. */
slew_limit          ( motor );          /* Go to limit switch at high speed. */
rev_direction       ( motor );          /* Reverse motor direction. */
step_limit          ( motor );          /* Single-step until limit switch opens. */

find_limit          ( motor );  /* Find other limit. */
}
/*************************
* step_init
```

```
*
*        Init stepper motors.
*
* NOTE :
*        X        '-' => left        '+' => right       default = '-'
*
*        Y        '-' => forward     '+' => back        default = '+'
*
*        Theta    '-' => CCW         '+' => CW default = '-'
*
*************************/
void step_init( )
{
         void     menu_tiny(),       diag_halt(),       soft_delay();
         void     init_indexer(), motor_init();
         void     stepper(),         rev_direction();
         void     slew_limit(),      step_limit         find_limit();

   int    i;
   char    mess[80];
   int     x_step_count,  y_step_count,  t_step_count;

u_mess ( PASS,
"INITIALIZING ALIGNMENT SYSTEM");
printf (" ------------------------------------------------------------------\n" ;



limit_recovery == OFF;

/* - X AXIS ------------------------- */
strcpy( p_x_axis->direction, "-" );
/*
motor_init ( p_x_axis );    limit_recovery == OFF;
*/
init_indexer        ( p_x_axis );       /* Initialize stepper motor indexer. */
sprintf ( mess, "/S/%sI/", p_x_axis->motor );
fputs ( mess, fp_comm3 );
soft_delay();
p_x_axis->limit = 0;

/* - Y AXIS ------------------------- */
strcpy( p_y_axis->direction, "+" );
/*
motor_init ( p_y_axis );     limit_recovery == OFF;
*/
init_indexer        ( p_y_axis );       /* Initialize stepper motor indexer. */
sprintf ( mess, "/S/%sI/", p_y_axis->motor );
fputs ( mess, fp_comm3 );
soft_delay();
p_y_axis->limit = 0;

/* - THETA ------------------------- */
strcpy( p_t_axis->direction, "-" );
/*
motor_init ( p_t_axis );     limit_recovery == OFF;
*/
init_indexer        ( p_t_axis );       /* Initialize stepper motor indexer. */
sprintf ( mess, "/S/%sI/", p_t_axis->motor );
fputs ( mess, fp_comm3 );
soft_delay();
p_t_axis->limit = 0;
/* ---------------------------------- */
```

```
printf ( "   X step count = %d\n", p_x_axis->step_delta );
printf ( "   Y step count = %d\n", p_y_axis->step_delta );
printf ( "   T step count = %d\n", p_t_axis->step_delta );

/*
stepper   ( p_x_axis, -(p_x_axis->home), 100000 );
stepper   ( p_y_axis,  (p_y_axis->home), 100000 );
stepper   ( p_t_axis, -(p_t_axis->home), 100000 );
*/

printf ("----------------------------------------------------------------\n");
/*
diag_halt();
*/                  /* DIAGNOSTIC HALT */
}
/*************************
* comp_backlash
*
*        Compensate for backlash in stepper motors.
*************************/
void comp_backlash( motor )

   axis_parms *motor; /*  -> Stepper motor parms. */
{
   void rev_direction(), mover();

   int i;
   double back_mils;
   char    motor_mess[80], save_distance[16];

if        ( motor == p_x_axis ) { back_mils = edit_backlash.mil.x; }
else if   ( motor == p_y_axis ) { back_mils = edit_backlash.mil.y; }
else if   ( motor == p_t_axis ) { back_mils = edit_backlash.mil.t; }

if        ( back_mils != 0.0 )
                  { i = (( back_mils / motor->mps ) + 0.5 ); }
else              { i = 0; }

strcpy ( save_distance, motor->distance );      /* Save distance */
rev_direction( motor );                                  /* Save direction */

i = abs( i );
sprintf ( motor_mess, "%d", i );
/*
printf ( "\n BACKLASH steps = %s   mils = %f  dir = %s\n", motor_mess, back_mils,
motor->direction );
*/
strcpy ( motor->distance, motor_mess );
mover ( motor );

strcpy ( motor->distance, save_distance );      /* Restore distance */
rev_direction( motor );                                  /* Restore direction */

}
/************************
* calc_delay
*
*        Calculate comm and motor delay for Sigma indexer.
*          RETURN : Delay in seconds.
*************************/
int       calc_delay( string, dist )
```

```
  char    string[], dist[];
{
  int     atoi();

  int     i;
  double  comm_delay, motor_delay, total_delay;

comm_delay  = ( strlen( string ) * 0.008 );      /* 9600 / 1200 = 8 */
motor_delay =     ( atoi( dist ) * 0.100 );      /* *** TEMP FOR TEST *** */
total_delay =  ( comm_delay + motor_delay );

return ( total_delay );
}
/*************************
* delay_calculate.
*
*.        Delay calculated from speed * distance + comm delay.
*         Delay for motor move while testing for motor limit.
*         If limit is reached, stop immediately & reset "indexing" mode.
*
*         RETURNS : FALSE if limit detected.
*
*************************/
int delay_calculate( motor )

   axis_parms      *motor;
{
  int     i;
  double  delay;

delay = calc_delay ( motor->mess, motor->distance );

motor->limit = TRUE;
while (( motor->limit == TRUE ) && ( delay < 0.0 ))
          {
          delay -= 0.0001;

          i = cio_read_in ( );
          if ( ( i & 0x4 ) == 0x4 )
                    {
                    fputs ( motor->mess, fp_comm3 );
                    motor->limit = FALSE;
                    break;
                    }
          }
return ( motor->limit );
}
/*************************
* motor_delay.
*
*         Delay for motor move while testing for motor limit.
*         If limit is reached, stop immediately & reset "indexing" mode.
*************************/
void motor_delay( motor , delay )

   axis_parms *motor; /*  -. Stepper motor parms. */
   int    delay;                 * Delay after move. */

{
   char    motor_mess[80];

   int     i, j;
```

```
        /* Setup motor halt message */
sprintf ( motor_mess, "/S/ZsI/", motor->motor );

for ( j = delay; j > 0; j-- )
        {
        i = cio_read_in ( );
        if (   i & 0x4 ) == 0x4 )
                {
                fputs ( motor_mess, fp_comm3 );
                break;
                }
        }
xyt_ready = FALSE;
}
/*************************
* motor_wait.
*
*       Wait for indexer ready signal.
*       If limit is reached, stop immediately & reset "indexing" mode.
*************************/
void motor_wait( motor , delay )

   axis_parms *motor; /*  -> Stepper motor parms. */
   int    delay;              /* Delay after move. */

{
   char    motor_mess[80];

   int     i, j;

        /* Setup motor halt message */
sprintf ( motor_mess, "/S/ZsI/", motor->motor );

while ( TRUE )
        {
        if ( ( i & 0x4 ) == 0x4 )
                {
                fputs ( motor_mess, fp_comm3 );
                break;
                }
        if ( (cio_read_in() & 0x20) != 0 )
                {
                break;
                }
        }
}
/*************************
* slew_limit.
*
*       Move until the X, Y, & Theta limit switches are reached.
*************************/
void slew_limit( motor )

   axis_parms *motor; /*  -> Stepper motor parms. */

{
   void   mover();
   char   motor_mess[80];
   int    i;

motor->limit = 0;
```

```
i = cio_read_in ( );

        /* Setup motor halt message */
sprintf ( motor.mess, "/S/%sI/", motor->motor );

mover ( motor );

while ( motor->limit  !=  motor->direction[0] )
        {
/*
        i = cio_read_in ( );
        if ( ( i & 0x4 ) == 0x4 )
                {
                fputs ( motor_mess, fp_comm3 );
                break;
                }
*/
        i = 1;    /* dummy for interrupt */
        }
fputs ( motor_mess, fp_comm3 );
}
/************************
* step_limit.
*
*       Used to loop on move one step at a time until limit switch opens.
*************************/
void step_limit( motor )

   axis_parms *motor; /*  -> Stepper motor parms. */

{
   void   mover();
   char    motor_mess[80];
   int     i;

        /* Setup motor halt message */
sprintf ( motor_mess, "/S/%sI/", motor->motor );

motor->limit = 0;

/*
i = cio_read_in ( );
*/

strcpy ( motor->distance,"1" );
while ( motor->limit  !=  motor->direction[0] )
        {
        mover ( motor );  /* Absolute move using motor data structure ONLY */
        i = cio_read_in ( );
        if ( ( i & 0x4 ) != 0x4 )
                {
                fputs ( motor_mess, fp_comm3 );
                break;
                }
        }
diag_halt();
}
/************************
* find_limit.
*
*       Loop on move. Used to move one step at a time until limit is reached.
*************************/
void find_limit( motor )
```

```
   axis_parms    tor; /*  -> Stepper motor parm   */
{
   void   mover();
   char    motor_mess[80];
   int     i;

motor->step_delta = 0;

sprintf ( motor->distance, "%d", motor- huge_step );
motor->step_delta += motor->huge_step;          /* Inc step count. */
mover ( motor );             /* Abs move using motor data struct ONLY */
/*
soft_delay();
*/
diag_halt();

strcpy ( motor->distance,"1" );


         /* Setup motor halt message */
sprintf ( motor_mess, "/S/%sI/", motor->motor );

motor->limit = 0;

i = cio_read_in ( );

while ( motor->limit  !=  motor->direction[0] )
         {
         mover ( motor );   /* Abs move using motor data struct ONLY */
         motor->step_delta++;        /* Inc step count. */
         i = cio_read_in ( );
         if ( ( i & 0x4 ) == 0x4 )
                  {
                  fputs ( motor_mess, fp_comm3 );
                  break;
                  }
         }
diag_halt();
}
/************************
* rev_direction
*
*        Reverse motor direction.
*
*************************/
void rev_direction( motor )

   axis_parms *motor; /*  -> Stepper motor parms. */
{
if ( strcmp( motor->direction, "+" ) == 0 )
         {
         strcpy( motor->direction, "-" );
         }
else     {
         strcpy( motor->direction, "+" );
         }
}
/************************
* mover
*
*      ABSOLUTE     Move stepper motor.
*
*        moves using parameters in the motor data structure.
```

```
*************************/
void mover( motor )

   axis_parms *motor; /*  -> Stepper motor parms. */

{
         char      motor_mess[80];
         int       i, r;

motor->move_mode = motor->move_default;          /* Set motor motion flag */
motion_mode = motor->move_mode;                  /* Set motor motion flag */

                   /* ***** /1 D2 3 G/ ***** */
sprintf( motor_mess,          "%sD%s%sG",

         motor->motor,       motor->distance,    /* 1, D, 2, */
         motor->direction                        /* 3  G/    */
       );

/*
         r = cio_read_in();
         r &= 0x20;
         printf(":1 %x ", r );
*/
         while( TRUE )
                   {

                   r = cio_read_in();
                   r &= 0x20;
                   if ( r != 0 ) { break; }
                   }

/*
         r = cio_read_in();
         r &= 0x20;
         printf(":2 %x ", r );
*/

fputs ( motor_mess, fp_comm3 );
/*
printf ( "%s",motor_mess );
*/



/*
         r = cio_read_in();
         r &= 0x20;
         printf(":3 %x ", r );
*/
         while( TRUE )
                   {

                   r = cio_read_in();
                   r &= 0x20;
                   if ( r == 0 ) { break; }
                   }
/*
         r = cio_read_in();
         r &= 0x20;
         printf(":4 %x ", r );
```

```
*/

/*
        r = cio_read_in();
        r &= 0x20;
        printf(":5 %x ", r );
*/
        while( TRUE )
                {

                r = cio_read_in();
                r &= 0x20;
                if ( r != 0 ) { break; }
                }
/*
        r = cio_read_in();
        r &= 0x20;
        printf(":6 %x :: ", r );
*/
if ( option_indexer_ready != TRUE )
        {
        motor_delay ( motor , motor->delay );
        }
}
/*************************
* stepper
*
*       Move a stepper motor.
*
*       . moves using parameters in the motor data structure,
*        Sets direction according to the sign of the distance parameter.
*************************/
void stepper( motor, distance , delay )

   axis_parms *motor; /*  -> Stepper motor parms. */

   int    distance; /* Distance to move in steps */
   int    delay;            /* Delay after move. */
{
   double back_mils;
   char    motor_mess[80];
   int     i;

if ( distance != 0 )
        {
        motor->move_mode = motor->move_default;         /* Set motor motion flag
 */
        motion_mode = motor->move_mode;                 /* Set motor motion flag
 */

        motor->delay = delay;

        if( distance < 0 )
                {
                strcpy ( motor->direction, "-" );
                }
        else if( distance > 0 )
                {
                strcpy ( motor->direction, "+" );
                }
        if      ( motor == p_x_axis )
                        { back_mils = edit_backlash.mil.x; }
```

```
        else if   ( motor == p_y_axis )
                        { back_mils = edit_backlash.mil./; }
        else if   ( motor == p_t_axis )
                        { back_mils = edit_backlash.mil.t; }

        i = (( back_mils / motor->mps ) + 0.5 );
        i += abs ( distance );
        sprintf ( motor_mess, "%d", i );
        strcpy ( motor->distance, motor_mess  );

        motor->delay = 0;

        mover ( motor );

/*
        motor->delay = 10000;
        comp_backlash( motor );
*/
        }
}

/************************
* test_attention
*
*       Test for video attention switch pressed by operator.
*       Spawns a video attention "error".
************************/
void test_attention()
{
if ( panic_button == TRUE )
        {
        panic_button = FALSE;
        cct_throw( IO_ERR_ATTENTION );        /* NOT ERROR - VISION ATTENTION SW
 */
        }
/*
if ( panic_button == TRUE )
        {
        panic_button = FALSE;
        clear_prompt();
        strcpy ( error_mess, "   Vision system attention signal.");

        if        ( op_mode == MODE_REPEAT )   { PANIC = TRUE; }
        else if   ( op_mode == MODE_PRINT )    { op_mode = EXIT_PRINT; }
        else if ( op_mode == MODE_TEACH )      { op_mode = EXIT_TEACH; }
        else                                          { op_mode = EXIT_MODE; }
        }
*/
}
/************************
* in_(n)_parallel
*
* Interrupt action routines for INPUTS 1 - 6.
*
************************/

        /* OK TO ALIGN SIGNAL */
        /****
        * 1 *
        *****/
void in_1_parallel()
{
int     i, r ;
```

```
i = cio_read_in ( );                    /* Get data frrom 6 parallel input ports */
r = cfifo_put ( p_in_1_fifo, i );       /* Save data in the associated fifo */

if ( op_mode != MODE_PRINT )
        {
        }
else
        {
        align_ok_state = TRUE ;                 /* Set align ok flag. */
        }
}

        /* VISION SYSTEM ATTENTION SIGNAL */
        /****
        * 2 *
        *****/
void in_2_parallel()
{
 char     motor_mess[80];
 int      i, r ;

i = cio_read_in ( );
r = cfifo_put ( p_in_2_fifo, i );


if ( op_mode == MODE_PRINT )
        {
                /* Setup motor halt message */
/*
        sprintf ( motor_mess, "/S/0I/1I/2I/" );
*/
                /* IMMEDIATE HALT ALL MOTORS */
/*
        fputs ( motor_mess, fp_comm3 );
*/
        }

panic_button = ON;

}

        /* LIMIT SWITCHES (ored) */
        /****
        * 3 *
        *****/
void in_3_parallel()
{
int     i, r ;
i = cio_read_in ( );
r = cfifo_put ( p_in_3_fifo, i );

/*
if( motion_mode != MODE_CALIBRATE )
        {
        strcpy ( error_mess,
        "   ERROR - STEPPER MOTOR LIMIT ERROR                                    ";
        }
else
        {
*/

        limit_recovery = ON;
```

```
        if( motion_mode == MODE_X )
                {
                x_axis.limit = x_axis.direction[0];    /* Set x limit flag. */
                }
        if( motion_mode == MODE_Y )
                {
                y_axis.limit = y_axis.direction[0];    /* Set y limit flag. */
                }
        if( motion_mode == MODE_THETA )
                {
                t_axis.limit = t_axis.direction[0];    /* Set t limit flag. */
                }
/*
        }
*/
}

        /* X MOTOR ENCODER SIGNAL */
        /****
        * 4 *
        *****/
void in_4_parallel()
{
int     i, r ;

i = cio_read_in ( );
r = cfifo_put ( p_in_4_fifo, i );

if( motion_mode == MODE_STATIC )
        {
        }
else
        {
        x_axis.index = ON; /* Set x limit flag. */
        }
}

        /* Y MOTOR ENCODER SIGNAL */
        /****
        * 5 *
        *****/
void in_5_parallel()
{
int     i, r ;
i = cio_read_in ( );
r = cfifo_put ( p_in_5_fifo, i );

if( motion_mode == MODE_STATIC )
        {
        }
else
        {
        y_axis.index = ON; /* Set y limit flag. */
        }
}

        /* INDEXER READY SIGNAL */
        /* PREVIOUSLY Theta MOTOR ENCODER SIGNAL */
        /****
        * 6 *
        *****/
void in_6_parallel()
```

```
{
int       i, r ;

i = cio_read_in ( );
r = cfifo_put ( p_in_6_fifo, i );

if( motion_mode == MODE_STATIC )
          {
          }
else
          {
          t_axis.index = ON; /* Set theta limit flag. */
          xyt_ready = TRUE;
          }
}

/************************
* dump_parallel
*
*         Free parallel ports & fifo memory.
*************************/
void dump_parallel()
{
if ( p_in_1_fifo )
          {
          ctg_release ( 1 );            /* release the io line */
          cfifo_free ( p_in_1_fifo );   /* free the fifo memory */
          p_in_1_fifo = 0;
          }
if ( p_in_2_fifo )
          {
          ctg_release ( 2 );            /* release the io line */
          cfifo_free ( p_in_2_fifo );   /* free the fifo memory */
          p_in_2_fifo = 0;
          }
if ( p_in_3_fifo )
          {
          ctg_release ( 3 );            /* release the io line */
          cfifo_free ( p_in_3_fifo );   /* free the fifo memory */
          p_in_3_fifo = 0;
          }
if ( p_in_4_fifo )
          {
          ctg_release ( 4 );            /* release the io line */
          cfifo_free ( p_in_4_fifo );   /* free the fifo memory */
          p_in_4_fifo = 0;
          }
if ( p_in_5_fifo )
          {
          ctg_release ( 5 );            /* release the io line */
          cfifo_free ( p_in_5_fifo );   /* free the fifo memory */
          p_in_5_fifo = 0;
          }
if ( p_in_6_fifo )
          {
          ctg_release ( 6 );            /* release the io line */
          cfifo_free ( p_in_6_fifo );   /* free the fifo memory */
          p_in_6_fifo = 0;
          }
}
/************************
* para_init
```

```
*
* Init parallel I/O channels.
*************************/
void para_init()
{

void      in_1_parallel ();    /* Input LINE 1 interrupt action routine */
void      in_2_parallel ();          /* 2 */
void      in_3_parallel ();          /* 3 */
void      in_4_parallel ();          /* 4 */
void      in_5_parallel ();          /* 5 */
void      in_6_parallel ();          /* 6 */

panic_button = FALSE;

                    /* ------------------------------------ */
                    /* SETUP PARALLEL I/O LINES FOR TRIGGERING */
                    /* ------------------------------------ */
/*
--------------
 INIT LINE # 1      - "ok" to align signal.
--------------
*/
if ( p_in_1_fifo )
          {
          ctg_release ( 1 );          /* release the io line */
          cfifo_free ( p_in_1_fifo );  /* free the fifo memory */
          p_in_1_fifo = 0;
          }
p_in_1_fifo =  cfifo_make ( 16, 0, 0 );        /* Init input # 1 fifo */

ctg_init(
          1,                  /* line # */
          RISING_EDGE,        /* polarity */
          200,                /* bounce time */
          1,                  /* filter time */
          1,                  /* frequency filter */
          1,                  /* phase filter */
          in_1_parallel               /*  -> INTERRUPT ACTION ROUTINE */
          );

/*
--------------
 INIT LINE # 2      - vision attention signal.
--------------
*/
if ( p_in_2_fifo )
          {
          ctg_release ( 2 );          /* release the io line */
          cfifo_free ( p_in_2_fifo );  /* free the fifo memory */
          p_in_2_fifo = 0;
          }
p_in_2_fifo =  cfifo_make ( 16, 0, 0 );        /* Init input # 2 fifo */

ctg_init(
          2,                  /* line # */
          RISING_EDGE,        /* polarity */
          1,                  /* bounce time */
          1,                  /* filter time */
          1,                  /* frequency filter */
          1,                  /* phase filter */
          in_2_parallel               /*  -> INTERRUPT ACTION ROUTINE */
          );
```

```
/*
--------------
 INIT LINE # 3      - or'ed X+/- Y+/- & theta+/- limit switches.
--------------
*/
if ( p_in_3_fifo )
        {
        ctg_release ( 3 );          /* release the io line */
        cfifo_free ( p_in_3_fifo );  /* free the fifo memory */
        p_in_3_fifo = 0;
        }
p_in_3_fifo =  cfifo_make ( 16, 0, 0 );        /* Init input # 3 fifo */

ctg_init(
        3,                  /* line # */
        RISING_EDGE,        /* polarity */
        1000,               /* bounce time */
        1,                  /* filter time */
        1,                  /* frequency filter */
        1,                  /* phase filter */
        in_3_parallel               /*  -> INTERRUPT ACTION ROUTINE */
        );

/*
--------------
 INIT LINE # 4      - X index ( detent ).
--------------
*/
if ( p_in_4_fifo )
        {
        ctg_release ( 4 );          /* release the io line */
        cfifo_free ( p_in_4_fifo );  /* free the fifo memory */
        p_in_4_fifo = 0;
        }
p_in_4_fifo =  cfifo_make ( 16, 0, 0 );        /* Init input # 4 fifo */
ctg_init(
        4,                  /* line # */
        RISING_EDGE,        /* polarity */
        1,                  /* bounce time */
        1,                  /* filter time */
        1,                  /* frequency filter */
        1,                  /* phase filter */
        in_4_parallel               /*  -> INTERRUPT ACTION ROUTINE */
        );

/*
--------------
 INIT LINE # 5      - Y index ( detent ).
--------------
*/
if ( p_in_5_fifo )
        {
        ctg_release ( 5 );          /* release the io line */
        cfifo_free ( p_in_5_fifo );  /* free the fifo memory */
        p_in_5_fifo = 0;
        }
p_in_5_fifo =  cfifo_make ( 16, 0, 0 );        /* Init input # 5 fifo */

ctg_init(
        5,                  /* line # */
        RISING_EDGE,        /* polarity */
        1,                  /* bounce time */
```

```
        1,                      /* filter time */
        1,                      /* frequency filter */
        1,                      /* phase filter */
        in_5_parallel                   /*  -> INTERRUPT ACTION ROUTINE */
        );

/*
---------------
 INIT LINE # 6      - theta index ( detent ).
---------------
*/
if ( p_in_6_fifo )
        {
        ctg_release ( 6 );              /* release the io line */
        cfifo_free ( p_in_6_fifo );  /* free the fifo memory */
        p_in_6_fifo = 0;
        }
p_in_6_fifo =  cfifo_make ( 16, 0, 0 );         /* Init input # 6 fifo */

ctg_init(
        6,                      /* line # */
        RISING_EDGE,            /* polarity */
        1,                      /* bounce time */
        1,                      /* filter time */
        1,                      /* frequency filter */
        1,                      /* phase filter */
        in_6_parallel                   /*  -> INTERRUPT ACTION ROUTINE */
        );
}
/*************  ***************************************************
* ip.v                                                          20 Jan. 88
*
*                               THREE AXIS ALIGNMENT SYSTEM
*                                   Copyright  (C) 1987
*                                     MPM CORPORATION
*                                     71  WEST STREET,
*                                      MEDFIELD MASS.
*
*
* MPM image processing functions.
*
*****************************************************************/

int       board_x, board_y;

int       box_1_x, box_1_y, box_2_x, box_2_y;

scale_parameters  stencil_scale =      /* Scale calc structure */
        {
        81, 81, 0, 0, 0.0, 0.0, 0.0, 0.0, 0, 0,
        };
scale_parameters  *p_scale;  /* -> Scale calc structure */

cip_buffer         *ip_image;


/***********************
* ip_init
*
*        Init image processing.
*
```

```
************************/
void ip_init ( )
{
        int         x, y;
        double      X, Y;

/*
board_x = 150;      board_y = 150;
*/
board_x = 200;      board_y = 200;

p_scale = &stencil_scale;

x = p_scale->x_percent;                 y = p_scale->y_percent;
box_1_x = 200;                          box_1_y = 200;
X = x;                                  Y = y;
X /= 100.0;                             Y /= 100.0;
X = (1.0 / X);                          Y = (1.0 / Y);
X *= 100.0;                             Y *= 100.0;
p_scale->x_percent = X;                 p_scale->y_percent = Y;

p_scale->x_size = 199;      p_scale->y_size = 199;
calc_scale ( p_scale );
box_2_x = p_scale->x_new;   box_2_y = p_scale->y_new;
p_scale->x_percent = x;                 p_scale->y_percent = y;
        /* PE. .NENT GENERAL PURPOSE IMAGE BUF:    */
/*
gp_image = cip_create ( 256, 256, 32 );
*/
}
/************************
* calc_scale
*
*       Calculate parameters for a scaled image.
*
************************/
void calc_scale ( p_scale )

        scale_parameters  *p_scale;
{
        double    f;

f = p_scale->x_size;
p_scale->fx_size = f;
f = p_scale->y_size;
p_scale->fy_size = f;

f = p_scale->x_percent;
p_scale->fx_percent = f;
f = p_scale->y_percent;
p_scale->fy_percent = f;

p_scale->x_new = ((p_scale->fx_size * ( p_scale->fx_percent / 100.0 )) );
p_scale->y_new = ((p_scale->fy_size * ( p_scale->fy_percent / 100.0 )) );

p_scale->x_new = ((p_scale->fx_size * ( p_scale->fx_percent / 100.0 )) );
p_scale->y_new = ((p_scale->fy_size * ( p_scale->fy_percent / 100.0 )) );
}
/************************
* zoom_back
*
*       Create ZOOMED (IN or OUT) image & copy it back to the original image.
```

```
*
************************/
cip_buffer *zoom_back( src, dst, x_percent, y_percent )

        cip_buffer          *src, *dst;                 /* Src & Dst images */
        int                 x_percent, y_percent;       /* % to shrink/grow */
{
        cip_buffer          *zoom_image();

        double    f;

if ( x_percent == 0 ) { x_percent = 100; }
if ( y_percent == 0 ) { y_percent = 100; }

printf ( "Zoom Percent X = %d  Y = %d\n", x_percent, y_percent );

p_scale->x_percent = x_percent;                 p_scale->y_percent = y_percent;
p_scale->x_size = src->width;                   p_scale->y_size = src->height;
calc_scale ( p_scale );

if ( ip_image != 0 )
        {
        cip_d   te ( ip_image );
        ip_im   = 0;
        }
ip_image = cip_window
        (
        gp_image, ip_image, 0,0,
        ( p_scale->x_new - 1 ), ( p_scale->y_new - 1 )
        );

zoom_image( src, dst, x_percent, y_percent );
caq_cpu ( );                    /* Enable access to frame grabber. */

/*
cif_set_window
        (
        0, 0,
        575, 447,
        cif_fg_window
        );
*/

cif_set_window
        (
        -1, -1,
        p_scale->x_new, p_scale->y_new,
        cif_fg_window
        );

cip_copy ( ip_image, dst );


cip_delete ( ip_image );
ip_image = 0;

caq_display ( );

/*
if ( debug_mode == DBG_NO_PRINTER )
        {
        wait_tb3_bl ( );
        }
```

```
*/

return ( ip_image );
}
/*************************
* zoom_image
*
*        Create a REDUCED or INFLATED image.
*
*************************/
cip_buffer *zoom_image ( src, dst, x_percent, y_percent )

        cip_buffer          *src, *dst;                 /* Src & Dst images */
        int                 x_percent, y_percent;       /* % to shrink/grow */
{
/*
temp_image = cip_sample ( src, 0, 2, 2, 1, 1 );
temp_image = cip_scale ( src, 0, 75, 75, 1, 1 );
temp_image = cip_scale ( src, temp_image, 100, 100, 1, 1 );
*/

ip_image = cip_scale ( src, ip_image, x_percent, y_percent, 0, 0 );

return ( ip_image );
}
/*************************
* mirror_back
*
*        Create a VERTICAL mirror image & copy it back to the original image.
*
*************************/
void mirror_back( src, dst )

        cip_buffer          *src, *dst;         /* Src & Dst images */

{
        void ccip_mirror();

ccip_mirror( src, dst );
caq_cpu ( );                    /* Enable access to frame grabber. */
cip_copy( dst, src );
/*
ccip_hmirror( dst, src );
*/
}
/*************************
* ccip_mirror
*
*        Create a VERTICAL mirror image.
*
*************************/
void ccip_mirror( src, dst )

  cip_buffer        *src, *dst;         /* Src & Dst images */

{
 int h, i, j, k, z ;

caq_cpu ( );                    /* Enable access to frame grabber. */
for( h = (( src->height) -1), i = 0; i < (( src->height) -1); h--, i++ )
        {
        for( j = (( src->width) -1), k = (( src->width) -1); j > 1; j--, k--
```

```
                    {
                    z = src->get ( src, j, h );
                        dst->put ( dst, k, i );
                    }
          }
caq_graphics ( );  /* Show the LIVE image and message */
}
/************************
* ccip_hmirror
*
*         Create a HORIZONTAL mirror image.
*
************************/
void ccip_hmirror( src, dst )

  cip_buffer       *src, *dst;        /* Src & Dst images */
{
 int i, j, k,

caq_cpu ( );                    /* Enable access to frame grabber. */
for( i = 0; i < ( ( src->height) -1 ); i++ )
          {
          for( j = ( ( src->width) -1 ), k = 0; j > 1; j--, k++ )
                    {
                    z = src->get ( src, j, i );
                        dst->put ( dst, k, i );
                    }
          }
caq_graphics ( );  /* Show the LIVE image and message */
}
/************* ***************************************************
* men.def                                                    15 Dec. 88
*
* Global menu declarations.
*
*****************************************************************/

int       x_offset, y_offset;/* General purpose screen offset values. */

char      mess[80];          /* General purpose message buffer. */

/*
------------------
 MENU DECLARATIONS
------------------
*/


cip_buffer  *ip_menu = 0;              /*  -> Menu Image. */
cip_buffer  *ip_help = 0;              /*  -> Help Image. */

cip_buffer  *ip_sel_off = 0; /*  -> Menu selection off Image. */

cgr_screen *sp_cur_menu = 0; /*  -> Current Menu screen. */


cgr_screen main_screen;                /* Menu screen structures */
cgr_screen tiny_screen;
cgr_screen tovr_screen;

cgr_screen help_screen;
```

```
cgr_screen copyr_screen;


#define  NOT_INIT  -1
#define  MENU_PERMANENT      0
#define  MENU_TEMPORARY      1

#define  X_CENTERED          -1
#define  Y_CENTERED          -1


int                  cur_menu_sel;       /* Current menu selection. */
menu_selection       *p_menu_sel;        /*  -> Current menu selection. */


menu_parameters main_menu =
          {
          &main_screen,       /*  -> screen */
          0,                  /*  -> cip */
          0,                  /*  -> -> cip */
          185,        210,
          0,          0,      /* Offset of menu in screen. */
          45,         5,      /* Default cursor */
          CAQ_BLACK,          /* Box */
          CAQ_WHITE,          /* Border */
          MENU_TEMPORARY,
          " MAIN MENU ",      /* Title */
          0, 0, 0, 0, 0,      /* ->s Text */
menu_parameters tiny_menu =
          {
          &tiny_screen,       /*  -> screen */
          0,                  /*  -> cip */
          0,                  /*  -> -> cip */
          574,        24,
          1,          420,    /* Offset of menu in screen. */
          0,          0,      /* Default cursor */
          CAQ_BLACK,          /* Box */
          CAQ_WHITE,          /* Border */
          MENU_PERMANENT,
          "",                 /* Title */
          0, 0, 0, 0, 0,      /* ->s Text */
          };


menu_parameters tiny_over =
          {
          &tovr_screen,       /*  -> screen */
          0,                  /*  -> cip */
          0,                  /*  -> -> cip */
          574,        24,
          1,          420,    /* Offset of menu in screen. */
          0,          0,      /* Default cursor */
          4,                  /* Box */
          63,                 /* Border */
          MENU_PERMANENT,
          "",                 /* Title */
          0, 0, 0, 0, 0,      /* ->s Text */
          };


menu_text mh_1 = { 10,        35,  " Use \"SETUP\" mode to teach a new board. . };
menu_text mh_2 = { 10,        57,  " Use \"EDIT\"  mode to alter the setup.". };
```

```
menu_text mh_3 = { 10,        79,  " Use \"PRINT\" mode to print automatically. ", };
;
menu_text mh_4 = { 10,        101, " Use \"SAVE\"  mode to save setup and exit. ", }
;
menu_text mh_5 = { 10,        123, " Use \"EXIT\"  mode to exit the program. ", };

menu_parameters main_help =
        {
        &help_screen,         /*  -> screen */
        0,                    /*  -  cip */
        0,                    /*  -> -> cip */
        400,      320,
        X_CENTERED,           /* Offset of menu in screen. */
        Y_CENTERED,
        45,       5,          /* Default cursor */
        CAG_BLACK,            /* Box */
        CAG_BLINK,            /* Border */
        MENU_TEMPORARY,
        " MAIN HELP ",        /* Title */
        &mh_1, &mh_2, &mh_3, &mh_4, &mh_5,     /* ->s Text */
        };

menu_text th_1 = { 20,        35,  " line 1 ", };
menu_text th_2 = { 20,        57,  " line 2 ", };
menu_text th_3 = { 20,        79,  " line 3 ", };
menu_text th_4 = { 20,        101, " line 4 ", };
menu_text th_5 = { 20,        123, " line 5 ", };

menu_parameters teach_help =
        {
        &help_screen,         /*  -> screen */
        0,                    /*  -> cip */
        0,                    /*  -> -> cip */
        500,      250,
        X_CENTERED,           /* Offset of menu in screen. */
        Y_CENTERED,
        25,       5,          /* Default cursor */
        CAG_BLACK,            /* Box */
        CAG_BLINK,            /* Border */
        MENU_TEMPORARY,
        " no TEACH help yet ",        /* Title */
        &th_1, &th_2, &th_3, &th_4, &th_5,     /* Text struct pointers. */
        };

menu_text eh_1 = { 20,        35,  " line 1 ", };
menu_text eh_2 = { 20,        57,  " line 2 ", };
menu_text eh_3 = { 20,        79,  " line 3 ", };
menu_text eh_4 = { 20,        101, " line 4 ", };
menu_text eh_5 = { 20,        123, " line 5 ", };

menu_parameters edit_help =
        {
        &help_screen,         /*  -> screen */
        0,                    /*  -> cip */
        0,                    /*  -> -> cip */
        500,      250,
        X_CENTERED,           /* Offset of menu in screen. */
        Y_CENTERED,
        25,       5,          /* Default cursor */
        CAG_BLACK,            /* Box */
        CAG_BLINK,            /* Border */
        MENU_TEMPORARY,
```

```
        " no EDIT help yet ",          /* Title */
        &eh_1, &eh_2, &eh_3, &eh_4, &eh_5,     /* ->s Text */
        };

menu_text ph_1 = { 20,        35,  " line 1 ", };
menu_text ph_2 = { 20,        57,  " line 2 ", };
menu_text ph_3 = { 20,        79,  " line 3 ", };
menu_text ph_4 = { 20,        101, " line 4 ", };
menu_text ph_5 = { 20,        123, " line 5 ", };

menu_parameters print_help =
        {
        &help_screen,         /*  -> screen */
        0,                    /*  -> cip */
        0,                    /*  -> -> cip */
        500,      250,
        X_CENTERED,           /* Offset of menu in screen. */
        Y_CENTERED,
        25,       5,          /* Default cursor */
        CAQ_BLACK,            /* Box */
        CAQ_BLINK,            /* Border */
        MENU_TEMPORARY,
        " no PRINT help yet ",         /* Title
        &ph_1, &ph_2, &ph_3, &ph_4, &ph_5,     /* ->s Text */
        };


menu_text cr_1 = { 1,         35,  " THREE AXIS ALIGNMENT SYSTEM", };
menu_text cr_2 = { 1,         57,  "     Copyright  (C) 1987", };
menu_text cr_3 = { 1,         79,  "       MPM CORPORATION", };
menu_text cr_4 = { 1,         101, "       71  WEST STREET,", };
menu_text cr_5 = { 1,         123, "        MEDFIELD MASS.", };

menu_parameters copy_right =
        {
        &copyr_screen,        /*  -> screen */
        0,                    /*  -> cip */
        0,                    /*  -> -> cip */
        235,      150,
        X_CENTERED,           /* Offset of menu in screen. */
        Y_CENTERED,
        85,       10,         /* Default cursor */
        CAQ_BLACK,            /* Box  */
        CAQ_WHITE,            /* Border */
        MENU_TEMPORARY,
        " ASP-24 ",           /* Title */
        &cr_1, &cr_2, &cr_3, &cr_4, &cr_5,     /* ->s Text */
        };


menu_selection men_sel_1 = {  10, 30,  2,0,  NOT_INIT, " 1. SETUP ASP-24 ", };
menu_selection men_sel_2 = {  10, 60,  3,0,  NOT_INIT, " 2. EDIT PRINT ", };
menu_selection men_sel_3 = {  10, 90,  3,0,  NOT_INIT, " 3. AUTO PRINT ", };
menu_selection men_sel_4 = {  10,120,  3,0,  NOT_INIT, " 4. CLEAN STENCIL", };
menu_selection men_sel_5 = {  10,150,  3,0,  NOT_INIT, " 5. MAINTENANCE ", };
menu_selection men_sel_6 = {  10,180,  3,0,  NOT_INIT, " 6. EXIT ", };
```

```
/*****************************************************************
* menu.v                                                  21 Feb 89
*
*                          THREE AXIS ALIGNMENT SYSTEM
*                              Copyright  (C) 1987
*                                MPM CORPORATION
*                                71  WEST STREET,
*                                 MEDFIELD MASS.
*
*        *****************
*        CCCprint.v
*    Rev = 2.9999999        for test only
*        *****************
*
*        ****************
*        Cognex Rev = 1.1 - Intermediate Rev. with known bugs.
*        ****************
*
* MPM upper level & menus.
*
* COMMENT CONVENTIONS:
*
*                  '=>'    = 'Implies'  or   'therefore'.
*
*                  '->'    =>         'pointer'.
*
*                  '-> ->' =>         'pointer to a pointer'.
*
* LABEL CONVENTIONS:
*
*                  'ip_*'  =>         'image pointer  ( cip_buffer pointer ).
*
*                  'sp_*'  =>         screen pointer ( cgr_screen pointer ).
*
*                  'p_pd_*'  =>       "pointing device" pointer ( trackball  .
*
*****************************************************************/

/*
---------------
 UTILITY & MACROS
---------------
*/

/************************
* mpm
*
* MPM entry point.
*
************************************/
void mpm()
{
         int       error_caught;
         char      *error_name;

if ( error_caught = cct_catch( 0 ) )   /* Catch any error */
         {
         if ( error_caught == CIC_ERR_QUIT )
                   {
                   cct_throw ( CIC_ERR_QUIT );
                   }
         erro  name = cct_name( error_caught )
```

```
        spri. . ( aess,
         "UNRECOVERABLE ERROR - %s, Press 1 to Restart System", error_name );
        pd_flush();
        u_prompt ( PASS, mess );


        dump_models();                  /* Free model memory. */
        dump_menus ();                  /* Free menu memory. */
        dump_parallel();    /* Free parallel I/O fifos etc. memory. */


        free(cif_tb_file->_base);
        cif_tb_file->_base = 0;
        cip_delete ( temp_image );
        fclose ( cif_tb_file );
        mpm ( );
        }
else
        {
        mpm_sub ( );
        }
}
/*************************
* mpm_sub
*
* MPM main function.
*
*************************/
void mpm_sub()
{
        void do_selection(), get_tb3_data();
        int     i, j;
        int     error_caught;

printf ( "\nMEMORY STATUS AT INIT\n" );
chp_stats ( );

/*
(cu_expand_stack ( 4 );
chp_check = 1;
*/                  /* EXPAND BY 16K TO AVOID SYSTEM CRASH */
                    /* !!!! TEMP !!!! SET HEAP CONSISTENCY CHECKING */


op_mode             = MODE_MAIN_MENU;
motion_mode         = MODE_STATIC;

        /* Set level of diagnostic reporting. */
rep_default         = MODE_TERSE;       /* DEFAULT=Medium level diag reporting. */
rep_mode  = MODE_TERSE;       /* CURRENT=Medium level diag reporting. */
rep_unit  = MODE_MILS;        /* Report to PC in inches. */

strcpy(error_mess,"");

         pdx = 0;  pdy = 0;  pd_key = 0;
pdp_x = &pdx;       pdp_y = &pdy;       p_pd_key = &pd_key;

set_camera( CAMERA_1, SPLIT_ON, IMAGE_POSITIVE );
flag_init ( );                  /* Init flags */
gp_init ( );                    /* General purpose init function. */
```

```
        /* PERMANENT GENERAL PURPOSE IMAGE BUFFER */
if ( gp_image != 0 ) { cip_delete ( gp_image ); gp_image = 0; }
if ( gp_image == 0 ) { gp_image = cip_create ( 240, 240, 8 ); }

if ( temp_image != 0 )
        {
        cip_delete ( temp_image ); temp_image = 0;
        }
if ( temp_image == 0 )
        {
        temp_image = cip_window ( gp_image, temp_image, 0, 0, 199, 199 );
        }

comm_init ( );              /* Init comm channels 2 & 3. */
menu_init ( );              /* Init menus. */
geom_init ( );              /* Init geometry structs & pointers. */
/*
test_pseudo ( );
*/
para_init ( );              /* Init parallel I/O channels. */

pd_key = 1;

/* ** CHECK THE VARIOUS DIP SWITCHES ** */
i = cio_read_dipsw();
j = cio_read_dipsw_vp();
printf ("VBX_SW = %x  VP_SW = %x\n", i, j );
get_dip();                  /* Test Cognex back panel DIP switches. */

set_camera( CAMERA_1, SPLIT_ON, IMAGE_POSITIVE);

if ( debug_mode != DBG_NO_PRINTER )
        {
        step_init ( );      /* Init stepper motors. */
        }
sear_init ( );              /* Init search structs & pointers. */
ip_init ( );                /* Init image processing */

/*
option_init ( );
*/      /* Init hardware options */

make_menu ( &main_menu );
menu_main ( );              /* Display/Re-display main menu. */
caq_cpu ( );                /* Enable access to frame grabber. */
cgr_display_image (
                    ip_sel_on,                  /* src   */
                    caq_image,                  /* dst   */
                    p_menu_sel->x0,   /* x off */
                    p_menu_sel->y0,   /* y off */
                    1                           /* mag   */
                    );
main_menu.screen->cursorx = ( p_menu_sel->x0 + 35 );
main_menu.screen->cursory = ( p_menu_sel->y0 +  1 );
cgr_printf(main_menu.screen, "%s", p_menu_sel->text);
caq_graphics    :   /* Display the LIVE image ar   enu. */
cur_menu_sel = .;   /* Init current menu selectio... */

pd_flush();
/*
while ( ! (pd_key == 1  &&  cur_menu_sel == 0) )
*/
```

```
while ( ! (pd_key == 1  &&  cur_menu_sel == 5) )
    {

    if (
            ( error_caught = cct_catch( IO_ERR_ATTENTION ) )
        || ( error_caught = cct_catch( SEAR_ERR_NOTFOUND ) )
        )
        {
        menu_main ( );                  /* Display/Re-display main menu. */
        caq_cpu ( );                    /* Enable access to frame grabber. */
        cgr_display_image (
                    ip_sel_on,                  /* src   */
                    caq_image,                  /* dst   */
                    p_menu_sel->x0,   /* x off */
                    p_menu_sel->y0,   /* y off */
                    1                           /* mag   */
                    );
        caq_graphics ( );  /* Display the LIVE image and menu. */
        cur_menu_sel = 1;  /* Init current menu selection. */
        if ( ctm_read( p_bug_timer ) > 3600000 )
                {
                ctm_begin( p_bug_timer );
                printf ( " Resetting BUG TIMER\n" );
                bug_reinit();
                }
        get_tb3_data ( );  /* Read 3 button trackball */
        if ( ( pd_key == 1 ) || ( pd_key == 4 ) )
                {
                do_selection ( );  /* Enter major op mode. */
                make_menu ( &main_menu );
                menu_main ( );                  /* Re-display main menu. */
                PROG_EXIT_TEST
                next_selection ( caq_image, -1);        /* offset */
                }
        else if ( pd_key == 2 )
                {
                next_selection ( caq_image, 0);                 /* no offset *
/
                }
        }
    else
        {
        if ( ctm_read( p_bug_timer ) > 3600000 )
                {
                ctm_begin( p_bug_timer );
                printf ( " Resetting BUG TIMER\n" );
                bug_reinit();
                }
        get_tb3_data ( );  /* Read 3 button trackball */
        if ( ( pd_key == 1 ) || ( pd_key == 4 ) )
                {
                do_selection ( );  /* Enter major op mode. */
                make_menu ( &main_menu );
                menu_main ( );                  /* Re-display main menu. */
                PROG_EXIT_TEST
                next_selection ( caq_image, -1);        /* offset */
                }
        else if ( pd_key == 2 )
                {
                next_selection ( caq_image, 0);                 /* no offset *
/
                }
```

```
        cct_end( SEAR_ERR_NOTFOUND );
        cct_end( ID_ERR_ATTENTION );
        }
    }
dump_parallel ( ); /* Free parallel ports & fifo memory. */
}
/*************************
* save_setup.
*
*       System save to save the inspection environment to the
*       Cognex 2000 floppy disk.
*
*************************/
void save_setup()
{
/* User message - new disk . Test for/user-correct wrong disk. */
/* Test for/user-correct write protect ?  User message - enter setup name. */
/* Clean memory and save system. User message - Remove & label Cognex disk. */
        /* . */
  }
/*************************
* probe_teach.
*
*************************/
void probe_teach( p_probe )

        probe_parms         *p_probe; /* -> probe struct. */
{
        cip_buffer          *zoom_back();
        cip_buffer          *tmp_cip;

clear_mess ( );
set_camera( p_probe->camera, SPLIT_OFF, IMAGE_POSITIVE );
vid_setup();

if ( !(p_probe->mdl) )
        {
        p_probe->gain   = caq_mode->gain;
        p_probe->offset = caq_mode->offset;
        }
p_scale->x_size = board_x;   p_scale->y_size = board_y;
calc_scale ( p_scale );

if ( !(p_probe->mdl) )
        {
        p_tp = &tr1_model; /* set -> training parameters. */
        cif_set_window ( -1, -1, board_x, board_y, cif_fg_window );
        new_gainoff( new_off2, new_gain2 );
        p_probe->mdl  = tr_model( p_probe->mdl, TRUE );
        }
else if ( !(p_probe->smdl) )
        {
        p_probe->s_gain   = caq_mode->gain;
        p_probe->s_offset = caq_mode->offset;
        p_tp = &tr1_model; /* set -> training parameters. */

        cif_set_window( -1,-1, p_scale->x_new, p_scale->y_new, cif_fg_window );

        new_gainoff( new_off2, new_gain2 );
        p_probe->smdl  = tr_model( p_probe->smdl, TRUE );
        }
```

```
cif_set_window ( 0, 0, 575, 447, cif_fg_window );

if ( (p_probe->mdl) && !(p_probe->smdl) )
        {
        p_prob_1->sea_parms  = &my_norm_search;
        c3_search ( p_probe->mdl, p_probe, SEA_SHOME );
        }
else if ( (p_probe->smdl) )
        {
        p_prob_1->sea_parms  = &my_norm_search;
        c3_search ( p_probe->smdl, p_probe, SEA_SHOME );
        }
}
/************************
* do_geometry.
*
*
************************/
void do_geometry( p_probe1, p_probe2 )

        probe_parms         *p_probe1, *p_probe2;        /* -> probe struct. */
{
        char      *error_name;

/* ------- TEACH SCREEN MODELS FOR GEOMETRY CALCULATIONS -------- */
p_tp = &tr1_model;          /* set -> training parameters. */
probe_teach( p_probe1 );

p_tp = &tr2_model;          /* set -> training parameters. */
probe_teach( p_probe2 );

/* ------- GEOMETRY CALCULATIONS -------- */
if ( debug_mode != DBG_NO_PRINTER )
        {
        op_mode = MODE_GEOM;
        if (
                ( error_caught = cct_catch( IO_ERR_ATTENTION ) )
            || ( error_caught = cct_catch( SEAR_ERR_NOTFOUND ) )
          )
                {
                sprintf ( error_mess,
              "UNRECOVERABLE ERROR - %s, Press 1 for MAIN MENU.",error_name);
                u_prompt ( PASS, error_mess );
                cct_throw ( GEO_ERR_NOTFOUND );
                }
        else    {
                calc_geometry ( ); /* Calc mil/pixel & theta step */
                cct_end( SEAR_ERR_NOTFOUND );
                cct_end( IO_ERR_ATTENTION );
                }
        op_mode = MODE_TEACH;
        }

set_camera( CAMERA_1, SPLIT_ON, IMAGE_POSITIVE );

}
/************************
* edit_it.
*
************************/
void edit_it( )
{
```

```
model_edit ( );
clear_prompt ( );
}
/************************
* print_it.
*
************************/
void print_it( )
{
        int       error_caught;

if ( error_caught = cct_catch( IO_ERR_ATTENTION ) )
    {
    realign_it();  /* Move back to "home" location ( if models found ) */
    cct_throw( IO_ERR_ATTENTION );     /* NOT ERROR - VISION ATTENTION SW */
    }
else
    {
    if ( error_caught = cct_catch( SEAR_ERR_NOTFOUND ) )
        {
        sprintf ( error_mess,
           "    ERROR - CAN'T FIND ALIGNMENT TARGET, Press 1 to continue." );
        u_prompt ( PASS, error_mess );
        sprintf ( error_mess,
           "    Print head up, remove board,  then Press 1 for MAIN MENU." );
        u_prompt ( PASS, error_mess );
        }
    else
        {
        print_sub();
        cct_end( SEAR_ERR_NOTFOUND );
        }
    cct_end( IO_ERR_ATTENTION );
    }
}
/************************
* teach_it.
*
************************/
void teach_it( )
{
        int       error_caught;
        char      *error_name;

if (
        ( error_caught = cct_catch( GEO_ERR_NOTFOUND ) )
    ||  ( error_caught = cct_catch( GEO_ERR_BADMOTOR ) )

        {
        sprintf ( error_mess,
         "UNRECOVERABLE ERROR - %s,  Press 1 for MAIN MENU.", error_name );
        u_prompt ( PASS, error_mess );
        }
else    {
        teach_sub();
        cct_end( GEO_ERR_BADMOTOR );
        cct_end( GEO_ERR_NOTFOUND );
        }
}
/************************
* teach_sub.
*
```

```
************************/
void teach_sub( )
{
        void      get_tb3_data();
        int       r;
        int       error_caught;

u_mess ( NO_OP,
  "DO YOU REALLY WANT TO TEACH ?   1 to continue   2 to exit" );
pd_flush();
while ( ! ( pd_key == 1 ) )
        {
        get_tb3_data ( );  /* Read Cognex 3 button trackball */
        if ( pd_key == 4 )
                {
                }
        else if ( pd_key == 1 )
                {
                break;
                }
        else if ( ( pd_key == 2 ) )
                {
                op_mode = MODE_MAIN_MENU;
                break;
                }
        }

set_camera( CAMERA_1, SPLIT_ON, IMAGE_POSITIVE );
clear_mess ( );
sprintf( mess,
        "OFFSETS: X = %1.4f Y = %1.4f Theta  = %1.4f   1 to continue",
        edit_offset.mil.x, edit_offset.mil.y, edit_offset.mil.t );
u_prompt ( PASS, mess );

dump_models ( );   /* Free model memory. */

u_prompt ( NO_OP,
        "Feed board, align probes,  then press 1 to enhance images.");

vid_setup2();

manual_align( 1 );

caq_cpu 1 );                          /* Enable access to frame grabber. */
caq_constant ( CAQ_PASS );   /* Clear screen */
caq_graphics (               /* Show the LIVE i  and message */

u_prompt ( NO_OP,
        "To define alignment targets, Press 1.");

p_tp = &tr1_model;           /* set -> training parameters. */
probe_teach( p_prob_1 );

p_tp = &tr2_model;           /* set -> training parameters. */
probe_teach( p_prob_2 );

/* ----------------------- */
set_camera( CAMERA_1, SPLIT_ON, IMAGE_POSITIVE );
/*
u_prompt ( PASS,
    "Set lights & focus to view stencil.   Press 1 when done.");
*/
```

```
u_prompt ( PASS,
   "Turn board lights off,  Set stencil lights & focus,   1 to continue");
manual_align ( 1 );

set_camera( CAMERA_1, SPLIT_OFF, IMAGE_POSITIVE );
do_geometry( p_prob_1, p_prob_2 );
vid_setup();

error_caught = -1;
while ( error_caught != 0 )
        {
        if ( error_caught = cct_catch( IO_ERR_ATTENTION ) )
                {
                if ( error_caught != -1 )
                        {
                        strcpy ( error_mess,
                                "   REPEATING stencil to board alignment.",
                                );
                        u_prompt ( NO_OP, error_mess );
                        }
                }
        else    {
                user_align();
                pd_flush();
                cct_end( IO_ERR_ATTENTION );
                }
        }
}
/************************
* do_selection.
*
*       Major operating modes - upper level.
*
************************/
void do_selection()
{
switch ( cur_menu_sel )
  {
  case 1:
        op_mode = MODE_TEACH;
        sear_init ( );                          /* Init search structs & pointers.
 */
        if( pd_key == 1 )
                {
                teach_it ( );                   /* Learn a new alignment prototyp-
e */
                }
        set_camera( CAMERA_1, SPLIT_ON, IMAGE_POSITIVE );
 /*
        sel_offset = 2;
 */                             /* Skip cursor to Print mode. */
        break;
  case 2:
        op_mode = MODE_EDIT;
        edit_it ( );                            /* EDIT PRINT MODE */
        set_camera( CAMERA_1, SPLIT_ON, IMAGE_POSITIVE );
        cur_menu_sel = 2;               /* Force exit. */
        break;
  case 3:
        op_mode = MODE_PRINT;                           /* AUTO PRINT MODE */
        print_it ( );
        set_camera( CAMERA_1, SPLIT_ON, IMAGE_POSITIVE );
```

```
        cur_menu_sel = 3;           /* Force exit. */
        break;
  case 4:
        op_mode = MODE_CLEAN;
        if ( (p_prob_1->mdl) && (p_prob_1->smdl)
          && (p_prob_2->mdl) && (p_prob_2->smdl) )
                {
                clean_it();
                }
        else    {
                u_prompt ( NO_OP,
                        "Setup required before clean,   1 to continue.");
                }
        cur_menu_sel = 4;           /* Force exit. */
        break;
  case 5:
        op_mode = MODE_MAINTAIN;
        maintain_it ( );
        cur_menu_sel = 5;
        break;
  case 6:
/*
        dump_models ( );
        op_mode = MODE_EXIT;
        cur_menu_sel = 5;
*/
        printf( "\n\n ??? Menu selection # 6 ??? \n\n" );
        break;
  }

}
/*****************************************************************
* print.v                                                  15 Feb. 89
*
*                          THREE AXIS ALIGNMENT SYSTEM
*                              Copyright  (C) 1987
*                                MPM CORPORATION
*                                71  WEST STREET,
*                                 MEDFIELD MASS.
*
*****************************************************************/

cip_buffer          *temp_image = 0;   /* Image work buffer. */

int       xoff, yoff, toff;

void doto( manual )

        double manual;
{
toff = ( (( manual ) / p_t_axis->mps ) + ROUNDUP );
 stepper ( p_t_axis, ( (toff)), 30000 );
}
void dox( manual )

        double manual;
{
xoff = ( (( manual ) / p_x_axis->mps ) + ROUNDUP );
 stepper ( p_x_axis, ( (xoff)), 100000 );

}
void doy( manual )
```

```
        double manual;
{
yoff = ( (( manual ) / p_y_axis->mps ) + ROUNDUP );
 stepper ( p_y_axis, ( (yoff)), 100000 );
}


/************************
* bug_reinit
*
*       Reinit parallel ports - Cognex INT bug.
************************/
void bug_reinit( )
{
ctg_release ( 1 );          /* release the io line */
ctg_init(
        1,                  /* line # */
        RISING_EDGE,        /* polarity */
        200,                /* bounce time */
        1,                  /* filter time */
        1,                  /* frequency filter */
        1,                  /* phase filter */
        in_1_parallel               /*  -> INTERRUPT ACTION ROUTINE */
        );
ctg_release ( 2 );          /* release the io line */
ctg_init(
        2,                  /* line # */
        RISING_EDGE,        /* polarity */
        1,                  /* bounce time */
        1,                  /* filter time */
        1,                  /* frequency filter */
        1,                  /* phase filter */
        in_2_parallel               /*  -> INTERRUPT ACTION ROUTINE */
        );
ctg_release ( 3 );          /* release the io line */
ctg_init(
        3,                  /* line # */
        RISING_EDGE,        /* polarity */
        1000,               /* bounce time */
        1,                  /* filter time */
        1,                  /* frequency filter */
        1,                  /* phase filter */
        in_3_parallel               /*  -> INTERRUPT ACTION ROUTINE */
        );
}
/************************
* print_sub.
*
*   PRINT MODE.
*         The ASP-24 provides an "ok to align" signal to the vision system
*       on PLC-52. Each time pin 52 is received the ASP-24 is aligned by
*       the vision system to the current board and a PLC-06 signal enables
*       the ASP-24 to begin printing.
*
************************/
void print_sub()
{
        void     print_2sub(), align_it(), realign_it();
        double   rt_solve();

        cip_buffer          *p_half_image;              /*  -> reduced image */
        cia_21_16 fudge, *p_fudge;
```

```
        double    X_CEN, Y_CEN;        /* !!!!! CENTER FOR PSEUDO INVERSE !!!!! */

p_prob_1->good_search = FALSE;
p_prob_2->good_search = FALSE;

p_fudge = &fudge;
fudge.p.i = 0;
fudge.p.f = 0;

if (  ( !p_prob_1->mdl ) || ( !p_prob_2->mdl )  )
        {
        u_prompt ( PASS, "ERROR - NO SEARCH MODEL     Press 1 to continue." );
        }

else if ( pd_key == 1 )
        {
        caq_cpu ( );                          /* Enable access to frame grabber.
 */
        caq_constant ( CAQ_PASS );   /* Clear screen */
        caq_graphics ( );            /* Show the LIVE image and message */

        u_mess ( PASS, "AWAITING PRINT CYCLE");

        align_ok_state = FALSE ;
        while ( align_ok_state != TRUE )
                {
                test_attention();

                /* RESETTING INTERRUPTS 1,2,3 ONCE PER HOUR */

                if ( ctm_read( p_bug_timer ) > 3600000 )
                        {
                        ctm_begin( p_bug_timer );
                        printf ( " Resetting BUG TIMER\n" );
                        bug_reinit();
                        }
                }

        u_mess ( PASS, "PRINT CYCLE IN PROGRESS");

        while (( op_mode == MODE_PRINT ))
                {
                test_attention();

                /* ---------------------------------------- */

                if ( debug_mode == DEG_NO_PRINTER )
                        {
                        zoom_back ( IMAGE, caq_image, 50, 50 );
                        }
                                                /* ----------------------------
 */
                print_2sub( DEG_NORMAL ); /* search & calc for both probes */
                                                /* ----------------------------
 */
                if (
                        (p_prob_1->good_search ==TRUE)
                        && (p_prob_2->good_search ==TRUE)
                    )
                        {
                        align_it();          /* align in X, Y, & Theta */
                        }
```

```
                    align_ok_state = FALSE ;
                    u_mess ( PASS, "AWAITING PRINT CYCLE");

                    /* Wait for align-ok flag from parallel input 1 interrupt. */
                    while ( align_ok_state != TRUE )
                              {
                              test_attention();

                              /* RESETTING INTERRUPTS 1,2,3 ONCE PER HOUR */

                              if ( ctm_read( p_bug_timer ) > 3600000 )
                                        {
                                        ctm_begin( p_bug_timer );
                                        printf ( " Resetting BUG TIMER\n" );
                                        bug_reinit();
                                        }
                              }
                                   /* ---------------------------------------- */
/
                    realign_it(); /* Move to "home" location (if models found. */
                                   /* ---------------------------------------- */
/
                    u_mess ( PASS, "PRINT CYCLE    PROGRESS");
                    }
          }
realign_it();       /* Move back to "home" location ( if models found. ) */
}
/************************
* align_it
*
* ALIGN THE STENCIL OR SILKSCREEN TO THE CURRENT BOARD.
************************/
void align_it( )
{
toff = (
          (( p_pseudo->theta   - edit_offset.mil.t ) / p_t_axis->mps ) + ROUNDUP
        );
stepper ( p_t_axis, (-(toff)), 50000 );

xoff = (
          (( p_pseudo->coffs_x - edit_offset.mil.x ) / p_x_axis->mps ) + ROUNDUP
        );
stepper ( p_x_axis, (-(xoff)), 10000 );


yoff = (
          (( p_pseudo->coffs_y + edit_offset.mil.y ) / p_y_axis->mps ) + ROUNDUP
        );
stepper ( p_y_axis, (-(yoff)), 10000 );

if (
        ( toff <  1 ) && ( xoff <  50 ) && ( yoff <  50 )
    && ( toff > -1 ) && ( xoff > -50 ) && ( yoff > -50 )
    )
          {
          }
}
/************************
* realign_it
*
*         Move back to "home" location.
************************/
```

```
void realign_it( ).
{
if ( ( p_prob_1->good_search == TRUE ) && ( p_prob_2->good_search == TRUE ) )
        {
        stepper ( p_t_axis, ( (toff)), 50000 );
        stepper ( p_x_axis, ( (xoff)), 10000 );
        stepper ( p_y_axis,    (yoff)), 10000 );
        }
}
/************************
* print_2sub
*
*   2nd level of PRINT MODE.
*       Search & Math for BOTH probes.
************************/
void print_2sub( m_mode )

        int     m_mode;             /* Model mode - DBG_NORMAL or DBG_CORRELATE
 */
{
        void    print_2sub();
        double  p1_mpp_x, p1_mpp_y, p2_mpp_x, p2_mpp_y;

print_2sub( p_prob_1, m_mode );
print_2sub( p_prob_2, m_mode );

        cio_pulse_out( 1, 1, 100 ); /* P6 align done-100 ms */
        cio_pulse_out( 2, 1, 100 ); /* P6 align done-100 ms */

/* ************************************************************** */
/*                  PSEUDO-INVERSE COORDINATE TRANSFORM                  */
/* ************************************************************** */

printf ( " -- COORDINATE TRANSFORM --\n" );
/*
 NOTE : For screen correct only, Sub x diff, Add y diff.
*/
psc_init (  p_pseudo );
mode_scale = OFF;

if ( op_mode == MODE_PRINT )
        {
        psc_add (
                (p_prob_1->b_cart.pix.x * p_prob_1->bmpp.x),
                (p_prob_1->b_cart.pix.y * p_prob_1->bmpp.y),
                (( p_prob_1->b_cart.pix.x + p_prob_1->diff.pix.x )
                * p_prob_1->bmpp.x),
                (( p_prob_1->b_cart.pix.y + p_prob_1->diff.pix.y )
                * p_prob_1->bmpp.y),
                p_pseudo
                );
        psc_add (
                (p_prob_2->b_cart.pix.x * p_prob_2->bmpp.x),
                (p_prob_2->b_cart.pix.y * p_prob_2->bmpp.y),
                (( p_prob_2->b_cart.pix.x + p_prob_2->diff.pix.x )
                * p_prob_2->bmpp.x),
                (( p_prob_2->b_cart.pix.y + p_prob_2->diff.pix.y )
                * p_prob_2->bmpp.y),
                p_pseudo
                );
        }
```

```
else if ( m_mode == DBG_CORRELATE )
        {
        psc_add (
                (( p_prob_1->s_cart.pix.x ) * p_prob_1->mpp.x),
                (( p_prob_1->s_cart.pix.y ) * p_prob_1->mpp.y),
                (( p_prob_1->b_cart.pix.x ) * p_prob_1->bmpp.x),
                (( p_prob_1->b_cart.pix.y ) * p_prob_1->bmpp.y),
                p_pseudo
                );
        psc_add (
                (( p_prob_2->s_cart.pix.x ) * p_prob_2->mpp.x),
                (( p_prob_2->s_cart.pix.y ) * p_prob_2->mpp.y),
                (( p_prob_2->b_cart.pix.x ) * p_prob_2->bmpp.x),
                (( p_prob_2->b_cart.pix.y ) * p_prob_2->bmpp.y),
                p_pseudo
                );
        }
else
        {
        psc_add (
                (p_prob_1->s_cart.pix.x * p_prob_1->mpp.x),
                (p_prob_1->s_cart.pix.y * p_prob_1->mpp.y),
                (( p_prob_1->s_cart.pix.x + p_prob_1->diff.pix.x )
                * p_prob_1->mpp.x),
                (( p_prob_1->s_cart.pix.y + p_prob_1->diff.pix.y )
                * p_prob_1->mpp.y),
                p_pseudo
                );
        psc_add (
                (p_prob_2->s_cart.pix.x * p_prob_2->mpp.x),
                (p_prob_2->s_cart.pix.y * p_prob_2->mpp.y),
                (( p_prob_2->s_cart.pix.x + p_prob_2->diff.pix.x )
                * p_prob_2->mpp.x),
                (( p_prob_2->s_cart.pix.y + p_prob_2->diff.pix.y )
                * p_prob_2->mpp.y),
                p_pseudo
                );
        }

do_geom ( p_pseudo );
/*
show_geom ( p_pseudo );
*/
printf ( " -- TRANSFORM DONE --\n" );
}
/************************
* print_3sub
*
*   3rd level of PRINT MODE.
*       Search & Math for ONE probe.
************************/

        int     good_correlate;


void print_3sub( p_probe, m_mode )

        probe_parms     *p_probe; /* -> probe struct. */
        int             m_mode;         /* Model mode -
                                           DBG_NORMAL, DBG_CORRELATE */
{
        int     toff;                   /* Theta offset in motor steps. *
```

```
        int     mode;

set_camera( p_probe->camera, SPLIT_OFF, IMAGE_POSITIVE );
if ( !(p_probe->mdl) )
        {
        caq_mode->gain   = p_probe->gain;
        caq_mode->offset = p_probe->offset;
        }

cif_set_window ( 0, 0, 575, 447, cif_fg_window );

        /* ------------------------------- */
        /* Find/save current model position. */
        /* ------------------------------- */
p_prob_t->sea_parms  = &my_norm_search;
c2_search ( p_probe->mdl, p_probe, SEA_CURR1 );

rep_mode = rep_uefault;                 /* Diagnostic reporting to default mcds.*/

/* CALCULATE ANGULAR DISTANCE ( HYPOTENUSE ) FROM MODEL POSITION. */
p_probe->trig.p_rt3 = rt_init( p_probe->trig.p_rt3 );
p_probe->trig.p_rt3->SIDE_A = ( fabs( p_probe->diff.pix.x ));
p_probe->trig.p_rt3->SIDE_B = ( fabs( p_probe->diff.pix.y ));
rt_solve ( p_probe->trig.p_rt3 );

printf ("FINAL\n");
/* CALCULATE OFFSET ANGLE FROM MODEL POSITION. */
p_probe->trig.p_rt4 = rt_init ( p_probe->trig.p_rt4 );
p_probe->trig.p_rt4->SIDE_B   = p_probe->trig.p_rt2->HYPOTENUSE;
p_probe->trig.p_rt4->SIDE_A =
        ( p_probe->trig.p_rt3->HYPOTENUSE / 2.0 );
rt_solve ( p_probe->trig.p_rt4 );

toff = (2.0 * (((p_probe->trig.p_rt4->A_ACUTE) / p_t_axis->mps) +ROUNDUP ));
if ( p_probe->diff.pix.x < 0.0 )
        {
        toff = ( - ( toff ));
        }
/*
printf  (
         "\n ***** TANG = %f TOFF = %d\n",
           p_probe->trig.p_rt4->A_ACUTE,  toff
        );
*/
}
/************************
* user_align.
*
*       Correlate stencil to board using user defined windows.
*
************************/
void user_align (  )
{
        double   p1_mpp_x, p1_mpp_y, p2_mpp_x, p2_mpp_y;


/*
set_camera( CAMERA_1, SPLIT_ON, IMAGE_POSITIVE );
*/
set_camera( CAMERA_1, SPLIT_OFF, IMAGE_POSITIVE );

vid_setup();
```

```
/*
u_prompt ( PASS,
"STENCIL TO BOARD ALIGNMENT    Press 1 to continue." );

u_prompt ( PASS,
"Define STENCIL targets using trackball.    Press 1 to continue." );
*/

u_prompt ( PASS,
"Press 2 to size box,  Press 2 again to move box,   1 to continue." );
cif_set_window ( -1, -1, 100, 100, cif_fg_window );

set_camera( CAMERA_1, SPLIT_OFF, IMAGE_POSITIVE );
find_center ( &p_prob_1->s_cent );
test_attention();

set_camera( CAMERA_2, SPLIT_OFF, IMAGE_POSITIVE );
find_center ( &p_prob_2->s_cent );

set_camera( CAMERA_1, SPLIT_ON, IMAGE_POSITIVE );
caq_mode->gain   = p_prob_1->gain;
caq_mode->offset = p_prob_1->offset;
/*
u_prompt ( PASS,
"Set lights & focus to view board.    Press 1 when done."); 
*/
u_prompt ( PASS,
   "Remove stencil lights,  Turn board lights on & focus,  Press 1 to continue");

/*
u_prompt ( PASS,
"Define BOARD targets using trackball.    Press 1 to continue." );
*/
u_prompt ( PASS,
"Press 2 to size box,  Press 2 again to move box,   1 to continue." );

set_camera( CAMERA_1, SPLIT_OFF, IMAGE_POSITIVE );
caq_mode->gain   = p_prob_1->gain;
caq_mode->offset = p_prob_1->offset;
find_center ( &p_prob_1->b_cent );
test_attention();

set_camera( CAMERA_2, SPLIT_OFF, IMAGE_POSITIVE );
caq_mode->gain   = p_prob_2->gain;
caq_mode->offset = p_prob_2->offset;
find_center ( &p_prob_2->b_cent );


/*
 Decompensate the MPP values for probe angle.
 ---------------------------------------------
*/

p_rt = &rt_0;

p_rt = rt_init ( p_rt );
p_rt->A_ACUTE = p_prob_1->probe_angle;
p_rt->HYPOTENUSE = p_prob_1->mpp.x;
rt_solve ( p_rt );
p1_mpp_x = p_rt->SIDE_B;

p_rt = rt_init ( p_rt );
```

```
p_rt->A_ACUTE = p_prob_1->probe_angle;
p_rt->HYPOTENUSE = p_prob_1->mpp.y;
rt_solve ( p_rt );
p1_mpp_y = p_rt->SIDE_B;

p_rt = rt_init ( p_rt );
p_rt->A_ACUTE = p_prob_2->probe_angle;
p_rt->HYPOTENUSE = p_prob_2->mpp.x;
rt_solve ( p_rt );
p2_mpp_x = p_r   `SIDE_B;

p_rt = rt_init ( p_rt );
p_rt->A_ACUTE = p_prob_2->probe_angle;
p_rt->HYPOTENUSE = p_prob_2->mpp.y;
rt_solve ( p_rt );
p2_mpp_y = p_rt->SIDE_B;


psc_init (  p_pseudo );
psc_add (
          (( p_prob_1->s_cart.pix.x + p_prob_1->s_cent.x ) * p_prob_1->mpp.x ),
          (( p_prob_1->s_cart.pix.y + p_prob_1->s_cent.y ) * p_prob_1->mpp.y ),

          (  ( p_prob_1->s_cart.pix.x * p_prob_1->mpp.x)
           + ( p_prob_1->b_cent.x     * p_prob_1->mpp.x)
          ),
          (  ( p_prob_1->s_cart.pix.y * p_prob_1->mpp.y)
           + ( p_prob_1->b_cent.y     * p_prob_1->mpp.y)
          ),
          p_pseudo
          );
psc_add (
          (( p_prob_2->s_cart.pix.x - p_prob_2->s_cent.x ) * p_prob_2->mpp.x ),
          (( p_prob_2->s_cart.pix.y + p_prob_2->s_cent.y ) * p_prob_2->mpp.y ),

          (  ( p_prob_2->s_cart.pix.x * p_prob_2->mpp.x)
           - ( p_prob_2->b_cent.x     * p_prob_2->mpp.x)
          ),
          (  ( p_prob_2->s_cart.pix.y * p_prob_2->mpp.y)
           + ( p_prob_2->b_cent.y     * p_prob_2->mpp.y)
          ),
          p_pseudo
          );
show_geom ( p_pseudo );
/*
show_geom ( p_pseudo );
*/

toff = (( p_pseudo->theta   / p_t_axis->mps ) + ROUNDUP );
 stepper ( p_t_axis, ( (toff)), 50000 );
xoff = (( p_pseudo->coffs_x / p_x_axis->mps ) + ROUNDUP );
 stepper ( p_x_axis, ( (xoff)), 10000 );
yoff = (( p_pseudo->coffs_y / p_y_axis->mps ) + ROUNDUP );
 stepper ( p_y_axis, ( (yoff)), 10000 );

}
/************************
* find_cal_steps.
*
*         Calculate maximum size of cal move.
*         ( varies with distance between probes. )
*
```

```
************************/
void find_cal_steps( p_probe )

        probe_parms         *p_probe; /* -> probe struct. */
{
        double              Xdiff, Ydiff;       /* Difference of locations 1 & 2.
*/
        double              xrat, yrat;            Ratio of max to theta. */

        double              brd_x, brd_y;       /* Float values for window size. *
/

stepper ( p_t_axis, p_t_axis->def_cal_steps, 50000 );
quik_delay();  /* TEMP */
p_prob_1->sea_parms  = &my_norm_search;
c3_search ( p_probe->smdl, p_probe, SEA_CURR1 ); /* Find 1ST model position */

stepper ( p_t_axis, ( - ( 2 * (p_t_axis->def_cal_steps))), 100000 );
quik_delay();  /* TEMP */
p_prob_1->sea_parms  = &my_norm_search;
c3_search ( p_probe->smdl, p_probe, SEA_CURR2 ); /* Find 2ND model position */

stepper ( p_t_axis, p_t_axis->def_cal_steps, 50000 );     /* back to home *
quik_delay();  /* TEMP */

Xdiff = ( fabs ( p_probe->diff.pix.x ));  /* DIFFERENCE OF LOCATIONS 1 & 2. *
Ydiff = ( fabs ( p_probe->diff.pix.y ));

/* --- ??????????????????????????? --- */
/* ------ SOLVE LOCAL TRIANGLE ------ */
p_probe->trig.p_rt1 = rt_init( p_probe->trig.p_rt1 );
p_probe->trig.p_rt1->SIDE_A = Ydiff;
p_probe->trig.p_rt1->SIDE_B = Xdiff;
printf (" --- THETA CALCULATION ---\n");
p_t_axis->pel_delta = rt_solve ( p_probe->trig.p_rt1 );
/* --- ??????????????????????????? --- */

brd_x = board_x + 100.0;     brd_y = board_y + 100.0;

if ( Xdiff > Ydiff )
        {
        xrat = ( (576.0 - (brd_x ) ) / Xdiff );
        p_t_axis->cal_steps = p_t_axis->def_cal_steps * xrat ;
        }
else
        {
        yrat = ( (488.0 - (brd_y ) ) / Ydiff );
        p_t_axis->cal_steps = p_t_axis->def_cal_steps * yrat ;
        }

if ( p_t_axis->cal_steps > 16000 )
        {
        p_t_axis->cal_steps = 16000;
        }

printf ( " ---------------------------\n" );
printf ( " Theta cal steps = %d\n", p_t_axis->cal_steps );
printf ( " Theta cal xdiff = %f",   Xdiff );
printf ( " Theta cal ydiff = %f\n", Ydiff );
printf ( " Theta cal xrat  = %f",   xrat );
printf ( " Theta cal yrat  = %f\n", yrat );
printf ( " Theta cal tdiff = %f", p_t_axis->pel_delta );
```

```
printf ( " Theta cal steps = %d\n", p_t_axis->cal_steps );
printf ( " ----------------------------\n" );
}
/*************************
* board_probe_geometry.
*
*        Calc. ate board geometry for one probe.
*
*        Used to calculate the board mil/per/pixel values for a set of probes.
*
*************************/
void board_probe_geometry( p_probe )

        probe_parms         *p_probe; /* -> probe struct. */
{
        double              fabs( ),  rt_solve( ),  et_solve( );
        void                soft_delay( );

        t_angle             *rt_init( );
        et_angle  *et_init( );
        double              Xdiff, Ydiff;       /* Difference of locations 1 & 2.
*/

        double              new_angle, sign = 1.0;

p_x_axis->mil_delta = 50.0;
p_y_axis->mil_delta = 50.0;

set_camera( p_probe->camera, SPLIT_OFF, IMAGE_POSITIVE );
sprintf ( mess,
        "** BOARD GEOMETRY **  Probe %d  **  Press 1 to continue **",
        p_probe->camera );
u_prompt ( PASS, mess );

sprintf ( mess,
        "Probe %d  MPP  X = %f  Y = %f",
        p_probe->camera, p_probe->bmpp.x, p_probe->bmpp.y );
u_prompt ( PASS, mess );

manual_align( p_probe->camera );
set_camera( p_probe->camera, SPLIT_OFF, IMAGE_POSITIVE );

/* ********* */
/* *** X *** */
/* ********* */

p_tp = &tri_model;          /* set -> training parameters. */
probe_teach( p_probe );

sprintf ( mess,
    " Move board %f mils to the left of center.   1 to continue **",
    p_x_axis->mil_delta );
u_prompt ( PASS, mess );
c3_search ( p_probe->mdl, p_probe, SEA_CURR1 ); /* Find 1ST model position */

sprintf ( mess,
    " Move board %f mils to the right of center.  1 to continue **",
    p_x_axis->mil_delta );
u_prompt ( PASS, mess );
c3_search ( p_probe->mdl, p_probe, SEA_CURR2 ); /* Find 2ND model position */

Xdiff = ( fabs ( p_probe->diff.pix.x ));  /* DIFFERENCE OF LOCATIONS 1 & 2. */
Ydiff = ( fabs ( p_probe->diff.pix.y ));
```

```
/* -------------------- */
/* ---- PROBE   LE ---- */
/* ----------  -------- */
p_probe->trig.p_rt0 = rt_init( p_probe->trig.p_rt0 );
p_probe->trig.p_rt0->SIDE_A = Xdiff;
p_probe->trig.p_rt0->SIDE_B = Ydiff;
p_x_axis->pel_delta = rt_solve ( p_probe->trig.p_rt0 );   /* Solve triangle */
p_probe->probe_angle = p_probe->trig.p_rt0->A_ACUTE;

/* ------------------------ */
/* --- SET MPP FOR BOARD --- */
/* ------------------------ */

p_probe->bmpp.x = ( ( 2.0 * p_x_axis->mil_delta ) / p_x_axis->pel_delta );

/* ********* */
/* *** Y *** */
/* ********* */

sprintf ( mess,
      "** BOARD GEOMETRY **  Probe %d  **  Press 1 to continue **",
      p_probe->camera );
u_prompt ( PASS, mess );

sprintf ( mess,
    " Move board %f mils to the rear of center.   1 to continue **",
    p_y_axis->mil_delta);
u_prompt ( PASS, mess );
c3_search ( p_probe->mdl, p_probe, SEA_CURR1 ); /* Find 1ST model position */

sprintf ( mess,
    " Move board %f mils to the front of center.   1 to continue **",
    p_y_axis->mil_delta );
u_prompt ( PASS, mess );
c3_search ( p_probe->mdl, p_probe, SEA_CURR2 ); /* Find 2ND model position */

Xdiff = ( fabs ( p_probe->diff.pix.x ));  /* DIFFERENCE OF LOCATIONS 1 & 2. */
Ydiff = ( fabs ( p_probe->diff.pix.y ));

/* -------------------- */
/* ---- PROBE ANGLE ---- */
/* -------------------- */
p_probe->trig.p_rt0 = rt_init( p_probe->trig.p_rt0 );
p_probe->trig.p_rt0->SIDE_A = Xdiff;
p_probe->trig.p_rt0->SIDE_B = Ydiff;
p_y_axis->pel_delta = rt_solve ( p_probe->trig.p_rt0 );   /* Solve triangle */
p_probe->probe_angle = p_probe- trig.p_rt0->A_ACUTE;

/* ------------------------ */
/* --- SET MPP FOR BOARD --- */
/* ------------------------ */

p_probe->bmpp.y = ( ( 2.0 * p_y_axis->mil_delta ) / p_y_axis->pel_delta );

sprintf ( mess,
          "Probe %d  MPP  X = %f  Y = %f",
          p_probe->camera, p_probe->bmpp.x, p_probe->bmpp.y );
u_prompt ( PASS, mess );

;
/**********************
* x_geometry.
```

```
*
*       Calculate X axis geometry for one probe.
*
************************/
void x_geometry( p_probe )

        probe_parms         *p_probe; /* -> probe struct. */
{
        double              fabs( ),  rt_solve( ),  et_solve( );
        void                soft_delay( );

u_mess ( PASS, mess );

        caq_mode->gain   = p_probe->s_gain;
        caq_mode->offset = p_probe->s_offset;

stepper ( p_x_axis, p_x_axis->cal_steps, 50000 );
quik_delay();       /* TEMP */
p_prob_1->sea_parms  = &my_norm_search;
c3_search ( p_probe->smd1, p_probe, SEA_CURR1 ); /* Find 1ST model position *

stepper ( p_x_axis, ( - ( 2 * (p_x_axis->cal_steps))), 50000 );
quik_delay();  /* TEMP */
p_prob_1->sea_parms  = &my_norm_search;
c3_search ( p_probe->smd1, p_probe, SEA_CURR2 ); /* Find 2ND model position */

stepper ( p_x_axis, p_x_axis->cal_steps, 50000 );   /* back to home */
quik_delay();       /* TEMP */

}
/************************
* y_geometry.
*
*       Calculate Y axis geometry for one probe.
*
************************/
void y_geometry( p_probe )

        probe_parms         *p_probe; /* -> probe struct. */
{
        double              fabs( ),  rt_solve( ),  et_solve( );
        void                soft_delay( );

u_mess ( PASS, mess );

        caq_mode->gain   = p_probe->s_gain;
        caq_mode->offset = p_probe->s_offset;

stepper ( p_y_axis, p_y_axis->cal_steps, 25000 );
quik_delay();  /* TEMP */
p_prob_1->sea_parms  = &my_norm_search;
c3_search ( p_probe->smd1, p_probe, SEA_CURR1 ); /* Find 1ST model position *

stepper ( p_y_axis, ( - ( 2 * (p_y_axis->cal_steps))), 25000 );
quik_delay();  /* TEMP */
p_prob_1->sea_parms  = &my_norm_search;
c3_search ( p_probe->smd1, p_probe, SEA_CURR2 ); /* Find 2ND model position *
stepper ( p_y_axis, p_y_axis->cal_steps, 25000 );   /* back to home */
quik_delay();       /* TEMP */
}
/************************
* probe_geometry.
```

```
*
*        Calculate geometry for one probe.
*
*************************/
void probe_geometry( p_probe )

        probe_parms         *p_probe; /* -- probe struct. */
{
        double              fabs( ),  rt_solve( ),  et_solve( );
        void                soft_delay( );

        t_angle             *rt_init( );
        et_angle  *et_init( );
        double              Xdiff, Ydiff;      /* Difference of locations 1 & 2.
*/

        double              new_angle, sign = 1.0;

printf ("** PROBE_GEOMETRY 0 **\n");

sprintf ( mess,
    " PLEASE DON'T TOUCH PRINTER,   Calculating geometry - probe %d, axis X",
     p_probe->camera );

set_camera( p_probe->camera, SPLIT_OFF, IMAGE_POSITIVE );


/* ********* */
/* *** X *** */
/* ********* */

x_geometry ( p_probe );

Xdiff = ( fabs ( p_probe->diff.pix.x ));  /* DIFFERENCE OF LOCATIONS 1 & 2. */
Ydiff = ( fabs ( p_probe->diff.pix.y ));

/* -------------------- */
/* ---- PROBE ANGLE ---- */
/* -------------------- */
p_probe->trig.p_rt0 = rt_init( p_probe->trig.p_rt0 );
p_probe->trig.p_rt0->SIDE_A = Xdiff;
p_probe->trig.p_rt0->SIDE_B = Ydiff;
printf (" --- PROBE ANGLE --- %d\n");
p_x_axis->pel_delta = rt_solve( p_probe->trig.p_rt0 );   /* Solve triangle */
p_probe->probe_angle = p_probe->trig.p_rt0->A_ACUTE;

/* ---------------------------- */
/* --- PIXEL/STEP               --- */
/* --- DISTANCE MOVED IN MILS   --- */
/* --- MIL/PIXEL.               --- */
/* ---------------------------- */
/* --- FOR STENCIL --- */
p_x_axis->pps = ( Xdiff / ( 2 * p_x_axis->cal_steps ));
p_x_axis->mil_delta = ( ( 2 * p_x_axis->cal_steps ) * p_x_axis->mps );
p_probe->mpp.x = ( p_x_axis->mil_delta / Xdiff );
/* --- SET MPP FOR BOARD --- */
/*
p_probe->bmpp.x = 0.472713;
p_probe->bmpp.x = ( p_probe->mpp.x * ( 1.0 / p_scale->fx_percent ));
*/
```

```
/* ********* */
/* *** Y *** */
/* ********* */

sprintf ( mess,
    " PLEASE DON'T TOUCH PRINTER,   Calculating geometry - probe %d, axis Y",
    p_probe->camera );

y_geometry( p_probe );

Xdiff = ( fabs ( p_probe->diff.pix.x ));  /* DIFFERENCE OF LOCATIONS : % 1. -
Ydiff = ( fabs ( p_probe->diff.pix.y ));

/* --------------------- */
/* ---- PROBE ANGLE ---- */
/* --------------------- */
p_probe->trig.p_rt5 = rt_init( p_probe->trig.p_rt5 );
p_probe->trig.p_rt5->SIDE_B = Ydiff;
p_probe->trig.p_rt5->SIDE_A = Xdiff;
printf (" --- PROBE ANGLE ---\n");
p_y_axis->pel_delta = rt_solve ( p_probe->trig.p_rt5 );   /* Solve triangle */
p_probe->probe_angle = p_probe->trig.p_rt5->A_ACUTE;

/* ----------------------------- */
/* --- PIXEL/STEP            --- */
/* --- DISTANCE MOVED IN MILS --- */
/* --- MIL/PIXEL.            --- */
/* ----------------------------- */
/* --- FOR STENCIL --- */
p_y_axis->pps = ( Ydiff / ( 2 * p_y_axis->cal_steps ));
p_y_axis->mil_delta = ( ( 2 * p_y_axis->cal_steps ) * p_y_axis->mps );
p_probe->mpp.y = ( p_y_axis->mil_delta / Ydiff );

/* --- SET MPP FOR BOARD --- */


/*
p_probe->bmpp.y = 0.465715;
p_probe->bmpp.y = ( p_probe->mpp.y * ( 1.0 / p_scale->fy_percent ));
*/


printf ("  X mpp = %f  ",   p_probe->mpp.x );
printf ("  Y mpp = %f  \n", p_probe->mpp.y );
printf ("  X dmpp = %f  ",   p_probe->dmpp.x );
printf ("  Y dmpp = %f  \n", p_probe->dmpp.y );


/* ------------------------------------ */
/*  PROBE ANGLE COMPENSATION - X & Y MPP */
/* ------------------------------------ */
p_rt = &rt_0;

new_angle = fa_  ( p_probe-. probe_angle );

. *
if ( new_angle > 45.0 )
        {
        new_angle = ( 90.0 - new_angle );
        }
*/
```

```
p_rt = rt_init ( p_rt );
p_rt->A_ACUTE = new_angle;
p_rt->SIDE_B  = p_probe->dmpp.x;
p_probe->bmpp.x = rt_solve ( p_rt );

p_rt = rt_init ( p_rt );
p_rt->A_ACUTE = new_angle;
p_rt->SIDE_B  = p_probe->dmpp.y;
p_probe->bmpp.y = rt_solve ( p_rt );


/*
p_rt = rt_init ( p_rt );
p_rt->A_ACUTE = new_angle;
p_rt->HYPOTENUSE = p_probe->dmpp.x;
rt_solve ( p_rt );
p_probe->bmpp.x = p_rt->SIDE_A;

p_rt = rt_init ( p_rt );
p_rt->A_ACUTE = new_angle;
p_rt->HYPOTENUSE = p_probe->dmpp.y;
rt_solve ( p_rt );
p_probe->bmpp.y = p_rt->SIDE_B;
*/


printf ("  X bmpp = %f  ",   p_probe->bmpp.x );
printf ("  Y bmpp = %f  \n", p_probe->bmpp.y );

/* ---------------------------------- */
/* - TEMP - TEMP - TEMP - TEMP - TEMP - */
/* ---------------------------------- */

/*
p_probe->bmpp.y = 0.465715;
p_probe->bmpp.x = 0.472718;
*/

/* ---------------------------------- */
/* - TEMP - TEMP - TEMP - TEMP - TEMP - */
/* ---------------------------------- */


    /* BACKLASH IN MILS. */


/* ************* */
/* *** THETA *** */
/* ************* */
sprintf ( mess,
    " PLEASE DON'T TOUCH PRINTER,   Calculating SCALE - probe %d, axis %c",
    p_probe->camera );
u_mess ( PASS, mess );

find_cal_steps( p_probe );

sprintf ( mess,
    " PLEASE DON'T TOUCH PRINTER,   Calculating geometry - probe %d, axis %c",
    p_probe->camera );
u_mess ( PASS, mess );

stepper ( p_t_axis, p_t_axis->cal_steps, 50000 );
quik_delay(1);  /* TEMP */
```

```
p_prob_1->sea_parms  = &my_norm_search;
c3_search ( p_probe->smd1, p_probe, SEA_CURR1 ); /* Find 1ST model position */

stepper ( p_t_axis, ( - ( 2 * (p_t_axis->cal_steps))), 200000 );
quik_delay();  /* TEMP */
p_prob_1->sea_parms  = &my_norm_search;
c3_search ( p_probe->smd1, p_probe, SEA_CURR2 ); /* Find 2ND model position */

stepper ( p_t_axis, p_t_axis->cal_steps, 50000 );        /* back to home */
quik_delay();  /* TEMP */
quik_delay();  /* TEMP */
quik_delay();      /* TEMP */

Xdiff = ( fabs ( p_probe->diff.pix.x ));  /* DIFFERENCE OF LOCATIONS 1 & 2. */
Ydiff = ( fabs ( p_probe->diff.pix.y ));


/* ------------------------------------- */
/* !!! LOCK IN STENCIL HOME COORDINATES !!! */
/* ------------------------------------- */

p_prob_1->sea_parms  = &my_norm_search;
c3_search ( p_probe->smd1, p_probe, SEA_SHOME );
p_prob_1->sea_parms  = &my_norm_search;
c3_search ( p_probe->smd1, p_probe, SEA_SHOME );



/* --- SOLVE LOCAL TRIANGLE --- */
p_probe->trig.p_rt1 = rt_init( p_probe->trig.p_rt1 );
p_probe->trig.p_rt1->SIDE_A = Ydiff;
p_probe->trig.p_rt1->SIDE_B = Xdiff;
printf (" --- THETA CALCULATION ---\n");
p_t_axis->pel_delta = rt_solve ( p_probe->trig.p_rt1 );   /* Solve triangle */
/* ---------------------------------- */

/*  --- THETA PART 2 --- */
         /* NOTE : THETA MPS IS ACTUALLY *DEGREES* PER STEP */

/* ---- SOLVE GLOBAL TRIANGLE - ----- */
p_probe->trig.p_rt2 = rt_init( p_probe->trig.p_rt2 );
p_probe->trig.p_rt2->SIDE_A = ( p_probe->trig.p_rt1->HYPOTENUSE / 2.0 );
p_probe->trig.p_rt2->A_ACUTE = ( ( p_t_axis->cal_steps * p_t_axis->mps ) );
p_t_axis->pel_delta = rt_solve ( p_probe->trig.p_rt2 );   /* Solve triangle */
/*  --- THETA PART 2A --- */

         /* NOTE : MPS IS ACTUALLY DEGREES PER STEP */


/* ---- RE-SOLVE GLOBAL TRIANGLE ---- */
/*
p_probe->trig.p_et0 = et_init( p_probe->trig.p_et0 );
p_probe->trig.p_et0->SIDE_C = p_probe->trig.p_rt1->HYPOTENUSE;
p_probe->trig.p_et0->ANGLE_C = (( p_t_axis->cal_steps * 2.0 ) * p_t_axis->mps );
p_t_axis->pel_delta = et_solve ( p_probe->trig.p_et0 );
*/

/* ---------------------------------- */

printf (" ----------------------------\n");
}
/*********************
```

```
* cart_signs.
*
*        Force proper arithmetic signs for each quadrant.
*
*************************/


        double x2, y2;


void s_cart_signs()
{
x2 = p_prob_2->s_cart.pix.x;
if ( x2 > 0.0 ) { p_prob_2->s_cart.pix.x = -p_prob_2->s_cart.pix.x; }
y2 = p_prob_2->s_cart.pix.y;
if ( y2 > 0.0 ) { p_prob_2->s_cart.pix.y = -p_prob_2->s_cart.pix.y; }

x2 = p_prob_1->s_cart.pix.x;
if ( x2 < 0.0 ) { p_prob_1->s_cart.pix.x = -p_prob_1->s_cart.pix.x; }
y2 = p_prob_1->s_cart.pix.y;
if ( y2 > 0.0 ) { p_prob_1->s_cart.pix.y = -p_prob_1->s_cart.pix.y; }
}

  /* ----------- */

void b_cart_signs()
{
x2 = p_prob_2->b_cart.pix.x;
if ( x2 > 0.0 ) { p_prob_2->b_cart.pix.x = -p_prob_2->b_cart.pix.x; }
y2 = p_prob_2->b_cart.pix.y;
if ( y2 > 0.0 ) { p_prob_2->b_cart.pix.y = -p_prob_2->b_cart.pix.y; }

x2 = p_prob_1->b_cart.pix.x;
if ( x2 < 0.0 ) { p_prob_1->b_cart.pix.x = -p_prob_1->b_cart.pix.x; }
y2 = p_prob_1->b_cart.pix.y;
if ( y2 > 0.0 ) { p_prob_1->b_cart.pix.y = -p_prob_1->b_cart.pix.y; }
}
/************************
* calc_geometry.
*
*       Calculate the unit measure per pixel values and the theta step
*        units of measure for both video probes.
*
*        Conv . all linear measurements to uni. measure prior to probe
*        correlation.
*
*        Solve the oblique triangle described by the locations of the two
*        video probes relative to the center of theta rotation.
*
*
*                                    .
*                                    .   center of theta
*                                    . /
*                  . . . . . . . . . . . . . . . . . . . .
*                                  ...
*                                 . . .
*                                . . .
*                               . 2 . 1 .
*                              .     .     .
*                           a .      .      . b
*                            .       .       .
```

```
*                          .       .       .
*                         .       .       .
*              probe 1   x . . . . . . . . . x    probe 2
*                                  .
*                                  .
*
*                  angle 1 => p_prob_1->trig.p_rt1->A_ACUTE
*                  angle 2 => p_prob_2->trig.p_rt1->A_ACUTE
*
*                  side a => ( p_prob_1->trig.p_rt2->HYPOTENUSE )
*                  side b => ( p_prob_2->trig.p_rt2->HYPOTENUSE )
*              OR
*                  side a => ( p_prob_1->trig.p_rt1->HYPOTENUSE / 2 )
*                  side b => ( p_prob_2->trig.p_rt1->HYPOTENUSE / 2 )
*
*************************/

void calc_geometry()
{
        u_char    off_save;
        u_char    gain_save;

good_correlate = TRUE;

u_prompt ( PASS,
        "SET Manual Axis Adjust switch to OFF     Press 1 to continue." );

/* ~~~~ */

/* ------------------------ .


p_prob_1->dmpp.x = 0.3846153;
p_prob_1->dmpp.y = 0.3773584;
p_prob_1->bmpp.x = 0.3846153;
p_prob_1->bmpp.y = 0.3773584;

probe_geometry ( p_prob_1 ); /* Calc probe # 1 geometry */

p_prob_2->dmpp.x = 0.3952569;
p_prob_2->dmpp.  = 0.3891050;
p_prob_2->bmpp.  = 0.3952569;
p_prob_2->bmpp.y = 0.3891050;

probe_geometry ( p_prob_2 ); /* Calc probe # 2 geometry */

set_camera( CAMERA_1, SPLIT_OFF, IMAGE_POSITIVE );

/* ---------------------------------- */
/* ---- 2 PROBES & THETA CENTER ----- */
/* ---------------------------------- */

/*
 --------------------
  Calculate cartesian coordinates of the probes ( in PIXELS )
  Calc Y from radius then calc X from Y.
 --------------------
*/
/*
 --------
  STENCIL
 --------
```

```
*/
p_prob_1->s_cart.pix.y =
        (
        ( p_prob_1->trig.p_rt2->HYPOTENUSE )
        * sin( ( 90.0 - p_prob_1->trig.p_rt1->A_ACUTE ) / F
        );
 p_prob_1->s_cart.pix.x =
        (
        ( p_prob_1->s_cart.pix.y )
        / tan( ( 90.0 - p_prob_1->trig.p_rt1->A_ACUTE ) / 1
        );

p_prob_2->s_cart.pix.y =
        (
        ( p_prob_2->trig.p_rt2->HYPOTENUSE )
        * sin( ( -90.0 + p_prob_2->trig.p_rt1->A_ACUTE ) /
        );
 p_prob_2->s_cart.pix.x =
        (
        ( p_prob_2->s_cart.pix.y )
        / tan( ( -90.0 + p_prob_2->trig.p_rt1->A_ACUTE ) /
        );

  /*
  Force proper arithmetic signs for each quadrant.
  */
s_cart_signs();

/*
 ------
  BOARD
 ------
*/
p_prob_1->b_cart.pix.y = ( p_prob_1->s_cart.pix.y - p_prob_
p_prob_1->b_cart.pix.x = ( p_prob_1->s_cart.pix.x - p_prob_

p_prob_2->b_cart.pix.y = ( p_prob_2->s_cart.pix.y - p_prob_
p_prob_2->b_cart.pix.x = ( p_prob_2->s_cart.pix.x - p_prob_
  /*
  Force proper arithmetic signs for each quadrant.
  */
b_cart_signs();



  /*
  Convert cartesian coordinates of the probes TO MILS.
  */
p_prob_1->s_cart.mil.y = ( p_prob_1->s_cart.pix.y * p_prob_1->mpp.y );
p_prob_1->s_cart.mil.x = ( p_prob_1->s_cart.pix.x * p_prob_1->mpp.x );
p_prob_2->s_cart.mil.y = ( p_prob_2->s_cart.pix.y * p_prob_2->mpp.y );
p_prob_2->s_cart.mil.x = ( p_prob_2->s_cart.pix.x * p_prob_2->mpp.x );

p_prob_1->b_cart.mil.y = ( p_prob_1->b_cart.pix.y * p_prob_1->mpp.y );
p_prob_1->b_cart.mil.x = ( p_prob_1->b_cart.pix.x * p_prob_1->mpp.x );
p_prob_2->b_cart.mil.y = ( p_prob_2->b_cart.pix.y * p_prob_2->mpp.y );
p_prob_2->b_cart.mil.x = ( p_prob_2->b_cart.pix.x * p_prob_2->mpp.x );


          /* ------------------------------------- */
 /*
 if ( debug_mode != DBG_NO_PRINTER )
```

```
*/
if ( debug_mode == DBG_NO_PRINTER )
        {
        printf ("\n\nDEBUG MODE = MODE CORRELATE\n\n");

        print_2sub( DBG_CORRELATE ); /* search & calc for both probes */


  /* SCALE CORRECT ( mil/pixel deg/pixel ) GOES HERE */
  /* SCALE CORRECT ( board/stencil ) GOES HERE */

  /* CORRELATION MOVE SHOULD BE BASED ON HALF THE CORRECTED OFFSET ( coff ) */

  /* ?? CORRECT "HOME" POSITION ( TO THE BOARD) BASED ON THE SCALED DIFF ?? */
  /* OR REPLACE THE SCREEN "HOME" WITH ACTUAL BOARD POSITION */

        xoff = ( -xoff );
        yoff = ( yoff );
        toff = ( -toff );


        align_it();

        p_prob_1->s_home.pix.y += p_prob_1->diff.pix.y;
        p_prob_1->s_home.pix.x += p_prob_1->diff.pix.x;
        p_prob_1->s_home.pix.t += p_prob_1->diff.pix.t;

        p_prob_1->s_home.pix.y += p_prob_1->diff.pix.y;
        p_prob_1->s_home.pix.x += p_prob_1->diff.pix.x;
        p_prob_1->s_home.pix.t += p_prob_1->diff.pix.t;

        debug_mode =DBG_NORMAL;

        }
        /* ------------------------------------- */
/*************  ******************************************************
* zaa.def                                                  Feb. 89
*
*       Consolidation of the cognex search definitions.
*
*****************************************************************/



char    map_normal[256] =
        {
        -1, -1, -1, -1, -1, -1, -1, -1, -1, -1,
        -1, -1, -1, -1, -1, -1, -1, -1, -1, -1,

  20,   21,   22,   23,   24,   25,   26,   27,   28,   29,
  30,   31,   32,   33,   34,   35,   36,   37,   38,   39,
  40,   41,   42,   43,   44,   45,   46,   47,   48,   49,
  50,   51,   52,   53,   54,   55,   56,   57,   58,   59,
  60,   61,   62,   63,   64,   65,   66,   67,   68,   69,
  70,   71,   72,   73,   74,   75,   76,   77,   78,   79,
  80,   81,   82,   83,   84,   85,   86,   87,   88,   89,
  90,   91,   92,   93,   94,   95,   96,   97,   98,   99,

 100,  101,  102,  103,  104,  105,  106,  107,  108,  109,
 110,  111,  112,  113,  114,  115,  116,  117,  118,  119,
```

```
120,  121,  122,  123,  124,  125,  126,  127,  128,  129,
130,  131,  132,  133,  134,  135,  136,  137,  138,  139,
140,  141,  142,  143,  144,  145,  146,  147,  148,  149,
150,  151,  152,  153,  154,  155,  156,  157,  158,  159,
160,  161,  162,  163,  164,  165,  166,  167,  168,  169,
170,  171,  172,  173,  174,  175,  176,  177,  178,  179,
180,  181,  182,  183,  184,  185,  186,  187,  188,  189,
190,  191,  192,  193,  194,  195,  196,  197,  198,  199,

200,  201,  202,  203,  204,  205,  206,  207,  208,  209,
210,  211,  212,  213,  214,  215,  216,  217,  218,  219,
220,  221,  222,  223,  224,  225,  226,  227,  228,  229,
230,  231,  232,  233,  234,  235,  236,  237,  238,  239,
240,  241,  242,  243,  244,  245,  246,  247,  248,  249,
250,  251,  252,  253,  254,  255,

/*
        0,  1,  2,  3,  4,  5,  6,  7,  8,  9,
        10, 11, 12, 13, 14, 15, 16, 17, 18, 19,
        20, 21, 22, 23, 24, 25, 26, 27, 28, 29,
        30, 31,  32, 33, 34, 35, 36, 37, 38, 39,
        40, 41,  42, 43, 44, 45, 46, 47, 48, 49,
        50, 51,  52, 53, 54, 55, 56, 57, 58, 59,
        60, 61,  62, 63,

        0, 0, 0, 0, 0, 0, 0, 0, 0, 0,
        0, 0, 0, 0, 0, 0, 0, 0, 0, 0,
        0, 0, 0, 0, 0, 0, 0, 0, 0, 0,
        0, 0,

        0, 0, 0, 0, 0, 0, 0, 0, 0, 0,
        0, 0, 0, 0, 0, 0, 0, 0, 0, 0,
        0, 0, 0, 0, 0, 0, 0, 0, 0, 0,
        0, 0,

        0, 0, 0, 0, 0, 0, 0, 0, 0, 0,          0, 0, 0, 0, 0, 0, 0, 0, 0, 0,
        0, 0, 0, 0, 0, 0, 0, 0, 0, 0,          0, 0, 0, 0, 0, 0, 0, 0, 0, 0,
        0, 0, 0, 0, 0, 0, 0, 0, 0, 0,          0, 0, 0, 0, 0, 0, 0, 0, 0, 0,
        0, 0, 0, 0, 0, 0, 0, 0, 0, 0,          0, 0, 0, 0, 0, 0, 0, 0, 0, 0,

        0, 0, 0, 0, 0, 0, 0, 0, 0, 0,          0, 0, 0, 0, 0, 0, 0, 0, 0, 0,
        0, 0, 0, 0, 0, 0, 0, 0, 0, 0,          0, 0, 0, 0, 0, 0, 0, 0, 0, 0,

        0, 0, 0, 0, 0, 0,
*/

        };
char    *p_map_normal = &map_normal[0];


char    map_mirror[256] =
        {
         0,  1,  2,  3,  4,  5,  6,  7,  8,  9,
        10, 11, 12, 13, 14, 15, 16, 17, 18, 19,
        20, 21, 22, 23, 24, 25, 26, 27, 28, 29,
        30, 31,

        31, 31, 31, 31, 31, 31, 31, 31,
        31, 31, 31, 31, 31, 31, 31, 31, 31, 31,
```

```
        31, 31, 31, 31, 31, 31, 31, 31, 31, 31,
        31, 31, 31, 31, 31, 31, 31, 31, 31, 31,
        31, 31, 31, 31, 31, 31, 31, 31, 31, 31,
        31, 31, 31, 31, 31, 31, 31, 31, 31, 31,
        31, 31, 31, 31, 31, 31, 31, 31, 31, 31,

        0, 0, 0, 0, 0, 0, 0, 0, 0, 0,          0, 0, 0, 0, 0, 0, 0, 0, 0, 0,
        0, 0, 0, 0, 0, 0, 0, 0, 0, 0,          0, 0, 0, 0, 0, 0, 0, 0, 0, 0,
        0, 0, 0, 0, 0, 0, 0, 0, 0, 0,          0, 0, 0, 0, 0, 0, 0, 0, 0, 0,
        0, 0, 0, 0, 0, 0, 0, 0, 0, 0,          0, 0, 0, 0, 0, 0, 0, 0, 0, 0,
        0, 0, 0, 0, 0, 0, 0, 0, 0, 0,          0, 0, 0, 0, 0, 0, 0, 0, 0, 0,

        0, 0, 0, 0, 0, 0, 0, 0, 0, 0,          0, 0, 0, 0, 0, 0, 0, 0, 0, 0,
        0, 0, 0, 0, 0, 0, 0, 0, 0, 0,          0, 0, 0, 0, 0, 0, 0, 0, 0, 0,

        0, 0, 0, 0, 0, 0,

        };
char    *p_map_mirror = &map_mirror[0];


/*
-------------------
 search model                DELETED
-------------------
*/
/*
-------------------
search parameters  DELETED
-------------------
*/
/*
-------------------
search results              DELETED
-------------------
*/

cse_results        search_results;     /* Global search results structure. */
cse_results        *p_results;         /* -> results structure. */

/*
-------------------
training parametersDELETED
-------------------
*/
/*
-------------------
training results   DELETED
-------------------
*/

/*
---------------------------
 MODEL TRAINING DEFINITIONS
---------------------------
*/
        /* --------------- */
        /* FOR NORMAL MODEL */
        /* --------------- */
ctr_params trl_model =
        {
        64,       /* gray levels */
```

```
        0,          /* leniency */
        FALSE,      /* do/don't measure angle */
        5,          /* bias - normal */
        1,          /* left tail % */
        1,          /* right tail % */
        50,         /* threshold % between tails */
        1,1,        /* model resolution */
        FALSE,      /* Flag - 'READ' model = FALSE */
        };
ctr_params tr2_model =
        {
        64,         /* grey levels */
        0,          /* leniency */
        FALSE,      /* do/don't measure angle */
        5,          /* bias - normal */
        1,          /* left tail % */
        1,          /* right tail % */
        50,         /* threshold % between tails */
        1,1,        /* model resolution */
        FALSE,      /* Flag - 'READ' model = FALSE */
        };

        /* ---------------- */
        /* FOR STENCIL MODEL */
        /* ---------------- */
ctr_params tr1_stmodel =
        {
        64,         /* grey levels */
        0,          /* leniency */
        FALSE,      /* do/don't measure angle */
        5,          /* bias - normal */
        1,          /* left tail % */
        1,          /* right tail % */
        50,         /* threshold % between tails */
        1,1,        /* model resolution */
        FALSE,      /* Flag - 'READ' model = FALSE */
        };
ctr_params tr2_stmodel =
        {
        64,         /* grey levels */
        0,          /* leniency */
        FALSE,      /* do/don't measure angle */
        5,          /* bias - normal */
        1,          /* left tail % */
        1,          /* right tail % */
        50,         /* threshold % between tails */
        1,1,        /* model resolution */
        FALSE,      /* Flag - 'READ' model = FALSE */
        };

        /* --------------- */
        /* FOR SCREEN MODEL */
        /* --------------- */
ctr_params tr1_scmodel =
        {
        64,         /* grey levels */
        0,          /* leniency */
        FALSE,      /* do/don't measure angle */
        5,          /* bias - normal */
        1,          /* left tail % */
        1,          /* right tail % */
        50,         /* threshold % between tails */
```

```
        1,1,        /* model resolution */
        FALSE,      /* Flag - 'READ' model = FALSE */
        };
ctr_params tr2_scmodel =
        {
        64,         /* grey levels */
        0,          /* leniency */
        FALSE,      /* do/don't measure angle */
        5,          /* bias - normal */
        1,          /* left tail % */
        1,          /* right tail % */
        50,         /* threshold % between tails */
        1,1,        /* model resolution */
        FALSE,      /* Flag - 'READ' model = FALSE */
        };

        /* ---------------- */
        /* FOR MIRROR MODEL */
        /* ---------------- */
ctr_params tr1_mmodel =
        {
        64,         /* grey levels */
        0,          /* leniency */
        FALSE,      /* do/don't measure angle */
        5,          /* bias - normal */
        1,          /* left tail % */
        1,          /* right tail % */
        50,         /* threshold % between tails */
        1,1,        /* model resolution */
        FALSE,      /* Flag - 'READ' model = FALSE */
        };
ctr_params tr2_mmodel =
        {
        64,         /* grey levels */
        0,          /* leniency */
        FALSE,      /* do/don't measure angle */
        5,          /* bias - normal */
        1,          /* left tail % */
        1,          /* right tail % */
        50,         /* threshold % between tails */
        1,1,        /* model resolution */
        FALSE,      /* Flag - 'READ' model = FALSE */
        };


/*
----------------------------
 SEARCH REPORTING PARAMETERS
----------------------------
*/
float pixel_cal = 1.0;       /* UNIT MEASURE PER PIXEL VALUE */
int search_dp = 2; /* 2 digits to the right of the decimal point */


/*
--------------------
 SEARCH DECLARATIONS
--------------------
*/
        /* ---------------- */
        /* FOR NORMAL MODEL */
```

```
        /* ---------------- */
cse_params my_norm_search =
        {
        cse_normalized,     /* NCS - Normalized Correlation Search */
        cse_normalized,     /* NCV - Normalized Correlation Value */
        FALSE,              /* do/don't measure angle */
        FALSE,              /* COGNEX WON'T TELL US WHAT THIS VARIABLE IS ! */
        1,                  /* # of features to find */
        300,      /* Value to determine if feature is found */
        999,                /* Threshold of confusion */
        };

my_norm_search.pm.c = cse_pm_make;

        /* ---------------- */
        /* FOR STENCIL MODEL */
        /* ---------------- */
cse_params my_sten_search =
        {
        cse_normalized,     /* NCS - Normalized Correlation Search */
        cse_normalized,     /* NCV - Normalized Correlation Value */
        FALSE,              /* do/don't measure angle */
        FALSE,              /* COGNEX WON'T TELL US WHAT THIS VARIABLE IS ! */
        1,                  /* # of features to find */
        300,      /* Value to determine if feature is found */
        999,                /* Threshold of confusion */
        };

my_sten_search.pm.c = cse_pm_make;

        /* ---------------- */
        /* FOR SCREEN MODEL */
        /* ---------------- */
cse_params my_scrn_search =
        {
        cse_normalized,     /* NCS - Normalized Correlation Search */
        cse_normalized,     /* NCV - Normalized Correlation Value */
        FALSE,              /* do/don't measure angle */
        FALSE,              /* COGNEX WON'T TELL US WHAT THIS VARIABLE IS  */
        1,                  /* # of features to find */
        300,      /* Value to determine if feature is found */
        999,                /* Threshold of confusion */
        };

my_scrn_search.pm.c = cse_pm_make;


/*
my_norm_search.pm.p = &map_normal[0];
my_norm_search.pm.c = cse_pm_make;
my_norm_search.pm.c = cse_pm_none;
*/

        /* ---------------- */
        /* FOR MIRROR MODEL */
        /* ---------------- */
cse_params mmy_norm_search =
        {
        cse_normalized,     /* NCS - Normalized Correlation Search */
        cse_normalized,     /* NCV - Normalized Correlation Value */
        FALSE,              /* do/don't measure angle */
        FALSE,              /* COGNEX WON'T TELL US WHAT THIS VARIABLE IS  */
```

```
        1,                      /* # of features to find */
        300,                    /* Value to determine if feature is found */
        999,                    /* Threshold of confusion */
        };

mmy_norm_search.pm.c = cse_pm_make;


/*
mmy_norm_search.pm.p = &map_mirror[0];
mmy_norm_search.pm.c = cse_pm_make;
my_norm_search.pm.c = cse_pm_none;
*/


ctr_params *p_tp = &tri_model;                  /*  -> training parameters. */
cse_params *p_sparms = &my_norm_search;         /*  -> search parameters. */
/*************************************************************
* search.v                                                  20 Jan. 89
*
*       Modified version of Cognex Search ver 1.1.
*
*************************************************************/


/************************
* dump_models
*
*       Free all models associated with a probe structure.
*
************************/
void dump_models ( )

{

if( p_prob_1->mdl != 0 )
        { ctr_delete_model( p_prob_1->mdl ); p_prob_1->mdl = 0;}
if( p_prob_1->mmdl != 0 )
        { ctr_delete_model( p_prob_1->mmdl ); p_prob_1->mmdl = 0;}
if( p_prob_1->smdl != 0 )
        { ctr_delete_model( p_prob_1->smdl ); p_prob_1->smdl = 0;}

if( p_prob_2->mdl != 0 )
        { ctr_delete_model( p_prob_2->mdl ); p_prob_2->mdl = 0;}
if( p_prob_2->mmdl != 0 )
        { ctr_delete_model( p_prob_2->mmdl ); p_prob_2->mmdl = 0;}
if( p_prob_2->smdl != 0 )
        { ctr_delete_model( p_prob_2->smdl ); p_prob_2->smdl = 0;}

}
/************************
* sear_init
*
*       Init search & 'probe' structures.
*
************************/
void sear_init()
{
/* The following allocates space for 10 results structs if needed. */
/*
if ( p_results )
        {
```

```
        free( p_results );
        }
p_results = ( cse_results *) cvc_alloc (p_sparms->results * ( 10 * sizeof (cse_res
ults)));
*/
/* The following is a global results struct & pointer. */
p_results = &search_results;

/* Init pointers to search model POSITION DATA structures. */
p_prob_1 = &probe_1;
p_prob_2 = &probe_2;

/* Init camera #'s in model POSITION DATA structures. */
p_prob_1->camera = 1;
p_prob_2->camera = 2;
p_prob_1->sea_ ms  = &my_norm_search;
p_prob_2->sea_parms  = &my_norm_search;
}


/*      ************************
        *                      *
        *  Utility Functions   *
        *                      *
        ************************
*/

/************************
* search_outline
*
*       Draw a box around the alignment target where it was found in
*       the acquired image.
*
*       Assumes that the frame grabber is in CPU access mode.
*
************************/

void search_outline ( image, model, results, c )

   cip_buffer      *image;            /* -> The image that was searched */
   cse_model       *model;            /* -> The search model. */
   cse_results     *results; /* -> The search results */
   int             c;                 /* the grey level for the outline */
{
   cip_buffer model_match;  /* A window of the image that is the same size
                               as the model and positioned where the model
                               was found. */

/*
The position of the upper left corner = the reported position - model origin,
rounded to the nearest pixel.
*/
cip_window ( image,
             &model_match,
             CIA_RND16 ( results->x.n - model->x0.n * model->prx ),
             CIA_RND16 ( results->y.n - model->y0.n * model->pry ),
             model->image->width * model->prx,
             model->image->height * model->pry
           );

cgr_outline ( &model_match, c );       /* Outline the alignment target. */
```

```
/************************
* search_cross
*
*        Show where a model was found in an image by drawing a crosshair
*        at the model origin. The cross is prevented from overlapping the
*        the edges of the image.
*
************************/

void search_cross ( image, model, results, c )
  cip_buffer    *image;            /* -> The   age that was searched */
  cse_model     *model;            /* -> The search model. */
  cse_results   *results; /* -> The search results */
  int           c;                 /* the grey level for the cross */
{
  int     x, y,    /* The search position, rounded to the nearest pixel. */
  harm, varm;              /* The horizontal and vertical arm sizes. */

    /*  Get the center of the cross-hair in pixels. */
x = CIA_RND16 ( results->x.n );
y = CIA_RND16 ( results->y.n );

    /*  Calculate the sizes of the cross-hair arms in pixels. */
harm = model->image->width  / 3 + 1;
varm = model->image->height / 3 + 1;

cgr_cross ( image, x, y, harm, varm, c );       /* Draw the cross-hair *
}

/************************
* custom_cursor_update
*
*        Custom cursor cif_pd Update routine. Erase cursor, draw new one
*        and update the window.
*
*        The default cursor cif_fg_cursor refreshes the display of the
*        cursor position as the trackball is moved. You may want to
*        refresh a window outline or some other graphics in addition to
*        the cursor. This can be done by creating another instance of the
*        standard cursor pointing device, but with a custom update
*        routine. In the customized cursor below, the update routine
*        displays the outline of the window that was used for training
*        the model as well as the new cursor position indicating model's
*        origin.
************************/

cif_pd *custom_cursor;                /* Global pointer to a customized cursor */

/************************/
/************************/
/*
   Make another cursor pointing device. cif_make_cursor uses
   the default start, update, track functions.
*/
custom_cursor = cif_make_cursor ( caq_image, caq_mode );
/************************/
/************************/


void custom_cursor_update ( x, y, p_pd )
  int x, y;
  cif_pd *p_pd;    /* -> The pointer device structure */
{
  cif_iv_cursor *cursor_iv;
```

```
if ( !p_pd ) { cct_error ( CGEN_ERR_BADARG ); }

/* ---------------------------------------- */
cursor_iv = (r''_iv_cursor *) p_pd->function_iv

/* ---------------------------------------- */

/* Erase old cursor */

caq_cpu ( );
cgr_cross ( p_pd->display,
            p_pd->x,                p_pd->y,
            cursor_iv->x_arm,       cursor_iv->y_arm,
            CAQ_PASS
          );

p_pd->x = x;                        /* save new cursor position  */
p_pd->y = y;

/* Draw new cursor */

cgr_cross ( p_pd->display,
            p_pd->x,                p_pd->y,
            cursor_iv->x_arm,       cursor_iv->y_arm,
            cursor_iv->color
          );
cgr_outline ( IMAGE, CAQ_BLACK );
caq_graphics ( );
}


/*************************/
/*************************/
    /* Attach the new update routine and set the color to blink */
custom_cursor->update = custom_cursor_update;
((cif_iv_cursor *) custom_cursor->function_iv)->color = CAQ_BLINK;
/*************************/
/*************************/


/*************************
* c3_train                  * Train second level *
*
*         The train command.
*         The window must already be positioned by "BOX" or equivalent.
*         The model must not already exist.
*
*************************/

cse_model *c3_train ( origin, flag_model )

   bool origin;             /* Flag - Do/don't train origin. */
   int    flag_model;       /* flag - TRUE => not mirror model */
{
   cse_model       *mdl;    /* temp pointer to the model */
   int             x0, y0;  /* box coordinates */
       /* Train origin if requested */
   /*
   if ( origin )
        {
            printf ( "Position the model origin.\n" );
            cip_ _ rlap ( caq_image, IMAGE, &x0, &   );
            custo__cursor->x = x0 + IMAGE->width / _;
            custom_cursor->y = y0 + IMAGE->height / 2;
```

```
            custom_cursor->track( custom_cursor );
            }
 */

 if ( flag_model == TRUE )
            {
            caq_acquire (caq_mode);
            }
 else       { caq_cpu(); }


 /*
 Train the model, and set the origin to be at the UL corner. Note that
 we use the whole field of view as the scene (caq_image). Note also that
 the origin is specified with 16 bits to the right of the binary point,
 and we want for example the X origin to equal 1/2 the model's width, so
 we shift the width left by 15.
 */

 printf ( "-----------------------------------------------\n" );


 chp_stats();        /* ***** TEMP ***** */


 mdl = ctr_model ( IMAGE, caq_image, 0, NO, p_tp, 0 );

 if ( origin == TRUE )
            {
            ctr_origin ( mdl,
                         ( ( mdl->image->width  / 2 ) << 16 ),
                         ( ( mdl->image->height / 2 ) << 16 )
                       );
            }
else
            {
            ctr_origin ( mdl,
                         0,
                         0
                       );
            }
return mdl;          /* Return      the model. */
}

/************************
* chek_window
*
*         Test for legal window size.
*
************************/
int chek_window()
{
   void    wait_tb3_bi(),     menu_tiny();
   int stat;

if ( IMAGE->width  < 5 )   { IMAGE->width  = 5; }
if ( IMAGE->height < 5 )   { IMAGE->height = 5; }
if ( IMAGE->width > 256 )  { IMAGE->width  = 256; }

if ( ( IMAGE->width * IMAGE->height ) > 65536 )
            {
            stat = FALSE;
            IMAGE->height = ( 65536 / IMAGE->width );
            }
```

```
else
        {
        stat = TRUE;
        }
if ( IMAGE->height > 488 )   { IMAGE->height = 488; }
if ( stat == FALSE )
        {
        strcpy ( mess,
        "   WINDOW SCALED DOWN TO LIMITS                Press 1 to continue. " ;
        menu_tiny ( mess, NO_OP );   /* Display prompt, background ignored */
        wait_tb3_b1 ( );             /* Wait for key #1 */
        }
return ( stat );
}
/*************************
* tr_model
* --------
*       * TRAIN TOP LEVEL *
*
*       Train search model.
*       The window must already be positioned by "BOX" or equivalent.
*
*************************/
cse_model *tr_model ( p_model, flag_model )

        cse_model *p_model; /*  ->  the search model */
        int                 flag_model;        /* flag - TRUE => not mirror model
 */
{
        int       w_stat;

w_stat = FALSE;

if ( flag_model == TRUE )
        {
        }

if ( cct_catch( CTR_ERR_NOFEATURE ) || cct_catch( CTR_ERR_BADSCENE ) )
        {
        u_prompt (NO_OP, "NO FEATURE FOUND TO TRAIN   Press 1 to continue" );
        p_model = 0;

        cct_throw( TRAN_ERR_NOOBJECT );

        }
else
        {
        p_model = c3_train ( TRUE, flag_model );
        return( p_model );           /* Return -> the model. */
        cct_end ( CTR_ERR_NOFEATURE );
        }
/*************************
* c3_search
*
*       Search for model in image, display and print results.
*       Return pointer to results structure.
*
*************************/
cse_results *c3_search ( p_mdl, p_probe, loc_num )

        cse_model *p_mdl;            /*  -> The search model. */
        probe_parms        *p_probe; /*  -> Probe position data struct. *

        int                loc_num;  /* Location   SEA_BHOME  SEA_SHOME
                                                              SEA_CURR1  SEA_CUR
```

```
R2 */
{
        void      pd_flush(),        over_tiny();

        csa_results *sr,  *psr;      /* A place to put search results */
        int n;                       /* loop counter */
        double    X,  Y;             /* result values converted to floats. */
        int       XI, YI;            /* result values converted to integers. */


caq_acquire ( caq_mode);
csa_area_search ( IMAGE, p_mdl, p_probe->sea_parms, p_results );

/*
  CONVERT RESULT VALUES FROM FIXED POINT TO FLOATING POINT.
*/
X = CIA_FLOAT16 ( p_results->x.n );
Y = CIA_FLOAT16 ( p_results->y.n );

/*
  ------------------------
  STORE BOARD HOME POSITION
  ------------------------
*/
if ( loc_num == SEA_BHOME )
        {
        p_probe->b_home.pix.x = X;   /* STORE BOARD HOME POSITION. */
        p_probe->b_home.pix.y = Y;
        }
else if ( loc_num == SEA_SHOME )
        {
        p_probe->s_home.pix.x = X;   /* STORE SCREEN HOME POSITION. */
        p_probe->s_home.pix.y = Y;
        }

/*
  --------------------------------
  SAVE THE NEW ( CURRENT ) POSITION
  --------------------------------
*/
if ( ( loc_num == SEA_BHOME ) || ( loc_num == SEA_SHOME ) )
        {
        p_probe->curl.pix.x = X;       /* NEW = ORIGINAL */
        p_pr   ->curl.pix.y = Y;
        }
if ( loc_num == SEA_CURR1 )
        {
        p_probe->curl.pix.x = X;     /* NEW # 1. */
        p_probe->curl.pix.y = Y;
        }
else if ( loc_num == SEA_CURR2 )
        {
        p_probe->cur2.pix.x = X;     /* NEW # 2. */
        p_probe->cur2.pix.y = Y;
        }
/* ------------------------------- */


/*
  ------------------
  SAVE THE DIFFERENCE
  ------------------
*/
```

```
if (( op_mode == MODE_GEOM ) || ( op_mode == MODE_MAINTAIN ))
        {
        p_probe->diff.pix.x = ( p_probe->cur1.pix.x - p_probe->cur2.pix.x );
        p_probe->diff.pix.y = ( p_probe->cur1.pix.y - p_probe->cur2.pix.y );

        if ( loc_num == SEA_SHOME )  /* CORRELATION */
                {
                p_probe->diff.pix.x =
                        ( p_probe->b_home.pix.x - p_probe->s_home.pix.x );
                p_probe->diff.pix.y =
                        ( p_probe->b_home.pix.y - p_probe->s_home.pix.y );
                }
        }
else if ( op_mode == MODE_PRINT )
        {
        p_probe->diff.pix.x = ( p_probe->b_home.pix.x - p_probe->cur1.pix.x );
        p_probe->diff.pix.y = ( p_probe->b_home.pix.y - p_probe->cur1.pix.y );
        }
else if ( op_mode == MODE_TEACH )
        {
        p_probe->diff.pix.x = ( p_probe->s_home.pix.x - p_probe->cur1.pix.x );
        p_probe->diff.pix.y = ( p_probe->s_home.pix.y - p_probe->cur1.pix.y );
        }
/* ---------------------------------- */

/*
  ------------------------------------
  CONVERT THE PIXEL DIFFERENCE TO MILS
  ------------------------------------
*/
p_probe->diff.mil.x = ( p_probe->diff.pix.x * p_probe->mpp.x );
p_probe->diff.mil.y = ( p_probe->diff.pix.y * p_probe->mpp.y );

/*
  ----------------------------------------
  CONVERT THE MIL DIFFERENCE TO MOTOR STEPS
  ----------------------------------------
*/
p_probe->diff.step.x = ( p_probe->diff.mil.x / p_x_axis->mps );
p_probe->diff.step.y = ( p_probe->diff.mil.y / p_y_axis->mps );


/*
 Draw the boxes and crosses for all features found.
*/
for ( n = 0, psr = p_results;
      n < p_probe->sea_parms->results && psr->found;
      ++n, ++psr
    )
        {
        search_outline ( IMAGE, p_mdl, psr, 63);
        search_cross   ( IMAGE, p_mdl, psr, 63);
                /* Draw cross-hair */

        XI = p_probe->b_home.pix.x;
        YI = p_probe->b_home.pix.y;
        cgr_cross ( IMAGE,  XI, YI,  50, 50, 63 );

        over_tiny ( mess, NO_OP );   /* Re-Display latest user message. */
        }
caq_display ();

/*
```

```
Save the shape and contrast scores.
*/
p_probe->shape    = p_results->score;
p_probe->contrast = cse_contrast ( p_mdl, p_results );

/*
Print the search result information
*/
if ( rep_mode == MODE_VERBOSE )
    {
    for ( n = 0, psr = p_results;
            n < p_probe->sea_parms->results && psr->found;
            ++n, ++psr
          )
          {
          printf ("Shape = %4d, contrast = %4.2f at (%6.*f,%6.*f) in %4d ms.\n",
                    psr->score,
                    cse_contrast ( p_mdl, psr ),
                    search_dp,
                    CIA_FLOATIS ( psr->x.n ) * pixel_cal,
                    search_dp,
                    CIA_FLOATIS ( psr->y.n ) * pixel_cal,
                    psr->time
                  );
          }
    }
if ( rep_mode >= MODE_TERSE )
          {
          for ( n = 0, psr = p_results;
                n < p_probe->sea_parms->results && psr->found;
                ++n, ++psr
              )
                    {
          printf ( "Shape = %4d, contrast = %4.2f\n",
                              psr->score,  cse_contrast ( p_mdl, psr )
                            );
                    }
          }

if ( !n )
          {
          printf ( "Object not found; shape = %4d, time = %4d ms.\n",
                    p_results->score,p_results->time
          p_probe->good_search = FALSE;
          p_probe->diff.pix.x = 0.0;   p_probe->diff.pix.y = 0.0;

          cct_throw( SEAR_ERR_NOTFOUND );

          }
else
          {
          p_probe->good_search = TRUE;
          }

if ( rep_mode == MODE_VERBOSE )
          {
          printf (
                    "  X+ = %4.2f Y+ = %4.2f\n",
                    p_probe->diff.pix.x,          p_probe->diff.pix.y
                  );
          }
}
```

```
/*****************************************************************
* util.v                                                  21 Feb. 89
*
*                          THREE AXIS ALIGNMENT SYSTEM
*                              Copyright  (C) 1987
*                                MPM CORPORATION
*                                71  WEST STREET,
*                                 MEDFIELD MASS.
*
*
* MPM utility functions.
*
*****************************************************************/


   double parm, inc_val, limit;
   char            parm_name[80];


/************************
* did_it_move
*
*        Test to see if a move really happened. This is required because
*        the operator can forget to set the " Manual Axis Adjust " switch.
*
*        Test for ( both of ) 2 floats less than a third float.
*
* Returns:        TRUE if either of the 2 exceeds the third, else FALSE.
************************/
int did_it_move( diffx, diffy, tolerance )

         double   diffx, diffy, tolerance;
{
         int      ret_val = FALSE;

if (( fabs(diffx) > tolerance ) || ( fabs(diffy) > tolerance ))
         {
         ret_val = TRUE;
         }

return( ret_val );
}
/************************
* get_pass
*        Get/test password.
* Returns:        0 if legal password, else non-0.
************************/
int get_pass()
{
         char     super_pass[20];              /* Supervisor password. */

         int      r = FALSE, key, key_count, good_pass, max_keys = 9;

key_count = 0;
sprintf( mess, " PASSWORD - %d of %d keys entered.",
         key_count, max_keys );
u_mess ( PASS, mess );
while ( key_count < max_keys )
         {
         key = 0;
         get_tb3_data();
         if (   _key == 1 ) { key = '1'; }
         if ( pd_key == 2 ) { key = '2'; }
         if ( pd_key == 4 ) { key = '3'; }
         if ( key != 0)
```

```
                {
                super_pass[key_count++]=key;
                sprintf( mess, " PASSWORD - %d of %d keys entered.",
                        key_count, max_keys );
                u_mess ( PASS, mess );
                }
        }
super_pass[key_count++] = 0;
r = strcmp( super_pass, "33311211" );
if ( r == 0 ) { good_pass = TRUE; }
printf( "%s", super_pass );
return( good_pass );
}
/*************************
* option_init
*       Test for options present, set/reset option present flags,
*       init option hardware.
*************************/
int option_init()
{
        char    motor_mess[80];
        int     r = TRUE, i;
        int     flag1 = FALSE, flag2 = FALSE;

r = cio_read_in();
r &= 0x30;
if ( r != 0x30 )
        {
        flag1 = FALSE;
/*
        cct_throw( UTIL_ERR_OPTION );
*/
        }
else    {
        flag1 = TRUE;
        strcpy( motor_mess, "/2D1000-G" );
        fputs ( motor_mess, fp_comm2 );
        printf ( "%s",motor_mess );

        for( i = 1; i > 0; i-- ) { ; }
        r = cio_read_in();
        r &= 0x30;
        if ( r != 0 )
                {
                flag2 = FALSE;
                }
        else    {
                flag2 = TRUE;
                }
        quik_delay();

        strcpy( motor_mess, "/2D1000+G" );
        fputs ( motor_mess, fp_comm2 );
        printf ( "%s",motor_mess );
        quik_delay();
        }
if ( ( flag1 == FALSE ) || ( flag2 == FALSE ))
        {
        cct_throw( UTIL_ERR_OPTION );
        }
};
/*************************
* vid_setup
*       Auto-adjust video gain and offset ( interactive ).
*************************/
```

```
int vid_setup()
{
        int     r;

vid_setup2();


/*
r = ccal_video_setup ( caq_image, vidcal_parms );
if ( r == FALSE )
        {
        cct_throw( UTIL_ERR_GAINOFF );
        }
*/

};
/************************
* vid_setup2
*       Auto-adjust video gain and offset in SPLIT mode ( interactive ).
************************/

#define ACCEPT      -1

int vid_setup2()
{
        int     r = FALSE;
        char    parm_name[20];

while ( TRUE )
        {
        r = ccal_video_setup ( caq_image, vidcal_parms );
        if ( r == TRUE ) { break; }

        strcpy( mess,
              "CAN'T AUTO-GAINOFF,   1 to Repeat, 2 for Manual, 3 to Accept" );
        u_mess ( PASS, mess );
        while ( TRUE )
                {
                pd_key = 0;
                get_tb3_data();
                if      ( pd_key == 1 )     { r = TRUE;  break; }
                else if ( pd_key == 2 ) { r = FALSE; break; }
                else if ( pd_key == 4 ) { r = ACCEPT;  break; }
/*
                else if ( pd_key == 4 ) { cct_throw( UTIL_ERR_GAINOFF ); }
*/
                }
        if ( ( r == FALSE ) || ( r == ACCEPT )) { break; }
        }
if ( r == FALSE )
        {
/*
        strcpy( mess,"CAN'T AUTO-GAINOFF,  1 to set gain & offset manually" );
        u_prompt ( PASS, mess );
*/
        strcpy ( parm_name, "GAINOFF");
        new_gain2 = iparm_alter
                    ( caq_mode->gain, parm_name, 1, 200, &caq_mode->gain );
        new_gain2 = new_gain = caq_mode->gain;
        new_off2  = new_off  = caq_mode->offset;

        clear_mess ( );
        sprintf( mess, "CAMERA   GAIN = %d , OFFSET = %d   1 to continue",
                 new_gain2, new_off2 );
        u_prompt ( PASS, mess );
```

```
};
/*************************
* flicker
*         User alignment aid - alternates camera 1 & 2.
*************************/
int flicker()
{
         void      get_tb3_data();

u_mess = CAQ_PASS,
         "** ALTERNATING CAMERAS      1 to exit." );
go();
}
int go_delay()
{
 int      i;

for ( i = 400; i > 0; i-- ) { ; }
}

int go_loop = 0;

int go()
{
pd_flush();
for ( go_loop = 0; go_loop < 10000; go_loop++ )
         {
         caq_mode->split = 0;
         caq_mode->camera = 1;
         go_delay(); go_delay(); go_delay(); go_delay(); go_delay();
         get_tb3_data();
         if ( pd_key == 1 )
                  {
                  caq_cpu();
                  caq_constant(CAQ_PASS);
                  break;
                  }

         caq_mode->camera = 2;
         go_delay(); go_delay(); go_delay(); go_delay(); go_delay();
         get_tb3_data();
         if ( pd_key == 1 )
                  {
                  caq_cpu();
                  caq_constant(CAQ_PASS);
                  break;
                  }

         }
caq_mode->camera = 1;
};

 ************************
* u_prompt
*         Prompt user with centered message.
************************/
int u_prompt ( background, in_string )

         char   *  *in_string;
         int       background;        /* Set background - NO_OP, PASS */
{
         void      wait_tb3_bi(), str_center();

str_center ( in_string, mess, 70 );
```

```
menu_tiny ( mess, background );
wait_tb3_b1 ( );              /* Wait for key #1 */
}
/*************************
* loop_prompt
*         Prompt user with centered message.
*         !! DOES NOT FLUSH TRACKBALL !!
*************************/
void loop_prompt ( background, in_string )

          char      *in_string;
          int       background;        /* Set background - NO_OP, PASS */
{
          void      wait_tb3_b1(), str_center();

str_center ( in_string, mess, 70 );
menu_tiny ( mess, background );
loop_tb3_b1 ( );              /* Wait for key #1 WITHOUT FLUSH */
}
/*************************
* u_mess
*         Display centered user message.
*************************/
void u_mess ( background, in_string )

          char      *in_string;
          int       background;        /* Set background - NO_OP, PASS */
{
          void      str_center();
if (( PANIC == TRUE )||( panic_button == TRUE ))
          {
          panic_button = FALSE;
          cct_throw( IO_ERR_ATTENTION );        /* NOT ERROR - VISION ATTENTION SW
 */
          }
str_center ( in_string, mess, 70 );
menu_tiny ( mess, background );
}
/*************************
* clear_mess
*
*         Clear the user message array.
*
*************************/
void clear_mess ( )
{
sprintf( mess,
                                                                        "");
}
/*************************
* clear_prompt
*
*         Clear the user message window.
*
*************************/
void clear_prompt ( )
{
          void      clear_mess();

clear_mess ( );
menu_tiny ( mess, NO_OP );
}
/*************************
* str_center
```

```
*         Center a char string in an array of "out_length".
************************/
void str_center ( in_string, out_string, out_length )

          char      *in_string;
          char      *out_string;
          int       out_length;
{
          int       i;
          int       str_length, preamble, postamble;
          char      copy_string[100];

if ( strlen ( in_string ) > 1 )
          {
          strcpy ( copy_string, in_string );
          strcpy ( out_string, "" );
          str_length = (strlen ( copy_string ) );
          preamble = (( out_length - str_length ) / 2 );
          postamble = ( out_length - ( preamble + str_length ));
          for ( i = 0; i < preamble; i++ ) { strcat ( out_string, " " ); }
          strcat ( out_string, copy_string );
          for ( i = 0; i < postamble; i++ ) { strcat ( out_string, " " ); }
          }
}
/************************
* mess_switches
*
*         Prompt user about Cognex back pannel switches.
*
************************/
void      mess_switches( )
{
   void   u_prompt();

u_prompt ( NO_...,
          "COGNEX BACK PANEL SWITCHES SHOULD ALL BE OFF.  Press 1 when ready. ";
}
/************************
* show_common
*
*         Show the shared GP image buffer.
************************/
void      show_common()
{
          void      wait_tb3_b1();

cag_cpu ( );
cag_constant ( CAO_PASS );   /* Clear screen */
cip_copy ( gp_image, cag_image );

cag_graphics ( );
wait_tb3_b1 ( );
}
/************************
* no_op   no_op_i   no_op_d
*
*         Do nothing functions - used to overlay unwanted function pointers.
************************/
void      no_op()   { }
int       no_op_i() { }
double    no_op_d() { }
/************************
* gp_init
*
*         General purpose init function.
```

```
*
************************/
void   -   gp_init()
{
p_bug_timer = &bug_timer;     /* Timer for Cognex INT bug. */
ctm_begin( p_bug_timer );

vidcal_parms->lt_pct = 2.0;
vidcal_parms->rt_pct = 2.0;
vidcal_parms->lt_grey = 20;
vidcal_parms->rt_grey = 45;
vidcal_parms->serves = 10;

p_pseudo = &pseudo;

p_x_axis = &x_axis; p_y_axis = &y_axis; p_t_axis = &t_axis;

p_prob_1 = &probe_1;          p_prob_2 = &probe_2;
p_prob_1->camera = 1;         p_prob_2->camera = 2;

p_prob_1->gain     = 60;      p_prob_1->offset     = 7;
p_prob_2->gain     = 60;      p_prob_2->offset     = 7;
p_prob_1->def_gain = 60;      p_prob_1->def_offset = 7;
p_prob_2->def_gain = 60;      p_prob_2->def_offset = 7;
caq_mode->gain   = p_prob_1->gain;
caq_mode->offset = p_prob_1->offset;
/*
edit_backlash.mil.x = 0.0;
edit_backlash.mil.y = 0.0;
edit_backlash.mil.t = 0.0044415;
*/
}
/************************
* new_gainoff.
*
************************/

void new_gainoff( off__in, gain__in )

        u_char    off__in;
        u_char    gain__in;
{

/*
old__off = caq_mode->offset;
old__gain = caq_mode->gain;

new__off = off__in;
new__gain = gain__in;

caq_mode->offset = off__in;
caq_mode->gain = gain__in;
*/

}
/************************
* old_gainoff.
*
************************/

void old_gainoff( )
{

/*
```

```
caq_mode->offset = old__off;
caq_mode->gain = old__gain;
*/

}

/*************************
* parm_edit
*
*        User tool for editing floatin point parameters.
*************************/
double parm_edit( parm, parm_name, inc_val, limit )

   double parm, inc_val, limit;
   char            parm_name[];
{
   void get_tb3_data(), menu_tiny(), clear_mess();
   char edit_mess[80];

pd_flush();
strcpy ( edit_mess,
"2 to increase  3 to decrease    1 to continue");

clear_mess ( );
sprintf( mess, " %s = %f   %s", parm_name, parm, edit_mess );
u_mess ( NO_OP, mess );

pd_key = 0;
while ( ! ( pd_key == 1 ) )
         {
         get_tb3_data ( );   /* Read Cignet 3 button trackball */
         if ( pd_key == 1 )
                  {
         ---      break;
                  }
         if ( pd_key == 2 )
                  {
                  parm += inc_val;
                  }
         else if ( ( pd_key == 4 ) )
                  {
                  parm -= inc_val;
                  }
         if ( pd_key != 0 )
                  {
                  if ( parm > limit )
                           {
                           parm = limit;
                           }
                  if ( parm < -limit )
                           {
                           parm = -limit;
                           }
                  sprintf( mess, " %s = %f   %s", parm_name, parm, edit_mess );
                  u_mess ( NO_OP, mess );
                  }
       }
return ( parm );
}
/*************************
* iparm_edit
*
*        User tool for editing integer parameters.
*************************/
```

```
double iparm_edit( parm, parm_name, inc_val, limit )

   int             parm, inc_val, limit;
   char            parm_name[];
{
   void get_tb3_data(), menu_tiny(), clear_mess();
   char edit_mess[80];

pd_flush();
strcpy ( edit_mess,
"2 to increase  3 to decrease    1 to continue");

clear_mess ( );
sprintf( mess, " %s = %d   %s", parm_name, parm, edit_mess );
u_mess ( NO_OP, mess );

pd_key = 0;
while ( ! ( pd_key == 1 ) )
         {
         get_tb3_data ( );  /* Read Cognex 3 button trackball */
         if ( pd_key == 1 )
                  {
                  break;
                  }
         if ( pd_key == 2 )
                  {
                  parm += inc_val;
                  }
         else if ( ( pd_key == 4 ) )
                  {
                  parm -= inc_val;
                  }
         if ( pd_key != 0 )
                  {
                  if ( parm > limit )
                           {
                           parm = limit;
                           }
                  if ( parm < -limit )
                           {
                           parm = -limit;
                           }
                  sprintf( mess, " %s = %d   %s", parm_name, parm, edit_mess );
                  u_mess ( NO_OP, mess );
                  }
         }
return ( parm );
}
/************************
* iparm_alter
*
*        User tool for editing integer parameters.
************************/
double iparm_alter( parm, parm_name, inc_val, limit, output )

   int             parm, inc_val, limit;
   char            *output;
   char            parm_name[];
{
         int       r;
         void      get_tb3_data(), menu_tiny(), clear_mess();
         char      edit_mess[80];
         char      dx, dy;
```

```
pd_flush();
strcpy ( edit_mess,
"2 to increase  3 to decrease    1 to continue");

clear_mess ( );
sprintf( mess, " %s = %d   %s", parm_name, parm, edit_mess );
u_mess ( NO_OP, mess );

pd_key = 0;
while ( TRUE )
        {
        r = cio_query(cif_tb_file);
        if ( r == 0 )
                {
                sprintf( mess, "X = GAIN = %     Y = OFFSET = %d,  1 to continue",
                        caq_mode->gain, caq_mode->offset );
                u_mess ( PASS, mess );
                }
        if ( r > 0 )
                {
                cif_tb3_read ( pdp_x, pdp_y, p_pd_key );
                if ( pd_key == 1 )
                        {
                        break;
                        }
                if ( pdx != 0 )
                        {
                        dx = pdx;
                        if ( (caq_mode->gain + dx ) < limit )
                                {
                                dx = 0;
                                }
                        if ( (caq_mode->gain + dx ) >= 1 )
                                {
                                dx = 0;
                                }
                        caq_mode->gain += dx;
                        }
                if ( pdy != 0 )
                        {
                        dy = pdy;
                        if ( (caq_mode->offset + dy ) < limit )
                                {
                                dy = 0;
                                }
                        if ( (caq_mode->offset + dy ) >= 1 )
                                {
                                dy = 01;
                                }
                        caq_mode->offset += dy;
                        }
                }
        }
/*
while ( ! ( pd_key == 1 ) )
        {
        get_tb3_data ( );
        if ( pd_key == 1 )
                {
                break;
                }
        if ( pd_key == 2 )
                {
                parm += inc_val;
```

```
                *output = parm;
                }
        else if ( ( pd_key == 4 ) )
                {
                parm -= inc_val;
                *output = parm;
                }
        if ( pd_key != 0 )
                {
                if ( parm > limit )
                        {
                        parm = limit;
                        *output = parm;
                        }
                if ( parm < -limit )
                        {
                        parm = -limit;
                        *output = parm;
                        }
                sprintf( mess, " %s = %d   %s", parm_name, parm, edit_mess );
                u_mess ( NO_OP, mess );
                }
        }
*/

return ( parm );
}
/************************
* really_save
*
*       REDUNDANT CAUTION MESSAGE FOR SAVE SYSTEM TO COGNEX DISK.
************************/
void really_save ( )
{
        void    get_tb3_data();

pd_flush();
u_mess ( NO_OP, "** DO YOU REALLY WANT TO SAVE TO DISK ? **        2 FOR SAVE.
1 to continue." );
while ( ! ( pd_key == 1 ) )
        {
        get_tb3_data ( );  /* Read Cognex 3 button trackball */
        if ( pd_key == 4 )
                {
                }
        else if ( pd_key == 1 )
                {
                break;
                }
        else if ( ( pd_key == 2 ) )
                {
                break;
                }
        }
}
/************************
* save_mpm
*
*       SAVE SYSTEM TO COGNEX DISK.
************************/
void save_mpm ( )
{
        void    get_tb3_data();
        int     error_caught;
        u_char  key_save = 0;
```

```
u_mess ( NO_OP, "2 FOR PERMANENT EDIT SAVE TO DISK,    1 to continue." );
/*
pd_flush();
*/
get_tb3_data ( );  /* Read Cognex 3 button trackball */
key_save = pd_key;
while ( pd_key != 1 )
        {
        get_tb3_data ( );   /* Read Cognex 3 button trackball */
        if ( pd_key == 1 )
                {
                break;
                }
        if (( p_prob_1- mdl ) && ( pd_key == 2 ))
                {
                u_prompt ( NO_OP,
                    " !! TOO BIG TO WRITE !!,   Power down & try again." );
                pd_key = 0;
                while ( pd_key == 0 ) { }
                break;
                }

    get_tb3_data ( );       /* Read Cognex 3 button trackball */
        if ( pd_key == 4 )
                {
                }
        else if ( ( pd_key == 2 ) )
                {
                really_save();      /* Redundant prompt ! */
                if ( pd_key == 1 )
                        {
                        break;
                        }
                u_prompt ( NO_OP,
                        "Insert write permitted disk,    1 to continue." );
                u_mess ( NO_OP,
                        "Writing Disk. CAUTION - Set write protect when writi
ng is finished." );


                if ( error_caught = cct_catch( 0 ) )  /* Catch any error */
                        {
                        if ( error_caught == CIC_ERR_QUIT )
                                {
                                cct_throw ( CIC_ERR_QUIT );
                                }
                        u_prompt ( NO_OP,
                            " !! DISK ERROR !!,   write protect error or bad
disk, 1 to exit." );
                        u_prompt ( NO_OP,
                            " Correct disk problem,   then power down & try a
gain." );
                        pd_key = 0;
                        while ( pd_key == 0 ) { }
                        break;
                        }
                else
                        {
                        css_save_system ( css_floppy_nocheck, 0 );
                        }
```

```
        }
}
/*************************/
* clean_it
*
*       Clean Stencil mode.
*************************/
void clean_it( )
{
        char    parm_name[16], clean_mess[80];
        int     error_caught;

/*
sprintf ( clean_mess,
         "Screen clamp OFF, Remove and clean stencil,     1 to continue"
        );
u_prompt ( NO_OP, clean_mess );

sprintf ( clean_mess,
         "Replace stencil, Screen clamp ON,     1 to continue"
        );
u_prompt ( NO_OP, clean_mess );
*/

sprintf ( clean_mess,
         "Remove, clean and replace stencil;  CLAMP ON;     1 to continue"
        );
u_prompt ( NO_OP, clean_mess );


error_caught = -1;
while ( error_caught != 0 )
    {
    if ( error_caught = cct_catch( IO_ERR_ATTENTION ) )
        {
        strcpy ( error_mess, "   REPEATING stencil to board alignment."  );
        menu_tiny ( error_mess, NO_OP ); /* user mess, background ignored */
        }
    else{
        user_align();
        pd_flush();
        cct_end( IO_ERR_ATTENTION );
        }
    }
}
/*************************
* maintain_it
*
*       Maintenance mode.
*************************/
void maintain_it( )
{
        void    clear_mess();
        char    parm_name[16], rev_mess[80];
        int     r;

r = get_pass();             /* Get supervisor password, return TRUE = good. */
if ( r != TRUE )
        {
        u_prompt ( NO_OP,
                 " **** PASSWORD MISMATCH ***     1 to exit." );
        }
else    {
        sprintf ( rev_mess,
```

```
                "CCC Revision %2.2f  Cognex Revision %s        1 to continue",
                ccc_rev_num, cu_version );
        u_prompt ( NO_OP, rev_mess );

        u_mess ( NO_OP, "2 to Set board geometry,   1 to continue" );
        while ( TRUE )
                {
                key = 0;
                get_tb3_data();
                if ( pd_key == 2 )
                        {
                        dump_models();
                        board_probe_geometry( p_prob_1 );
                        board_probe_geometry( p_prob_2 );
                        break;
                        }
                else if ( pd_key == 1 ) { break; }
                }

        caq_constant( PASS );

        u_mess ( PASS, "2 to Edit offset,   1 to continue" );
        while ( TRUE )
                {
                key = 0;
                get_tb3_data();
                if ( pd_key == 2 ) { offset_edit(); pd_flush(); break; }
                else if ( pd_key == 1 ) { break; }
                }
        u_mess ( PASS, "2 to Edit backlash,   1 to continue" );
        while ( TRUE )
                {
                key = 0;
                get_tb3_data();
                if ( pd_key == 2 ) { backlash_edit(); pd_flush(); break; }
                else if ( pd_key == 1 ) { break; }
                }

/*
        cif_set_window ( -1,  1, 50, 50, cif_fg_window );
        BOX
        pd_flush();

        caq_cpu();
        cgr_cross ( caq_image, 255, 244, 20, 20, CAQ_WHITE );
        caq_graphics();
        u_prompt ( NO_OP, "1 to continue" );

        set_camera( p_prob_1->camera, SPLIT_ON, IMAGE_POSITIVE );
        gainoff_edit();

        new_off2 = caq_mode->offset; new_gain2 = caq_mode->gain;
*/
        save_mpm ( );
        }
}
/*************  *********
* model_edit
*
*       User tool for entering a permanent X, Y, Theta offset & backlash.
************************/
void model_edit( )
{
        void    clear_mess();
        char    parm_name[16];
```

```
offset_edit ( );

set_camera( p_prob_1->camera, SPLIT_ON, IMAGE_POSITIVE );
/*
u_prompt ( NO_OP, "1 to set GAIN/OFFSET with trackball,   then 1 to exit." );
GAINOFF
*/

/*
gainoff_edit();
new_off2 = caq_mode->offset; new_gain2 = caq_mode->gain;
*/

/*
save_mpm ( );
*/

}
/************************
* gainoff_edit
*
*         User tool for entering camera gain & offset values ( buttons ).
************************/
void gainoff_edit( )
{
          void      clear_mess();
          char      parm_name[16];

/* ---------- PERMANENT OFFSETS ------------------------------------ */

strcpy ( parm_name, "CAMERA GAIN");
new_gain2 = iparm_edit ( new_gain2, parm_name, 1, 255 );
new_gain = new_gain2;

strcpy ( parm_name, "CAMERA OFFSET");
new_off2 = iparm_edit ( new_off2, parm_name, 1, 255 );
new_off = new_off2;

clear_mess ( );
sprintf( mess, "CAMERA   GAIN = %d , OFFSET = %d   1 to continue",
           new_gain2, new_off2 );
u_prompt ( NO_OP, mess );

set_camera( p_prob_1->camera, SPLIT_ON, IMAGE_POSITIVE );
}
/************************
* offset_edit
*
*         User tool for entering a permanent X, Y, Theta offset.
************************/
void offset_ed  ( )
{
          void      clear_mess();
          char      parm_name[16];

/* ---------- PERMANENT OFFSETS ------------------------------------ */

strcpy ( parm_name, "OFFSET X");
edit_offset.mil.x = parm_edit ( edit_offset.mil.x, parm_name, 0.5, 20.0 );

strcpy ( parm_name, "OFFSET Y");
edit_offset.mil.y = parm_edit ( edit_offset.mil.y, parm_name, 0.5, 20.0 );

strcpy ( parm_name, "OFFSET T");
edit_offset.mil.t = parm_edit ( edit_offset.mil.t, parm_name, 0.0125, 0.75 );
```

```
clear_mess ( );
sprintf( mess, "OFFSETS: X = %1.4f Y = %1.4f Theta  = %1.4f   1 to continue .
         edit_offset.mil.x, edit_offset.mil.y, edit_offset.mil.t );
u_prompt ( NO_OP, mess );

set_camera( p_prob_1- camera, SPLIT_ON, IMAGE_POSITIVE );
}
/************************
* backlash_edit
*
*        User tool for entering a permanent X, Y, Theta backlash correct.
************************/
void backlash_edit( )
{
         void      clear_mess();
         char      parm_name[16];

/* ---------- BACKLASH ENTRY ---------------------------------------- */

strcpy ( parm_name, "backlash X");
edit_backlash.mil.x =
         parm_edit ( edit_backlash.mil.x, parm_name, 0.49210, 5.0 );

strcpy ( parm_name, "backlash Y");
edit_backlash.mil.y =
         parm_edit ( edit_backlash.mil.y, parm_name, 0.49210, 5.0 );

strcpy ( parm_name, "backlash T");
edit_backlash.mil.t =
         parm_edit ( edit_backlash.mil.t, parm_name, 0.0002961, 0.1 );

clear_mess ( );
sprintf( mess, "backlash: X = %1.4f Y = %1.4f Theta = %1.4f  1 to continue",
         edit_backlash.mil.x, edit_backlash.mil.y, edit_backlash.mil.t );
u_prompt ( NO_OP, mess );

set_camera( p_prob_1->camera, SPLIT_ON, IMAGE_POSITIVE );
}
/************************
* manual_align
*
*        User aid to manually align proces.
*
*        If camera #s for enter or exit = 0 => no change.
*
************************/
void manual_align( entry_camera )

   int    entry_camera;
{
   void set_camera(), get_ttd_data(), menu_tiny();
   cip_buffer user_window;

pd_flush();
caq_cpu();
caq_constant( CAQ_PASS );
cip_window ( caq_image, &user_window, 188, 124, 200, 200 );
cgr_outline( &user_window, CAQ_BLINK );
caq_graphics();

                    /* CAMERA #, NO SPLIT, NORMAL POLARITY */
if ( entry_camera == p_prob_1->camera )
         {
         u_mess ( NO_OP,
```

```
          "** CAMERA 1 **  3 for next camera    2 for split    1 to exit."  ;
          set_camera( p_prob_1->camera, SPLIT_OFF, IMAGE_POSITIVE );
          }
else if ( entry_camera == p_prob_2->camera )
          {
          u_mess ( NO_OP,
           "** CAMERA 2 **  3 for next camera    2 for split    1 to exit." );
          set_camera( p_prob_2->camera, SPLIT_OFF, IMAGE_POSITIVE );
          }
caq_cpu();
cip_window ( caq_image, &user_window, 138, 124, 200, 200 );
cgr_outline( &user_window, CAQ_BLINK );
caq_graphics();
pd_key = 0;
while (!( pd_key == 1 ) )
          {
          get_tb3_data ( );  /* Read Cognex 3 button trackball */
          if ( pd_key == 4 )
                    {
                    next_camera ( );
                    }
          else if ( ( pd_key == 2 ) )
                    {
                    u_mess ( NO_OP,
                    "**   SPLIT  **  3 for next camera    2 for split    1 to exit
." );
                    set_camera ( p_prob_1->camera, SPLIT_ON, IMAGE_POSITIVE );
                    }
          }
pd_flush();

/*
u_prompt ( NO_OP, "1 to set GAIN/OFFSET with trackball,   then 1 to exit." );
GAINOFF
new_off2 = caq_mode->offset; new_gain2 = caq_mode->gain;
*/
}
/************************
* next_camera
*
*         Togg'  camera.
*
************************/
void next_camera( )
{
if ( caq_mode->camera == p_prob_1->camera )
          {
          u_mess ( NO_OP,
           "** CAMERA 2 **  3 for next camera    2 for split    1 to exit."  ;
          set_camera( p_prob_2->camera, SPLIT_OFF, IMAGE_POSITIVE );
          }
else
          {
          u_mess ( NO_OP,
           "** CAMERA 1 **  3 for next camera    2 for split    1 to exit."  ;
          set_camera( p_prob_1->camera, SPLIT_OFF, IMAGE_POSITIVE  ;
          }
}
/************************
* set_camera
*
*         Set camera parameters.
*
************************/
void set_camera( camera, split, polarity )
```

```
   int    camera, split, polarity;
{
caq_mode->camera              = camera;
caq_mode->split                       = split;
caq_mode->acquire_polarity    = polarity;

}
/*********************
* get_dip
*
*        Get/process VBX dip switches.
*
*********************/
void get_dip()
{
   void   mess_switches();
   int    all_switches, syst_switches, user_switches;

all_switches = cio_read_dipsw();        /* Get VBX dips */
user_switches = ( 0xF0 & all_switches );
syst_switches = ( 0x0F & all_switches );

while ( syst_switches != 0 ) /* Wait till syst switches = 0. */
         {
         all_switches = cio_read_dipsw();
         syst_switches = ( 0x0F & all_switches );
         if ( syst_switches != 0 ) { mess_switches(); }
         }
switch ( user_switches )
         {
         case 0:
                  debug_mode = DBG_NORMAL;      /* No debug. */
                  break;
         case 0x10:
                  debug_mode = DBG_NO_PRINTER;   No ASP-24 present. *.
                  break;
         case 0xE0:
                  mess_switches( );
                  debug_mode = DBG_CORRELATE;  /* CORRELATE Screen to board *
                  break;
         case 0xF0:
                  mess_switches( );
                  debug_mode = DBG_SCREEN;      /* Screen only. */
                  break;
         default:
                  mess_switches( );
                  debug_mode = DBG_NORMAL;      /* No debug. */
                  break;
         }
}
/*********************
* flag_init
*
*        Initialize flags.
*
*********************/
void      flag_init()
{

motion_mode          = MODE_STATIC;
align_ok_state       = FALSE ;
}
/*********************
* dump_menus
*
```

```
* Free all menu memory.
*
*************************/
void dump_menus()
{
        void    free_menu();

free_menu ( &tiny_over );
free_menu ( &tiny_menu );
free_menu ( &main_menu );
}
/*************************
* menu_init
*
* Init MPM main, help & prompt menus.
*
*************************/
void menu_init()
{
        void    set_sel_p(), make_menu(), free_menu(), menu_main();
        void    help_init(), help_display();


printf ( " init menus\n" );
make_menu ( &tiny_menu  );   /* User prompts & messages. */
make_menu ( &tiny_over  );

pd_key = 4;

make_menu ( &copy_right );   /* Copyright notice. */
help_init ( &copy_right );
help_display ( &copy_right );          /* Display copyright notice. */

pd_key = 1;
}
/*************************
* help_init
*
*       Init MPM help menu.
*       NOTE : Help screen color default is opposite normal screens.
*************************/
void help_init ( p_menu )

  menu_parameters  *p_menu;
{
if ( p_menu->screen == &help_screen )
        {
        p_menu->image = main_help.image;
        p_menu->p_image = main_help.p_image;
        }

p_menu->screen->ink = p_menu->screen->scink;    /* Color  = default */
p_menu->screen->backgr      = p_menu->screen->scbackgr;
p_menu->screen->cursorx     = p_menu->cursorx;     /* Cursor = default */
p_menu->screen->cursory     = p_menu->cursory;

clp_set ( p_menu->image, p_menu->box_color );
cgr_outline ( p_menu->image, p_menu->border_color );

if ( p_menu->border_color == CAO_BLINK )
        {
        p_menu->screen->backgr = p_menu->border_color;
        }
cgr_printf ( p_menu->screen, "%s", p_menu->text );
```

```
  p_menu->screen->ink     = p_menu->screen->scbackgr;     /* Color  = reverse *
  p_menu->screen->backgr  = p_menu->screen->scink;

  p_menu->screen->cursorx = p_menu->line1->x0;
  p_menu->screen->cursory = p_menu->line1->y0;
  cgr_printf(p_menu->screen, "%s", p_menu->line1->text);

  p_menu->screen->cursorx = p_menu->line2->x0;
  p_menu->screen->cursory = p_menu->line2->y0;
  cgr_printf(p_menu->screen, "%s", p_menu->line2->text);

  p_menu->screen->cursorx = p_menu->line3->x0;
  p_menu->screen->cursory = p_menu->line3->y0;
  cgr_printf(p_menu->screen, "%s", p_menu->line3->text);

  p_menu->screen->cursorx = p_menu->line4->x0;
  p_menu->screen->cursory = p_menu->line4->y0;
  cgr_printf(p_menu->screen, "%s", p_menu->line4->text);

  p_menu->screen->cursorx = p_menu->line5->x0;
  p_menu->screen->cursory = p_menu->line5->y0;
  cgr_printf(p_menu->screen, "%s", p_menu->line5->text);
  }
  /************************
 * itoa
 *
 *        Standard K & R integer to ascii conversion.
 *
 *         Not even names have been changed to protect the innocent.
 ************************/
int       cccitoa ( n, s )

  char    s[];
  int     n;
{
int       i, sign;

if (( sign = n ) < 0 )                    /* record sign */
          {
          n = -n;                         /* make n positive */
          }
i = 0;
do                                        /* generate digits in reverse order *
          {
          s[i++] = n % 10 + '0';          /* get next digit */
          }
while     (( n /= 10 ) > 0  );

if ( sign < 0 )
          {
          s[i++] = '-';
          }
s[i] = '\0';
reverse( s );
}
/************************
* atoi
*
*        Standard K & R ascii to integer conversion.
*
*         Not even names have been changed to protect the innocent.
************************/
int       cccatoi ( s )

  char    s[];
```

```
{
int       i, n, sign;

for (i = 0; s[i]==' ' || s[i]=='\n' || s[i]=='\t'; i++) ;

sign = 1;
if ( s[i] == '+' || s[i] == '-' )
          {
          sign = ( s[i++] == '+' ) ? 1 : -1;
          }
for ( n = 0;  s[i] >= '0' && s[i] <= '9'; i++ )
          {
          n = 10 * n + s[i] - '0';
          }
return ( sign * n );
}

/************************
* quik_delay
*
*         Arbi'  ry software delay loop.
*
************************/
void quik_delay()
{
 int      i;

for ( i = 25000; i > 0; i-- ) { }
printf( " *" );
}
/************************
* soft_delay
*
*         Arbitrary software delay loop.
*
************************/
void soft_delay()
{
 int      i;

for ( i = 200000; i > 0; i-- ) { }
printf( " *" );
}
/************************
* bit8
*
*         Force 8th bit to a comm stop bit.
*
************************/
void bit8 ( mess )

   char   *mess;
{
 int      c;

while ( c = *mess++ )
          {
          c |= 0x80;
          putc ( c, fp_comm2 );
          }
}
/************************
* free_menu.
*
```

```
*         Discard menu & free the memory it occupied.
*
************************/
void free_menu( p_menu )

   menu_parameters *p_menu;  /* -> to menu structure. */
{

if ( p_menu->image )
          {
          free ( p_menu->image );
          p_menu->image = 0;
          }
}
/************************
* make_menu.
*
*         Setup buffers & text for a menu.
*         If image buffer already exists, free the memory and recreate it.
*
************************/
void make_menu( p_menu )

   menu_parameters *p_menu;  /* -> to menu structure. */
{
if ( p_menu->flags == MENU_PERMANENT )
          {
          p_menu->image =                          /* -> cip_buffer. */
                    cip_create
                              (
                              (p_menu->x1),
                              (p_menu->y1),
                              8
                              );
          }
else if ( p_menu->flags == MENU_TEMPORARY )
          {
          if ( p_menu->image != 0 )
                    {
                    cip_delete ( p_menu->image );
                    p_menu->image = 0;
                    }
          if ( temp_image != 0 )
                    {
                    cip_delete ( temp_image );
                    temp_image = 0;
                    }
          p_menu->image =
                    cip_window
                              (
                              gp_image, temp_image,
                              0, 0,
                              (p_menu->x1),
                              (p_menu->y1)
                              );
          }
p_menu->p_image = &p_menu->image;      /* -> -> cip_buffer. */

          /* Copy Cognex default screen structure */
cu_copy   (
          cgr_fgscreen,                            /* Default screen structure. */
          p_menu->screen,                          /* -> new screen structure. */
          sizeof ( * ( p_menu->screen ) )
          );
```

```
        /* Put -> -> 'cip_buffer' into the associated 'cgr_screen'. */
p_menu->screen->ibuff = p_menu->p_image;
p_menu->screen->cursorx = p_menu->cursorx;      /* Cursor = default. */
p_menu->screen->cursory = p_menu->cursory;

cip_set ( p_menu->image, p_menu->box_color );
cgr_outline ( p_menu->image, p_menu->border_color );

if ( p_menu->border_color == CAO_BLINK )
        {
        p_menu->screen->backgr = p_menu->border_color;
        }
cgr_printf ( p_menu->screen, "%s", p_menu->text );

    /* REVERSE INK & BACKGROUND ( copy the 'cgr_screen' default values ) */
p_menu->screen->ink    = p_menu->screen->sbackgr;
p_menu->screen->backgr = p_menu->screen->sink;
}
/************************
* pd_flush
*
*       Flush the pointer device.
************************/
void pd_flush()
{
        void    cif_tb3_flush();

cif_tb3_flush();    /* Flush trackball */
pd_key = 0;
}
/************************
* get_tb3_data.
*
* Get the return data from the Cognex 3 button trackball.
*
************************/
void get_tb3_data()
{
 int    r;


if (( PANIC == TRUE )||( panic_button == TRUE ))
        {
        panic_button = FALSE;
        cct_throw( IO_ERR_ATTENTION );      /* NOT ERROR - VISION ATTENTION CW
 */
        }
if ( strlen ( error_mess ) != 0 )
        {
        menu_tiny ( mess, NO_OP ); /* Display user mess, background ignored */
        strcpy ( error_mess, "" );
        }
pd_key = 0;
r = cio_query ( cif_tb_file );

if ( r > 0 )
        {
        cif_tb3_read
                (
                pdp_x,
                pdp_y,
                p_pd_key
                );
        }
```

```
if (( PANIC == TRUE )||( panic_button == TRUE ))
        {
        panic_button = FALSE;
        cct_throw( IO_ERR_ATTENTION );          /* NOT ERROR - VISION ATTENTION SW
 */
        }
}
/*************   ********
* wait_tb3_b1.
*
* Wait for button 1 from the Cognex 3 button trackball.
*
************************/
void wait_tb3_b1()
{
        void      get_tb3_data();

pd_flush();

while ( pd_key != 1 )
        {
        get_tb3_data ( );  /* Read Cognex 3B trackball */
        }
}
/************************
* loop_tb3_b1.
*
*        Wait for button 1 from the Cognex 3 button trackball.
*        !! DOES NOT FLUSH TRACKBALL !!
************************/
void loop_tb3_b1()
{
        void      get_tb3_data();

while ( pd_key != 1 )
        {
        get_tb3_data ( );  /* Read Cognex 3B trackball */
        }
}
/************************
* if_tb3_b1.
*
* If most recent button is not button 1, Wait for button 1.
*
************************/
void if_tb3_b1()
{
        void      get_tb3_data();

while ( pd_key != 1 )
        {
        get_tb3_data ( );  /* Read Cognex 3B trackball */
        }
}
/************************
* help_display.
*
*        If user pressed trackball key 3, display help screen.
*
************************/
void help_display( p_menu )

   menu_parameters *p_menu;
{

if ( pd_key == 4 )
```

```
        {
        caq_ ' ( );
        caq_ istant ( CAD_PASS );   /* Clear screen */
        help_init (  p_menu );
        cgr_display_image
                (
                p_menu->image,                  /* src   */
                caq_image,                      /* dst   */
                p_menu-x_offset,   /* x off */
                p_menu- y_offset,  /* y off */
                2                               /* mag   */
                );
        caq_graphics ( );

        pd_flush();
        u_mess ( NO_OP, "Press 1 to continue." );
        wait_tb3_b1 ( );    /* Wait for trackball key 1 */
        pd_key = 4;                     /* Overwrite key 1 with ?a, 3 */

        caq_cpu ( );
        caq_constant ( CAD_PASS );   /* Clear screen */
        caq_graphics ( );
        cur_menu_sel -= 1; /* Force cursor back to current selection */
        }
}
/************************
* set_sel_p
*
*       Set pointer to menu selection structure.
*
************************/
void set_sel_p()
{
switch(cur_menu_sel)
 {
  case 1: p_menu_sel = &men_sel_1;     break;
  case 2: p_menu_sel = &men_sel_2;     break;
  case 3: p_menu_sel = &men_sel_3;     break;
  case 4: p_menu_sel = &men_sel_4;     break;
  case 5: p_menu_sel = &men_sel_5;     break;
/*
  case 6: p_menu_sel = &men_sel_6;     break;
*/
   default:                                          break;
  }
}
/************************
* menu_tiny
*
* Display/redisplay a one line menu at the bottom of the screen.
*
************************/
void menu_tiny ( mess, tm_image)

   char   mess[80];
   enum   color tm_image;              /* Color to set the rest of the screen. */
 {

 if( strlen ( error_mess ) != 0 )
         {
         mess = &error_mess[0];
         }
 tiny_menu.screen->cursorx = 2;
 tiny_menu.screen->cursory = 2;
```

```
cgr_printf ( tiny_menu.screen, "%s", mess );
caq_cpu ( );

if ( tm_image != NO_OP )
        {
        caq_constant ( tm_image );
        }
cgr_display_image
        (
        tiny_menu.image,
        caq_image,
        tiny_menu.x_offset,/* x off */
        tiny_menu.y_offset,/* y off */
        1
        );
caq_graphics ( );
if( strlen ( error_mess ) != 0 )
        {
        strcpy ( error_mess, "" );
        }
}
/************************
* over_tiny
*
* Overlay non-graphics one line menu at the bottom of the screen.
*
************************/
void over_tiny ( mess, tm_image)

   char   mess[80];
   enum   color tm_image;              /* Color to set the rest of the screen. */
{

if( strlen ( error_mess ) != 0 )
        {
        mess = &error_mess[0];
        }
tiny_over.screen->cursorx = 2;
tiny_over.screen->cursory = 2;
cgr_printf ( tiny_over.screen, "%s", mess );
caq_cpu ( );
if ( tm_image != NO_OP )
        {
        caq_constant ( tm_image );
        }
cgr_display_image
        (
        tiny_over.image,
        caq_image,
        tiny_over.x_offset,/* x off */
        tiny_over.y_offset,/* y off */
        1
        );
caq_display ( );            /* Show the STATIC image and message */
if( strlen ( error_mess ) != 0 )
        {
        strcpy ( error_mess, "" );
        }
}
/************************
* diag_halt
*
*       Diagnostic halt.
*
************************/
```

```
void diag_halt()
{
   void    clear_prompt();

   char    mess[80];

u_mess ( NO_OP,
         "DIAGNOSTIC HALT    !!!!!!!!!!!!!!!!!!!!    Press 1 to continue.");
clear_prompt ( );
}
/*************************
* menu_main
*
* Display/redisplay the main menu.
*
*************************/
void menu_main()
{
tovr_screen.ink     = 63;
tovr_screen.backgr =  4;
ip_sel_off = cip_create ( 30, 21, 3 );
caq_constant ( CAQ_PASS );              /* Clear graphics plane. */
cip_set ( ip_sel_off, CAQ_BLACK );
cgr_outline ( ip_sel_off, CAQ_WHITE );

    /* Put menu selections to the main menu image. */
/*
for( cur_menu_sel = 6; cur_menu_sel > 1; cur_menu_sel-- )
*/
for( cur_menu_sel = 5; cur_menu_sel > 1; cur_menu_sel-- )
         {
         set_sel_p ( );
         cgr_display_image
                  (
                  ip_sel_off,                     /* src   */
                  main_menu.image,    /* dst   */
                  p_menu_sel->x0,                 /* x off */
                  p_menu_sel->y0,                 /* y off */
         1                            /* mag   */
                  );
         main_menu.screen->cursorx = ( p_menu_sel->x0 + 35 );
         main_menu.screen->cursory = ( p_menu_sel->y0 +  1 );
         cgr_printf(main_menu.screen, "%s", p_menu_sel->text);
         }

set_sel_p ( );
cgr_display_image
         (
         ip_sel_off,
         main_menu.image,
         p_menu_sel->x0,
         p_menu_sel->y0,
         1
         );
main_menu.screen->cursorx = ( p_menu_sel->x0 + 35 );
main_menu.screen->cursory = ( p_menu_sel->y0 +  1 );
cgr_printf ( main_menu.screen, "%s", p_menu_sel->text );
printf ( " SELECTION = %d\n", cur_menu_sel );

caq_cpu ( );                    /* Enable access to frame grabber. */
cgr_display_image
         (
         main_menu.image,    /* src   */
         caq_image,                       /* dst   */
         main_menu.x_offset, /* x off */
```

```
          main_menu.y_offset, /* y off */
          1                           /* mag   */
          );

u_mess ( NO_OP,
          "Press 1 to select   Press 2 to move cursor.");
caq_graphics ( );              /* Show the LIVE image and message */
}
/************************
* next_selection.
*
*         Turn off cursor at present menu selection, update selection
*         number & turn on cursor at new selection number.
*
************************/
void next_selection( image, sel_offset )

   cip_buffer       *image;

   int    sel_offset;         /* Used to alter ( +/- ) current selection numcs/. */
{

if ( image == caq_image )
          {
          caq_cpu ( );                /* Enable access to frame grabber. */
          }
set_sel_p ( );
cgr_display_image
          (
          ip_sel_off,                 /* src   */
          image,              /* dst   */
          p_menu_sel->x0,     /* x off */
          p_menu_sel->y0,     /* y off */
          1                           /* mag   */
          );
cur_menu_sel += sel_offset;  /* Offset current menu selection. */
cur_menu_sel += 1;           /* Increment current menu selection. */

/*
if(cur_menu_sel > 6)
*/
if(cur_menu_sel > 5)
          {
          cur_menu_sel = 1;
          }
set_sel_p ( );
cgr_display_image
          (
          ip_sel_on,                  /* src   */
          image,                      /* dst   */
          p_menu_sel->x0,             /* x off */
          p_menu_sel->y0,             /* y off */
          1                           /* mag   */
          );
if ( image == caq_image )
          {
          caq_graphics ( );  /* Show the LIVE image and message */
          }
}  ]
```

What is claimed is:

1. Aligning apparatus comprising, an object to be acted upon at predetermined locations defining a pattern, a device characterized by said pattern for acting upon said object, a video probe arranged to look at both said device and said object for providing image signals representative of both, means for comparing both image signals to obtain an error signal representative of misalignment between the device and object, means responsive to said error signal for [relatively positioning] *translating and rotating* said device [and said object] to reduce said error, and means for operating upon said object with said device upon said predetermined locations.

2. Aligning apparatus is accordance with claim 1 wherein said video probe comprises a mirror tube having a mirror at one end intersecting the mirror tube axis at an angle of substantially 45° and exposed through an opening in the wall of said mirror tube, a video camera located at the other end of said mirror tube for receiving images reflected from said mirror, said mirror tube being rotatable about the mirror axis between at least a first position exposing said mirror to said device and a second position exposing said mirror to said object.

3. Aligning apparatus [in accordance with claim 1 and further] comprising,

*an object to be acted upon at predetermined locations defining a pattern,*

*a device characterized by said pattern for acting upon said object,*

*a video probe arranged to look at said device and said object for providing image signals representative of both,*

*means for comparing both image signals to obtain an error signal representative of misalignment between the device and object,*

*means responsive to said error signal for relatively positioning said device and said object to reduce said error,*

*and means for operating upon said object with said device upon said predetermined locations,* a second of said video probes spaced from the first-mentioned video probe arranged to look at both said device and said object for providing image signals representative of both at areas thereof different from the areas viewed by said first-mentioned video probe, and means for relatively displacing said video probes while in fixed relative relation and one of said object and device predetermined incremental distances in first and second orthogonal directions and a rotational directional to provide a reference image signal characterizing said pattern.

4. Aligning apparatus is accordance with claim 3 and further comprising:

for each of said video probes video probe support means for selectively moving the associated video probe between a first position located between said device and said object and a second position outside the region between said object and said device, and means for locating the associated video probe in said first position before acting upon said object and then displacing said video probe to said second position after relatively positioning said device and said object to reduce said error and operating upon said object with said device upon said predetermined locations with the associated video probe in said second position.

5. Aligning apparatus in accordance with claim 4 wherein each of said video probe support means comprises, a movable probe support carrying said video probe, a fixed base having vertical walls each formed with front and rear slots with each slot having a horizontal leading portion and a depending angled trailing portion, said movable probe support having elements for riding in said slots to allow said video probe to move between said first position with said video probe extended and said second position with said video probe retracted.

6. Aligning apparatus in accordance with claim [8] 5 wherein said movable probe support comprises a main clamp supporting said video probe substantially at its center of gravity and further comprising, ball-and-cone pieces and reference balls, said fixed base comprising a vertical bracket carrying one of said reference balls and said ball-and-cone pieces, said main clamp carrying the other of said reference balls and ball-and-cone pieces arranged so that engagement of said ball-and-cone pieces with mating reference balls defines a reference position of said video probe.

7. Aligning apparatus in accordance with claim 1 and further comprising, video probe support means for selectively moving said video probe between a first position located between said device and said object and a second position outside the region between said object and said device, and means for locating said video probe in said first position before acting upon said object and then displacing said video probe to said second position after relatively positioning said device and said object to reduce said error and operating upon said object with said device upon said predetermined locations with said video probe in said second position.

8. Aligning apparatus in accordance with claim 7 wherein said video probe comprises a mirror tube having a mirror at one end intersecting the mirror tube axis at an angle of substantially 45° and exposed through an opening in the wall of said mirror tube, a video camera located at the other end of said mirror tube for receiving images reflected from said mirror, said mirror tube being rotatable about the mirror axis between at least a first position exposing said mirror to said device and a second position exposing said mirror to said object.

9. Aligning apparatus in accordance with claim 7 wherein each of said video probes comprises a mirror tube having a mirror at one end intersecting the mirror tube axis at an angle of substantially 45° and exposed through an opening in the wall of said mirror tube, a video camera located at the other end of said mirror tube for receiving images reflected from said mirror, said mirror tube being rotatable about the mirror axis between at least a first position exposing said mirror to said device and a second position exposing said mirror to said object.

10. Aligning apparatus in accordance with claim 7 wherein said video probe support means comprises, a movable probe support carrying said video probe, a fixed base having vertical walls each formed with front and rear slots with each slot having a horizontal leading portion and a depending angled trailing portion, said movable probe support having elements for riding in said slots to allow said video probe to move between said first position with said video probe extended and said second position with said video probe retracted.

11. Aligning apparatus in accordance with claim 2 wherein said video probe comprises a mirror tube having a mirror at one end intersecting the mirror tube axis at an angle of substantially 45° and exposed through an opening in the wall of said mirror tube, a video camera located at the other end of said mirror tube for receiving images reflected from said mirror, said mirror tube being rotatable about the mirror axis between at least a first position exposing said mirror to said device and a second position exposing said mirror to said object.

12. A method of aligning an object to be acted upon at predetermined locations defining a pattern with a device characterized by said pattern for acting upon said object which method includes the steps of, positioning a video probe to look at first one of said device and said object and then the other for providing image signals representative of both, comparing both said image signals to provide an error signal representative of misalignment between said device and object,

[relatively positioning] *translating and rotating* said device [and said object] while sensing said error signal to reduce said error, and operating upon said object with said device upon said predetermined locations with said object and said device then being in alignment.

13. A method in accordance with claim 12 and further including the steps of moving said video probe between an inside position located between said device and said object, then locating said video probe in an outside position outside the region between said object and said device, and operating upon said object with said device only with said video probe in said outside position.

14. A method [in accordance with claim 13 and further including the steps of] *of aligning an object to be acted upon at predetermined locations defining a pattern with a device characterized by said pattern for acting upon said object which method includes the steps of,*

*positioning a video probe to look at first one of said device and said object and then the other for providing image signals representative of both,*

*comparing both said image signals to provide an error signal representative of misalignment between said device and object,*

*relatively positioning said device and said object while sensing said error signal to reduce said error,*

*operating upon said object with said device upon said predetermined locations with said object and said device then being in alignment,* looking first at one of said device and said object and then the other with a second video probe spaced from the first-mentioned video probe to provide a second set of image signals representative of said device and said object different from the image signals provided by said first-mentioned video and the areas representative thereof, and relatively displacing said video probes while in fixed relative relation with respect to one of said object and device predetermined incremental distances in first and second orthogonal directions and a rotational direction to provide a reference image signal characterizing said pattern.

* * * * *

UNITED STATES PATENT AND TRADEMARK OFFICE

CERTIFICATE OF CORRECTION

PATENT NO. : Re. 34,615

DATED : May 24, 1994

INVENTOR(S): Gary T. Freeman

It is certified that error appears in the above-identified patent and that said Letters Patent is hereby corrected as shown below:

Column 10, line 11, after "claims" add [

The microfiche software code contained in the microfiche appendix has been replaced with a copy of the software code as originally filed with the application.

Signed and Sealed this

Twenty-second Day of February, 2000

*Attest:*

Q. TODD DICKINSON

*Attesting Officer*

*Commissioner of Patents and Trademarks*